United States Patent
Yuan et al.

(10) Patent No.: US 12,223,900 B2
(45) Date of Patent: Feb. 11, 2025

(54) DISPLAY SUBSTRATE AND DISPLAY APPARATUS

(71) Applicants: Hefei BOE Joint Technology Co., Ltd., Anhui (CN); BOE Technology Group Co., Ltd., Beijing (CN)

(72) Inventors: Zhidong Yuan, Beijing (CN); Yongqian Li, Beijing (CN); Can Yuan, Beijing (CN); Liu Wu, Beijing (CN); Xiuting Liu, Beijing (CN); Luke Ding, Beijing (CN); Cheng Xu, Beijing (CN); Miao Liu, Beijing (CN); Xing Yao, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/272,811

(22) PCT Filed: Jul. 29, 2022

(86) PCT No.: PCT/CN2022/109132
§ 371 (c)(1),
(2) Date: Jul. 18, 2023

(87) PCT Pub. No.: WO2024/021076
PCT Pub. Date: Feb. 1, 2024

(65) Prior Publication Data
US 2024/0395201 A1    Nov. 28, 2024

(51) Int. Cl.
*G09G 3/3233* (2016.01)
*G11C 19/28* (2006.01)
*H10K 59/131* (2023.01)

(52) U.S. Cl.
CPC ......... *G09G 3/3233* (2013.01); *G11C 19/287* (2013.01); *H10K 59/131* (2023.02);
(Continued)

(58) Field of Classification Search
CPC ......... G09G 3/3233; G09G 2300/0408; G09G 2300/0426; G09G 2300/0819;
(Continued)

(56) References Cited

U.S. PATENT DOCUMENTS

2012/0025700 A1\* 2/2012 Ryu ................. H10K 59/8721
                                                    313/512
2017/0287936 A1\* 10/2017 Kim ................. H01L 27/1218

\* cited by examiner

*Primary Examiner* — Robert J Michaud
(74) *Attorney, Agent, or Firm* — Ling Wu; Stephan Yang; Ling and Yang Intellectual Property

(57) ABSTRACT

A display substrate and a display apparatus. The display substrate includes a display area provided with pixel circuits arranged in an array and a non-display area provided with M light emitting driving circuits, M control driving circuits and M reset driving circuits. Odd-numbered light emitting driving circuits are electrically connected with first and second light emitting clock signal lines, and even-numbered light emitting driving circuits are connected with third and fourth light emitting clock signal lines; and/or, odd-numbered control driving circuits are electrically connected with first and second control clock signal lines, and even-numbered control driving circuits are connected with third and fourth control clock signal lines; and/or, odd-numbered reset driving circuits are electrically connected with first and second reset clock signal lines, and even-numbered reset driving circuits are connected with third and fourth reset clock signal lines.

20 Claims, 12 Drawing Sheets

(52) U.S. Cl.
CPC ............... *G09G 2300/0408* (2013.01); *G09G 2300/0426* (2013.01); *G09G 2300/0819* (2013.01); *G09G 2300/0842* (2013.01); *G09G 2300/0861* (2013.01); *G09G 2310/0221* (2013.01); *G09G 2310/0286* (2013.01); *G09G 2310/08* (2013.01); *G09G 2330/021* (2013.01); *G09G 2340/0435* (2013.01)

(58) Field of Classification Search
CPC ... G09G 2300/0842; G09G 2310/0221; G09G 2310/0286; G09G 2330/021; G09G 2340/0435; H10K 59/131; G11C 19/287
See application file for complete search history.

DISPLAY SUBSTRATE AND DISPLAY APPARATUS

CROSS-REFERENCE TO RELATED APPLICATION

The present application is a U.S. National Phase Entry of International Application No. PCT/CN2022/109132 having an international filing date of Jul. 29, 2022, the content of which is incorporated into this application by reference.

TECHNICAL FIELD

The present disclosure relates to, but is not limited to, the field of display technology, and more particularly, to a display substrate and a display apparatus.

BACKGROUND

An Organic Light Emitting Diode (OLED for short) and a Quantum-dot Light Emitting Diode (QLED for short) are active light emitting display devices and have advantages such as self-luminescence, a wide viewing angle, a high contrast ratio, low power consumption, an extremely high response speed, lightness and thinness, flexibility, and a low cost. With continuous development of display technologies, a flexible display that adopts an OLED or a QLED as a light emitting device and performs signal control by a Thin Film Transistor (TFT for short) has become a mainstream product in the field of display at present.

SUMMARY

The following is a summary of subject matter described herein in detail. The summary is not intended to limit the protection scope of claims.

In a first aspect, an embodiment of the present disclosure provides a display substrate, including: a display area and a non-display area, wherein the display area is provided with pixel circuits arranged in an array, and the display area is divided into M partitions along a first direction; a pixel circuit includes a writing transistor, an anode reset transistor, a gate control transistor, a light emitting transistor, and a first scan signal line, a second scan signal line. a third scan signal line and a light emitting signal line that extend along a second direction, wherein the first scan signal line is electrically connected with the writing transistor, the second scan signal line is electrically connected with the gate control transistor, the third scan signal line is electrically connected with the anode reset transistor, the light emitting signal line is connected with the light emitting transistor, and M is a positive integer greater than or equal to 2.

The non-display area is provided with a light emitting driving circuit group, a control driving circuit group, a reset driving circuit group, a first light emitting clock signal line to a fourth light emitting clock signal line, a first control clock signal line to a fourth control clock signal line, and a first reset clock signal line to a fourth reset clock signal line.

The light emitting driving circuit group includes M light emitting driving circuits, an i-th light emitting driving circuit is connected with a light emitting signal line in a pixel circuit in an i-th partition, a light emitting shift register in an odd-numbered light emitting driving circuit is electrically connected with the first light emitting clock signal line and the second light emitting clock signal line, and a light emitting shift register in an even-numbered light emitting driving circuit is connected with the third light emitting clock signal line and the fourth light emitting clock signal line, where i=1, 2, . . . , M;

and/or, the control driving circuit group includes: M control driving circuits, an i-th control driving circuit is connected with a second scan signal line in the pixel circuit in the i-th partition, an odd-numbered control driving circuit is electrically connected with the first control clock signal line and the second control clock signal line, and an even-numbered control driving circuit is connected with the third control clock signal line and the fourth control clock signal line;

and/or, the reset driving circuit group includes: M reset driving circuits, an i-th reset driving circuit is connected with a third scan signal line in the pixel circuit in the i-th partition, an odd-numbered reset driving circuit is electrically connected with the first reset clock signal line and the second reset clock signal line, and an even-numbered reset driving circuit is connected with the third reset clock signal line and the fourth reset clock signal line.

In some exemplary embodiments, a first partition includes pixel circuits of a first row to pixel circuits of an $N_1$-th row, a j-th partition includes: pixel circuits of an $(N_{j-1}+1)$-th row to pixel circuits of an $(N_{j-1}+1)$-th row, j=2, . . . , M.

A light emitting driving circuit includes light emitting shift registers, wherein a light emitting shift register includes a cascaded signal output terminal, a signal input terminal, a first signal output terminal, a second signal output terminal, a third signal output terminal and a fourth signal output terminal.

A first light emitting driving circuit includes: $N_1/4$ cascaded light emitting shift registers, a cascaded signal output terminal of a light emitting shift register of an x-th stage is connected with a signal input terminal of a light emitting shift register of an (x+1)-th stage in the first light emitting driving circuit; a first signal output terminal, a second signal output terminal, a third signal output terminal and a fourth signal output terminal of the light emitting shift register of the x-th stage in the first light emitting driving circuit are respectively connected with light emitting signal lines of pixel circuits in a (4x−3)-th row, pixel circuits of a (4x−2)-th row, pixel circuits of a (4x−1)-th row and pixel circuits of a 4x-th row, where x=1, 2, . . . , $N_1/4$.

A j-th light emitting driving circuit includes: $(N_j-N_{j-1})/4$ cascaded light emitting shift registers, a cascaded signal output terminal of a light emitting shift register of a y-th stage is connected with a signal input terminal of a light emitting shift register of a (y+1)-th stage in the j-th light emitting driving circuit; a first signal output terminal, a second signal output terminal, a third signal output terminal and a fourth signal output terminal of the light emitting shift register of the y-th stage in the j-th light emitting driving circuit are respectively connected with light emitting signal lines of pixel circuits in an $(N_{j-1}+4y-3)$-th row, pixel circuits in an $(N_{j-1}+4y-2)$-th row, pixel circuits in an $(N_{j-1}+4y-1)$-th row, pixel circuits in an $(N_{j-1}+4y)$-th row, where y=1, 2, . . . , $(N_j-N_{j-1})/4$.

In some exemplary embodiments, the light emitting shift register further includes a first clock signal terminal and a second clock signal terminal.

A first clock signal terminal in a light emitting shift register in an odd-numbered light emitting driving circuit is connected with one of the first light emitting clock signal line and the second light emitting clock signal line, a second clock signal terminal in the light emitting shift register in the odd-numbered light emitting driving circuit is connected with the other of the first light emitting clock signal line and the second light emitting clock signal line, and first clock signal terminals in adjacent light emitting shift registers are connected with different light emitting clock signal lines.

a first clock signal terminal in a light emitting shift register in an even-numbered light emitting driving circuit is connected with one of the third light emitting clock signal line and the fourth light emitting clock signal line, a second clock signal terminal in the light emitting shift register in the even-numbered light emitting driving circuit is connected with the other of the third light emitting clock signal line and the fourth light emitting clock signal line, and first clock signal terminals in adjacent light emitting shift registers are connected with different light emitting clock signal lines.

In some exemplary embodiments, a control driving circuit includes control shift registers, wherein a control shift register includes a cascaded signal output terminal, a signal input terminal, a first signal output terminal, a second signal output terminal, a third signal output terminal and a fourth signal output terminal.

A first control driving circuit includes $N_1/4$ cascaded control shift registers, a cascaded signal output terminal of a control shift register of an x-th stage is connected with a signal input terminal of a control shift register of an (x+1)-th stage in the first control driving circuit; a first signal output terminal, a second signal output terminal, a third signal output terminal and a fourth signal output terminal of the control shift register of the x-th stage in the first control driving circuit are respectively connected with second scan signal lines of pixel circuits in a (4x−3)-th row, pixel circuits in a (4x−2)-th row, pixel circuits in a (4x−1)-th row and pixel circuits in a 4x-th row, where x=1, 2, . . . , $N_1/4$.

A j-th control driving circuit includes $(N_j-N_{j-1})/4$ cascaded control shift registers, a cascaded signal output terminal of a control shift register of a y-th stage is connected with a signal input terminal of a control shift register of a (y+1)-th stage in the j-th control driving circuit; a first signal output terminal, a second signal output terminal, a third signal output terminal and a fourth signal output terminal of the control shift register of the y-th stage in the j-th control driving circuit are respectively connected with second scan signal lines of pixel circuits in an $(N_{j-1}+4y-3)$-th row, pixel circuits in an $(N_{j-1}+4y-2)$-th row, pixel circuits in an $(N_{j-1}+4y-1)$-th row, pixel circuits in an $(N_{j-1}+4y)$-th row, where y=1, 2, . . . , $(N_j-N_{j-1})/4$.

In some exemplary embodiments, a control shift register further includes a first clock signal terminal and a second clock signal terminal.

A first clock signal terminal in a control shift register in an odd-numbered control driving circuit is connected to one of the first control clock signal line and the second control clock signal line, a second clock signal terminal in the control shift register in the odd-numbered control driving circuit is connected to the other of the first control clock signal line and the second control clock signal line, and first clock signal terminals in adjacent control shift registers are connected to different control clock signal lines.

A first clock signal terminal in a control shift register in an even-numbered control driving circuit is connected to one of the third control clock signal line and the fourth control clock signal line, a second clock signal terminal in the control shift register in the even-numbered control driving circuit is connected to the other of the third control clock signal line and the fourth control clock signal line, and first clock signal terminals in adjacent control shift registers are connected to different control clock signal lines.

In some exemplary embodiments, a reset driving circuit includes reset shift registers, wherein a reset shift register includes a cascaded signal output terminal, a signal input terminal, a first signal output terminal, a second signal output terminal, a third signal output terminal and a fourth signal output terminal.

A first reset driving circuit includes $N_1/4$ cascaded reset shift registers, a cascaded signal output terminal of a reset shift register of an x-th stage is connected with a signal input terminal of a reset shift register of an (x+1)-th stage in the first reset driving circuit; a first signal output terminal, a second signal output terminal, a third signal output terminal and a fourth signal output terminal of the reset shift register of the x-th stage in the first reset driving circuit are respectively connected with third scan signal lines of pixel circuits in a (4x−3)-th row, pixel circuits in a (4x−2)-th row, pixel circuits in a (4x−1)-th row and pixel circuits in a 4x-th row, where x=1, 2, . . . , $N_1/4$.

A j-th reset driving circuit includes: $(N_j-N_{j-1})/4$ cascaded reset shift registers, a cascaded signal output terminal of a reset shift register of a y-th stage is connected with a signal input terminal of a reset shift register of a (y+1)-th stage in the j-th reset driving circuit; a first signal output terminal, a second signal output terminal, a third signal output terminal and a fourth signal output terminal of the reset shift register of the y-th stage in the j-th reset driving circuit are respectively connected with third scan signal lines of pixel circuits in an $(N_{j-1}+4y-3)$-th row, pixel circuits in an $(N_{j-1}+4y-2)$-th row, pixel circuits in an $(N_{j-1}+4y-1)$-th row, pixel circuits in an $(N_{j-1}+4y)$-th row, where y=1, 2, . . . , $(N_j-N_{j-1})/4$.

In some exemplary embodiments, the reset shift register further includes a first clock signal terminal and a second clock signal terminal.

A first clock signal terminal in a reset shift register in an odd-numbered reset driving circuit is connected to one of the first reset clock signal line and the second reset clock signal line, a second clock signal terminal in the reset shift register in the odd-numbered reset driving circuit is connected to the other of the first reset clock signal line and the second reset clock signal line, and first clock signal terminals in adjacent reset shift registers are connected to different reset clock signal lines.

A first clock signal terminal in a reset shift register in an even-numbered reset driving circuit is connected to one of the third reset clock signal line and the fourth reset clock signal line, a second clock signal terminal in the reset shift register in the even-numbered reset driving circuit is connected to the other of the third reset clock signal line and the fourth reset clock signal line, and first clock signal terminals in adjacent reset shift registers are connected to different reset clock signal lines.

In some exemplary embodiments, a shift register includes a first node reset sub-circuit, a second node control sub-circuit, a third node control sub-circuit, and an output control sub-circuit, the shift register includes a light emitting shift register, a control shift register, and a reset shift register.

The first node control sub-circuit is electrically connected with a first clock signal terminal, a second clock signal terminal, a first power supply terminal, a signal input terminal, a first node and a second node, respectively, and is configured to provide a signal of the first power supply terminal or the second clock signal terminal to the first node under the control of the first clock signal terminal, the signal input terminal and the second node.

The second node control sub-circuit is electrically connected with the second clock signal terminal, the first power supply terminal, the signal input terminal and the second node respectively, and is configured to provide a signal of the first power supply terminal or the second clock signal terminal to the second node under control of the signal input terminal and the second clock signal terminal.

The third node control sub-circuit is electrically connected with the first node, the second node, a third node and the first clock signal terminal respectively, and is configured to provide a signal of the first clock signal terminal or a second power supply terminal to the third node under the control of the first clock signal terminal, the first node and the second node.

The output control sub-circuit is electrically connected with the first node, the third node, the first power supply terminal, the second power supply terminal, a cascaded signal output terminal, a first signal output terminal, a second signal output terminal, a third signal output terminal and a fourth signal output terminal respectively, and is configured to provide a signal of the first power supply terminal or the second power supply terminal to the cascaded signal output terminal, the first signal output terminal, the second signal output terminal, the third signal output terminal and the fourth signal output terminal under control of the first node, the third node and the first power supply terminal.

In some exemplary embodiments, a shift register includes a first node reset sub-circuit, a second node control sub-circuit, a third node control sub-circuit, and an output control sub-circuit, the shift register includes a light emitting shift register, a control shift register, and a reset shift register.

The first node control sub-circuit is electrically connected with a first clock signal terminal, a second clock signal terminal, a signal input terminal, a first node and a second node, respectively, and is configured to provide a signal of the first clock signal terminal or the second clock signal terminal to the first node under control of the first clock signal terminal, the signal input terminal and the second node.

The second node control sub-circuit is electrically connected with the second clock signal terminal, the first power supply terminal, the signal input terminal and the second node respectively, and is configured to provide a signal of the first power supply terminal or the second clock signal terminal to the second node under control of the signal input terminal and the second clock signal terminal.

The third node control sub-circuit is electrically connected with the first node, the second node, a third node and the first clock signal terminal respectively, and is configured to provide a signal of the first clock signal terminal or a second power supply terminal to the third node under the control of the first clock signal terminal, the first node and the second node.

The output control sub-circuit is electrically connected with the first node, the third node, the first power supply terminal, the second power supply terminal, a cascaded signal output terminal, a first signal output terminal, a second signal output terminal, a third signal output terminal and a fourth signal output terminal respectively, and is configured to provide a signal of the first power supply terminal or the second power supply terminal to the cascaded signal output terminal, the first signal output terminal, the second signal output terminal, the third signal output terminal and the fourth signal output terminal under control of the first node, the third node and the first power supply terminal.

In some exemplary embodiments, the shift register further includes: a noise reduction sub-circuit; the noise reduction sub-circuit is electrically connected with a noise reduction signal terminal, the first clock signal terminal, the first power supply terminal, the first node and the third node respectively, and is configured to provide a signal of the first clock signal terminal to the first node and a signal of the first power supply terminal to the third node under control of the noise reduction signal terminal.

In some exemplary embodiments, the first node control sub-circuit includes a first transistor, a second transistor, a tenth transistor and an eleventh transistor.

A control electrode of the first transistor is electrically connected to the first clock signal terminal, a first electrode of the first transistor is electrically connected to the first power supply terminal, and a second electrode of the first transistor is electrically connected to a first electrode of the second transistor.

A control electrode of the second transistor is electrically connected with the signal input terminal, and a second electrode of the second transistor is electrically connected with the first node.

A control electrode of the tenth transistor is electrically connected to the second node, a first electrode of the tenth transistor is electrically connected to the first node, and a second electrode of the tenth transistor is electrically connected to a first electrode of the eleventh transistor.

A control electrode of the eleventh transistor is electrically connected to the first clock signal terminal, and a second electrode of the eleventh transistor is electrically connected to the second clock signal terminal.

In some exemplary embodiments, the first node control sub-circuit includes a first transistor, a second transistor, a tenth transistor and an eleventh transistor.

A control electrode and a first electrode of the first transistor are electrically connected with the first clock signal terminal, and a second electrode of the first transistor is electrically connected with a first electrode of the second transistor.

A control electrode of the second transistor is electrically connected with the signal input terminal, and a second electrode of the second transistor is electrically connected with the first node.

A control electrode of the tenth transistor is electrically connected to the second node, a first electrode of the tenth transistor is electrically connected to the first node, and a second electrode of the tenth transistor is electrically connected to a first electrode of the eleventh transistor.

A control electrode of the eleventh transistor is electrically connected to the first clock signal terminal, and a second electrode of the eleventh transistor is electrically connected to the second clock signal terminal.

In some exemplary embodiments, the second node control sub-circuit includes a third transistor, a fourth transistor, a fifth transistor and a sixth transistor.

A control electrode of the third transistor is electrically connected to the second clock signal terminal, a first electrode of the third transistor is electrically connected to the first power supply terminal, and a second electrode of the third transistor is electrically connected to the second node.

A control electrode of the fourth transistor is electrically connected with the signal input terminal, a first electrode of the fourth transistor is electrically connected with the second node, and a second electrode of the fourth transistor is electrically connected with a first electrode of the fifth transistor.

A control electrode of the fifth transistor is electrically connected with the signal input terminal, and a second electrode of the fifth transistor is electrically connected with the second clock signal terminal.

A control electrode of the sixth transistor is electrically connected with the second node, a first electrode of the sixth transistor is electrically connected with the first power supply terminal, and a second electrode of the sixth transistor is electrically connected with the second electrode of the fourth transistor.

In some exemplary embodiments, the third node control sub-circuit includes a seventh transistor, an eighth transistor, a ninth transistor and a first capacitor.

A control electrode of the seventh transistor is electrically connected to the second node, a first electrode of the seventh transistor is electrically connected to the first clock signal terminal, and a second electrode of the seventh transistor is electrically connected to a first electrode of the eighth transistor.

A control electrode of the eighth transistor is electrically connected with the first clock signal terminal, and a second electrode of the eighth transistor is electrically connected with the third node.

A control electrode of the ninth transistor is electrically connected with the first node, a first electrode of the ninth transistor is electrically connected with the third node, and a second electrode of the ninth transistor is electrically connected with the second power supply terminal.

A first terminal of the first capacitor is electrically connected to the second node, and a second terminal of the first capacitor is electrically connected to the second electrode of the seventh transistor.

In some exemplary embodiments, the output control sub-circuit includes a twelfth transistor to a twenty-second transistor, a second capacitor and a third capacitor.

A control electrode of the twelfth transistor is electrically connected with the first power supply terminal, a first electrode of the twelfth transistor is electrically connected with the first node, and a second electrode of the twelfth transistor is electrically connected with a fourth node.

A control electrode of the thirteenth transistor is electrically connected with the fourth node, a first electrode of the thirteenth transistor is electrically connected with the first power supply terminal, and a second electrode of the thirteenth transistor is electrically connected with the cascaded signal output terminal.

A control electrode of the fourteenth transistor is electrically connected with the third node, a first electrode of the fourteenth transistor is electrically connected with the second power supply terminal, and a second electrode of the fourteenth transistor is electrically connected with the cascaded signal output terminal.

A control electrode of the fifteenth transistor is electrically connected with the fourth node, a first electrode of the fifteenth transistor is electrically connected with the first power supply terminal, and a second electrode of the fifteenth transistor is electrically connected with the first signal output terminal.

A control electrode of the sixteenth transistor is electrically connected with the third node, a first electrode of the sixteenth transistor is electrically connected with the second power supply terminal, and a second electrode of the sixteenth transistor is electrically connected with the first signal output terminal.

A control electrode of the seventeenth transistor is electrically connected with the fourth node, a first electrode of the seventeenth transistor is electrically connected with the first power supply terminal, and a second electrode of the seventeenth transistor is electrically connected with the second signal output terminal.

A control electrode of the eighteenth transistor is electrically connected with the third node, a first electrode of the eighteenth transistor is electrically connected with the second power supply terminal, and a second electrode of the eighteenth transistor is electrically connected with the second signal output terminal.

A control electrode of the nineteenth transistor is electrically connected with the fourth node, a first electrode of the nineteenth transistor is electrically connected with the first power supply terminal, and a second electrode of the nineteenth transistor is electrically connected with the third signal output terminal.

A control electrode of the twentieth transistor is electrically connected with the third node, a first electrode of the twentieth transistor is electrically connected with the second power supply terminal, and a second electrode of the twentieth transistor is electrically connected with the third signal output terminal.

A control electrode of the twenty-first transistor is electrically connected with the fourth node, a first electrode of the twenty-first transistor is electrically connected with the first power supply terminal, and a second electrode of the twenty-first transistor is electrically connected with the fourth signal output terminal.

A control electrode of the twenty-second transistor is electrically connected with the third node, a first electrode of the twenty-second transistor is electrically connected with the second power supply terminal, and a second electrode of the twenty-second transistor is electrically connected with the fourth signal output terminal.

A first terminal of the second capacitor is electrically connected with the fourth node, and a second terminal of the second capacitor is electrically connected with the first signal output terminal.

A first terminal of the third capacitor is electrically connected to the third node, and a second terminal of the third capacitor is electrically connected to the second power supply terminal.

In some exemplary embodiments, the output control sub-circuit includes a twelfth transistor to a twenty-eighth transistor, a second capacitor and a third capacitor.

A control electrode of the twelfth transistor is electrically connected with the first power supply terminal, a first electrode of the twelfth transistor is electrically connected with the first node, and a second electrode of the twelfth transistor is electrically connected with a fourth node.

A control electrode of the thirteenth transistor is electrically connected with the fourth node, a first electrode of the thirteenth transistor is electrically connected with the first power supply terminal, and a second electrode of the thirteenth transistor is electrically connected with the cascaded signal output terminal.

A control electrode of the fourteenth transistor is electrically connected with the third node, a first electrode of the fourteenth transistor is electrically connected with a fifth node, and a second electrode of the fourteenth transistor is electrically connected with the cascaded signal output terminal.

A control electrode of the fifteenth transistor is electrically connected with the fourth node, a first electrode of the fifteenth transistor is electrically connected with the first power supply terminal, and a second electrode of the fifteenth transistor is electrically connected with the first signal output terminal.

A control electrode of the sixteenth transistor is electrically connected with the third node, a first electrode of the sixteenth transistor is electrically connected with the fifth node, and a second electrode of the sixteenth transistor is electrically connected with the first signal output terminal.

A control electrode of the seventeenth transistor is electrically connected with the fourth node, a first electrode of the seventeenth transistor is electrically connected with the first power supply terminal, and a second electrode of the seventeenth transistor is electrically connected with the second signal output terminal.

A control electrode of the eighteenth transistor is electrically connected with the third node, a first electrode of the eighteenth transistor is electrically connected with the fifth node, and a second electrode of the eighteenth transistor is electrically connected with the second signal output terminal.

A control electrode of the nineteenth transistor is electrically connected with the fourth node, a first electrode of the nineteenth transistor is electrically connected with the first power supply terminal, and a second electrode of the nineteenth transistor is electrically connected with the third signal output terminal.

A control electrode of the twentieth transistor is electrically connected with the third node, a first electrode of the twentieth transistor is electrically connected with the fifth node, and a second electrode of the twentieth transistor is electrically connected with the third signal output terminal.

A control electrode of the twenty-first transistor is electrically connected with the fourth node, a first electrode of the twenty-first transistor is electrically connected with the first power supply terminal, and a second electrode of the twenty-first transistor is electrically connected with the fourth signal output terminal.

A control electrode of the twenty-second transistor is electrically connected with the third node, a first electrode of the twenty-second transistor is electrically connected with the fifth node, and a second electrode of the twenty-second transistor is electrically connected with the fourth signal output terminal.

A control electrode of the twenty-third transistor is electrically connected with the third node, a first electrode of the twenty-second transistor is electrically connected with the second power supply terminal, and a second electrode of the twenty-second transistor is electrically connected with the fifth node.

A control electrode of the twenty-fourth transistor is electrically connected with the third node, a first electrode of the twenty-fourth transistor is electrically connected with the second power supply terminal, and a second electrode of the twenty-second transistor is electrically connected with the fifth node.

A control electrode of the twenty-fifth transistor is electrically connected with the third node, a first electrode of the twenty-fifth transistor is electrically connected with the second power supply terminal, and a second electrode of the twenty-fifth transistor is electrically connected with the fifth node.

A control electrode of the twenty-sixth transistor is electrically connected with the third node, a first electrode of the twenty-sixth transistor is electrically connected with the second power supply terminal, and a second electrode of the twenty-sixth transistor is electrically connected with the fifth node.

A control electrode of the twenty-seventh transistor is electrically connected with the third node, a first electrode of the twenty-seventh transistor is electrically connected with the second power supply terminal, and a second electrode of the twenty-seventh transistor is electrically connected with the fifth node.

A control electrode of the twenty-eighth transistor is electrically connected with the third node, a first electrode of the twenty-eighth transistor is electrically connected with the second power supply terminal, and a second electrode of the twenty-eighth transistor is electrically connected with the fifth node.

A first terminal of the second capacitor is electrically connected with the fourth node, and a second terminal of the second capacitor is electrically connected with the first signal output terminal.

A first terminal of the third capacitor is electrically connected to the third node, and a second terminal of the third capacitor is electrically connected to the second power supply terminal.

In some exemplary embodiments, the noise reduction sub-circuit includes a twenty-ninth transistor and a thirtieth transistor.

A control electrode of the twenty-ninth transistor is electrically connected with the noise reduction signal terminal, and a first electrode of the twenty-ninth transistor is electrically connected with the first clock signal terminal, and a second electrode of the twenty-ninth transistor is electrically connected with the first node.

A control electrode of the thirtieth transistor is electrically connected with the noise reduction signal terminal, a first electrode of the thirtieth transistor is electrically connected with the first power supply terminal, and a second electrode of the thirtieth transistor is electrically connected with the third node.

In some exemplary embodiments, a light emitting initial signal line is also included; signal input terminals of light emitting shift registers of first stages in the M light emitting driving circuits are electrically connected with the light emitting initial signal line.

A signal of the light emitting initial signal line is M effective level pulse signals, and an i-th effective level pulse signal is a signal of a signal input terminal of a light emitting shift register of a first stage in an i-th light emitting driving circuit.

A time difference between starting time of the i-th effective level pulse signal of the light emitting initial signal line and starting time of an (i+1)-th effective level pulse signal of the light emitting initial signal line is Hi*H, wherein Hi is a number of rows corresponding to a resolution of an i-th partition, and His data writing time of pixel circuits of one row.

Data writing time Hmin*H of a partition with the lowest resolution is larger than a duration T of an effective level pulse signal of the light emitting initial signal line, and Hmin is a number of rows corresponding to the resolution of the partition with the lowest resolution.

In some exemplary embodiments, contents displayed on the display substrate include: a plurality of display frames, wherein the first light emitting clock signal line is a first reference light emitting clock signal line when end time of a first effective level pulse signal of the first light emitting clock signal line is earlier than starting time of a first effective level pulse signal of the second light emitting clock signal line, and the second light emitting clock signal line is the first reference light emitting clock signal line when end time of the first effective level pulse signal of the second light emitting clock signal line is earlier than starting time of the first effective level pulse signal of the first light emitting clock signal line; the third light emitting clock signal line is a second reference light emitting clock signal line when end time of a first effective level pulse signal of the third light emitting clock signal line is earlier than starting time of a first effective level pulse signal of the fourth light emitting clock signal line, and the fourth light emitting clock signal line is the second reference light emitting clock signal line when end time of the first effective level pulse signal of the fourth light emitting clock signal line is earlier than starting time of the first effective level pulse signal of the third light emitting clock signal line.

Within one display frame, a signal of the first reference light emitting clock signal line includes: M1 signal regions, where M1 is a number of odd numbers in M, and a (2s−1)-th light emitting driving circuit outputs a signal in an s-th signal region, where s=1, 2, . . . , M1.

In the s-th signal region, a number of effective level signals in the signal of the first reference light emitting clock signal line satisfies: EMNum_s=$H_{2s-1}$/N0+M0/$H_{2s-1}$, N0=$2H_{2s-1}$/Hmin, M0=Hmin*T/2.

Within one display frame, a signal of the second reference light emitting clock signal line includes: M2 signal regions, where M2 is a number of even numbers in M, and a 2t-th light emitting driving circuit outputs a signal in a t-th signal region, where t=1, 2, . . . , M2.

In the t-th signal region, a number of effective level signals in the signal of the second reference light emitting clock signal line satisfies: EMNum_t≥$H_{2t}$/N1+M0/$H_{2t}$, N1=$2H_{2t}$/Hmin.

In some exemplary embodiments, a control initial signal line also included; signal input terminals of control shift registers of first stages in the M control driving circuits are electrically connected with the control initial signal line.

A signal of the control initial signal line is M effective level pulse signals, and an i-th effective level pulse signal is a signal of a signal input terminal of a control shift register of a first stage in an i-th control driving circuit.

A time difference between starting time of the i-th effective level pulse signal of the control initial signal line and starting time of an (i+1)-th effective level pulse signal of the control initial signal line is Hi*H, wherein Hi is a number of rows corresponding to a resolution of an i-th partition, and His data writing time of pixel circuits of one row.

Data writing time Hmin*H of a partition with the lowest resolution is larger than a duration T of an effective level pulse signal of the control initial signal line, and Hmin is a number of rows corresponding to the resolution of the partition with the lowest resolution.

In some exemplary embodiments, contents displayed on the display substrate include: a plurality of display frames, wherein the first control clock signal line is a first reference control clock signal line when end time of a first effective level pulse signal of the first light emitting clock signal line is earlier than starting time of a first effective level pulse signal of the second light emitting clock signal line, and the second control clock signal line is the first reference control clock signal line when end time of the first effective level pulse signal of the second control clock signal line is earlier than starting time of the first effective level pulse signal of the first control clock signal line; the third control clock signal line is a second reference control clock signal line when end time of a first effective level pulse signal of the third control clock signal line is earlier than starting time of a first effective level pulse signal of the fourth control clock signal line, and the fourth control clock signal line is the second reference control clock signal line when end time of the first effective level pulse signal of the fourth control clock signal line is earlier than starting time of the first effective level pulse signal of the third control clock signal line.

Within one display frame, a signal of the first reference control clock signal line includes: M1 signal regions, where M1 is a number of odd numbers in M, and a (2s−1)-th control driving circuit outputs a signal in an s-th signal region, where s=1, 2, . . . , M1.

In the s-th signal region, a number of effective level signals in the signal of the first reference control clock signal line satisfies: G2Num_s=$H_{2s-1}$/N0+M0/$H_{2s-1}$, N0=$2H_{2s-1}$/Hmin, M0=Hmin*T/2.

Within one display frame, a signal of the second reference control clock signal line includes: M2 signal regions, where M2 is a number of even numbers in M, and a 2t-th control driving circuit outputs a signal in a t-th signal region, where t=1, 2, . . . , M2.

In the t-th signal region, a number of effective level signals in the signal of the second reference control clock signal line satisfies: G2Num_t≥$H_{2t}$/N1+M0/H2t, N1=$2H_{2t}$/Hmin.

In some exemplary embodiments, a reset initial signal line also included; signal input terminals of reset shift registers of first stages in the M reset driving circuits are electrically connected with the reset initial signal line.

A signal of the reset initial signal line is M effective level pulse signals, and an i-th effective level pulse signal is a signal of a signal input terminal of a reset shift register of a first stage in an i-th reset driving circuit.

A time difference between starting time of the i-th effective level pulse signal of the reset initial signal line and starting time of an (i+1)-th effective level pulse signal of the reset initial signal line is Hi*H, wherein Hi is a number of rows corresponding to a resolution of an i-th partition, and His data writing time of pixel circuits of one row.

Data writing time Hmin*H of a partition with the lowest resolution is larger than a duration T of an effective level pulse signal of the reset initial signal line, and Hmin is a number of rows corresponding to the resolution of the partition with the lowest resolution.

In some exemplary embodiments, contents displayed on the display substrate include: a plurality of display frames, the first reset clock signal line is a first reference reset clock signal line when end time of a first effective level pulse signal of the first light emitting clock signal line is earlier than starting time of a first effective level pulse signal of the second light emitting clock signal line, and the second reset clock signal line is the first reference reset clock signal line when end time of the first effective level pulse signal of the second reset clock signal line is earlier than starting time of the first effective level pulse signal of the first reset clock signal line; the third reset clock signal line is a second reference reset clock signal line when end time of a first effective level pulse signal of the third reset clock signal line is earlier than starting time of a first effective level pulse signal of the fourth reset clock signal line, and the fourth reset clock signal line is the second reference reset clock signal line when end time of the first effective level pulse signal of the fourth reset clock signal line is earlier than starting time of the first effective level pulse signal of the third reset clock signal line.

Within one display frame, a signal of the first reference reset clock signal line includes: M1 signal regions, where M1 is a number of odd numbers in M, and a (2s−1)-th reset driving circuit outputs a signal in an s-th signal region, where s=1, 2, . . . , M1.

In the s-th signal region, a number of effective level signals in the signal the first reference reset clock signal line satisfies: G3Num_s=$H_{2s-1}$/N0+M0/$H_{2s-1}$, N0=$2H_{2s-1}$/Hmin, M0=Hmin*T/2.

Within one display frame, a signal of the second reference reset clock signal line includes: M2 signal regions, where M2 is a number of even numbers in M, and a 2t-th reset driving circuit outputs a signal in a t-th signal region, where t=1, 2, ..., M2.

In the t-th signal region, a number of effective level signals in the signal the second reference reset clock signal line satisfies: $G3Num\_t \geq H_2/N1 + M0/H_{2r}$, $N1 = 2H_2/Hmin$.

In a second aspect, an embodiment of the present disclosure further provides a display apparatus including the display substrate described above.

Other aspects may be understood upon reading and understanding drawings and detailed description.

BRIEF DESCRIPTION OF DRAWINGS

The accompanying drawings are used for providing understanding of technical solutions of the present disclosure, and constitute a part of the specification. They are used for explaining the technical solutions of the present disclosure together with the embodiments of the present disclosure, but do not constitute a limitation on the technical solutions of the present disclosure.

DETAILED DESCRIPTION

Figure 1:
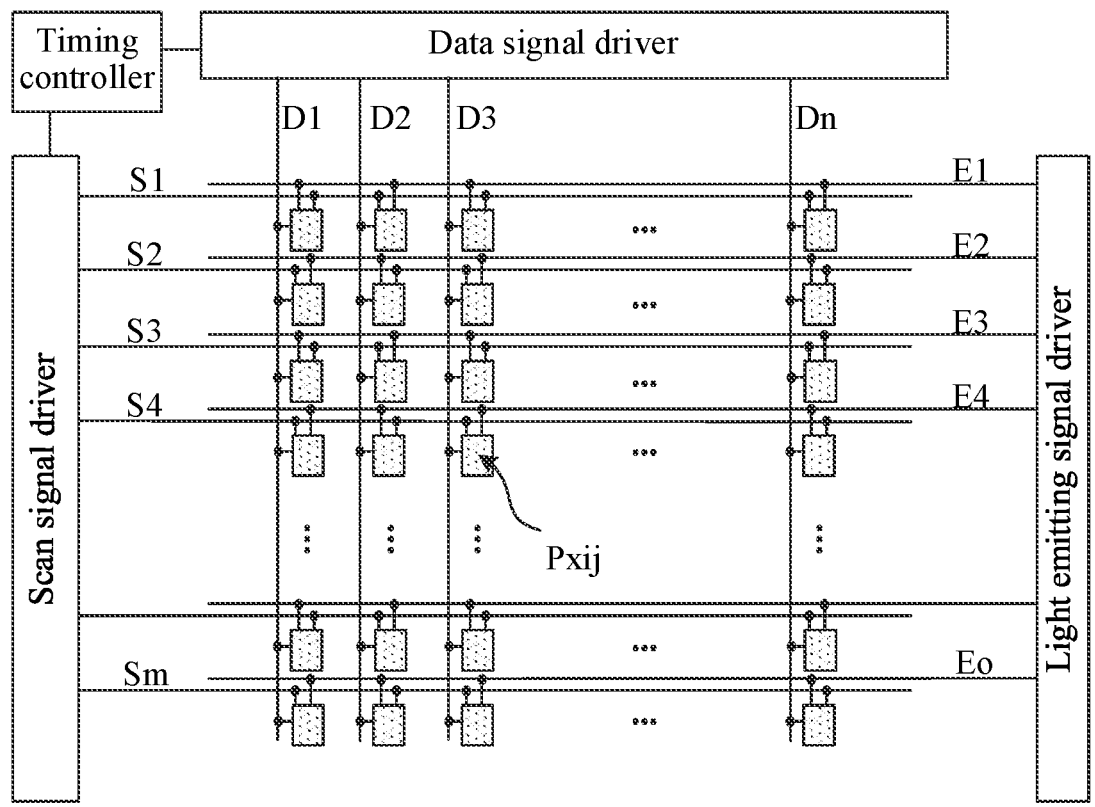
FIG. 1 is a schematic diagram of a structure of a display apparatus.

To make objectives, technical solutions, and advantages of the present disclosure more clear, the embodiments of the present disclosure will be described in detail with reference to the accompanying drawings. It is to be noted that the embodiments in the present disclosure and features in the embodiments may be randomly combined with each other if there is no conflict.

Unless otherwise defined, technical terms or scientific terms used in the embodiments of the present disclosure should have usual meanings understood by those of ordinary skills in the art to which the present disclosure belongs. "First", "second", and similar terms used in the embodiments of the present disclosure do not represent any order, quantity, or importance, but are only used for distinguishing different components. "Include", "contain", or a similar word means that an element or object appearing before the word covers an element or object listed after the word and equivalent thereof, which does not exclude another element or object.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, the wordings cannot be understood as limitations on the present disclosure. The positional relationships between the constituent elements are changed as appropriate according to directions for describing various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or may be a detachable connection, or an integrally connection; it may be a mechanical connection, or may be an electrical connection; it may be a direct connection, or may be an indirect connection through middleware, or may be an internal connection between two elements. Those of ordinary skill sin the art may understand specific meanings of these terms in the present disclosure in combination with specific situations.

In the present disclosure, a transistor refers to an element including at least three terminals, namely, a gate electrode, a drain electrode and a source electrode. A transistor has a channel region between a drain electrode (or referred to as a drain electrode terminal, a drain connection region, or a drain) and a source electrode (or referred to as a source electrode terminal, a source connection region, or a source), and a current can flow through the drain electrode, the channel region, and the source electrode. In the present disclosure, the channel region refers to a region through which a current mainly flows.

In the present disclosure, a first electrode may be a drain electrode while a second electrode may be a source electrode, or a first electrode may be a source electrode while a second electrode may be a drain electrode. Herein, functions of the "source electrode" and the "drain electrode" are sometimes interchangeable with each other in a case that transistors with opposite polarities are used or a current direction changes during operation of a circuit. Therefore, the "source electrode" and the "drain electrode" may be interchangeable in the present disclosure. The gate electrode may also be called a control electrode.

In the present disclosure, "electric connection" includes a case where constituent elements are connected through an element with a certain electrical effect. The "element with the certain electrical effect" is not particularly limited as long as electrical signals may be sent and received between the connected constituent elements. For example, "the element with a certain electrical effect" may be an electrode or wiring, or a switch element, such as a transistor, or other functional elements, such as a resistor, an inductor, a capacitor, or the like.

In the present disclosure, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the present disclosure, "about" refers to that a boundary is defined not so strictly and numerical values within process and measurement error ranges are allowed.

FIG. 1 is a schematic diagram of a structure of a display apparatus. The display substrate may include a timing controller, a data signal driver, a scan signal driver, a light emitting signal driver and a pixel array. The timing controller is connected with the data signal driver, the scan signal driver and the light emitting signal driver, respectively. The data signal driver is connected with a plurality of data signal lines (D1 to Dn) respectively. The scan signal driver is connected with a plurality of scan signal lines (S1 to Sm) respectively. The light emitting signal driver is connected with a plurality of light emitting signal lines (E1 to Eo) respectively. The pixel array may include a plurality of sub-pixels Pxij, i and j may be natural numbers, at least one sub-pixel Pxij may include a circuit unit and a light emitting device connected with the circuit unit, and the circuit unit may include at least one scan signal line, at least one data signal line, at least one light emitting signal line, and a pixel circuit. In some exemplary embodiments, the timing controller may provide the data signal driver with a gray-scale value and a control signal suitable for a specification of the data signal driver, may provide the scan signal driver with a clock signal, a scan starting signal, etc., suitable for a specification of the scan signal driver, and may provide the light emitting signal driver with a clock signal, an emission stopping signal, etc., suitable for a specification of the light emitting signal driver. The data signal driver may generate data voltages to be provided to the data signal lines D1, D2, D3, . . . , and Dn by using the gray scale value and the control signal that are received from the timing controller. For example, the data signal driver may sample the gray scale value using a clock signal, and apply a data voltage corresponding to the gray scale value to the data signal lines D1 to Dn by taking a pixel row as a unit, wherein n may be a natural number. The scan signal driver may receive the clock signal, the scan starting signal, and the like from the timing controller to generate scan signals to be provided to the scan signal lines S1, S2, S3, . . . , and Sm. For example, the scan signal driver may sequentially provide a scan signal with on-level pulses to the scan signal lines S1 to Sm. For example, the scan signal driver may be constructed in a form of a shift register, and generate a scan signal in a manner of sequentially transmitting a scan starting signal provided in a form of an on-level pulse to a next-stage circuit under control of the clock signal, wherein m may be a natural number. The light emitting signal driver may receive a clock signal, a transmit stop signal, etc., from the timing controller to generate a transmit signal to be provided to the light emitting signal lines E1, E2, E3, . . . , and Eo. For example, the light emitting signal driver may sequentially provide an emission signal with an off-level pulse to the light emitting signal lines E1 to Eo. For example, the light emitting signal driver may be constructed in a form of a shift register and may generate an emission signal in a manner of transmitting sequentially the emission stopping signal provided in a form of an off-level pulse to a next-stage circuit under the control of the clock signal, wherein o may be a natural number.

Figure 2:
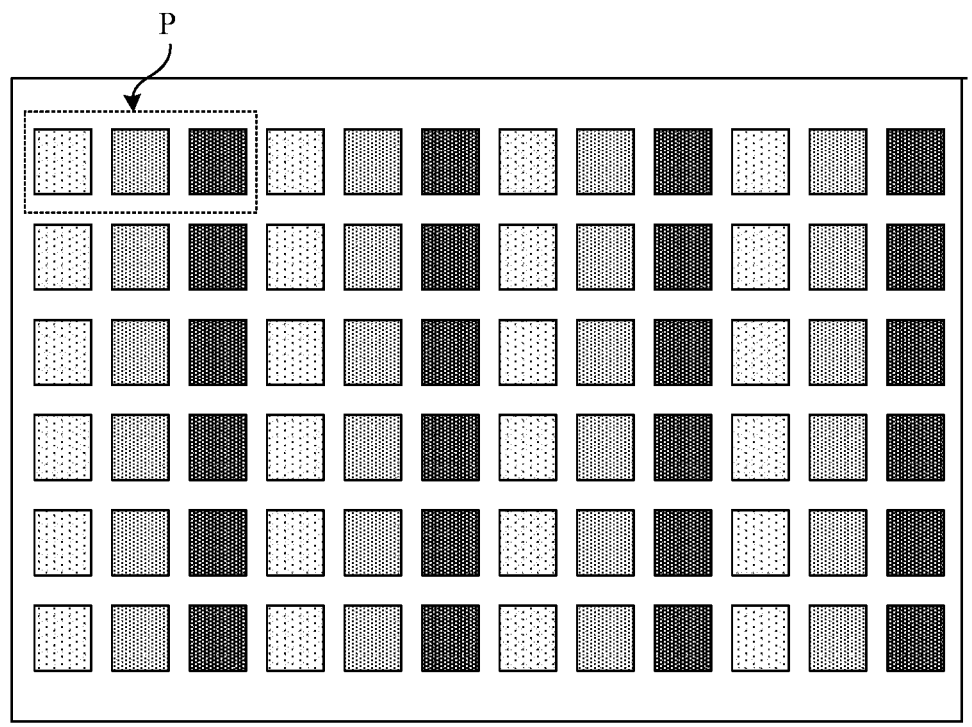
FIG. 2 is a schematic diagram of a planar structure of a display substrate.

FIG. 2 is a schematic diagram of a planar structure of a display substrate. As shown in FIG. 2, the display substrate may include a plurality of pixel units P arranged in a matrix, at least one of the multiple pixel units P includes a first sub-pixel emitting light of a first color, a second sub-pixel emitting light of a second color, and a third sub-pixel emitting light of a third color. The first sub-pixel, the second sub-pixel, and the third sub-pixel each include a pixel circuit and a light emitting device. Pixel circuits in the first sub-pixel, the second sub-pixel, and the third sub-pixel are connected with a scan signal line, a data signal line, and a light emitting signal line respectively. The pixel circuit is configured to receive a data voltage transmitted by a data signal line under control of a scan signal line and a light emitting signal line, and output a corresponding current to a light emitting device. A light emitting device in each of the first sub-pixel, the second sub-pixel, and the third sub-pixel is connected with a pixel circuit of a sub-pixel where the light emitting device is located, and is configured to emit light with a corresponding brightness in response to a current output by the pixel circuit of the sub-pixel where the light emitting device is located.

In some exemplary embodiments, a red (R) sub-pixel, a green (G) sub-pixel, and a blue (B) sub-pixel may be included in the pixel unit P. In some exemplary embodiments, a sub-pixel in the pixel unit may be in a shape of a rectangle, a rhombus, a pentagon, or a hexagon. Three sub-pixels may be arranged side by side horizontally, side by side vertically, or in a manner like a Chinese character "品", the present disclosure is not limited thereto.

Figure 3:
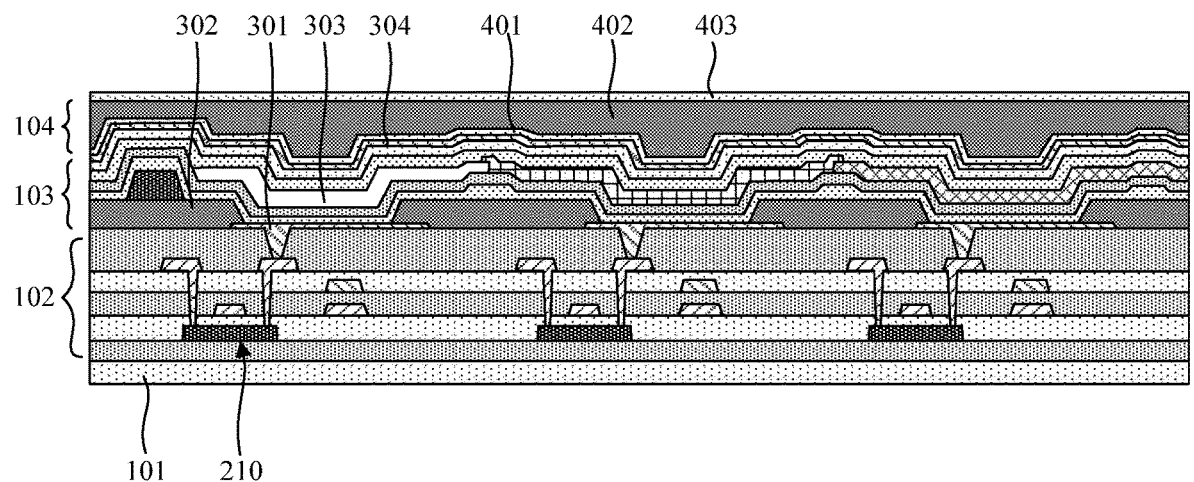
FIG. 3 is a schematic diagram of a cross-sectional structure of a display substrate.

FIG. 3 is a schematic diagram of a cross-sectional structure of a display substrate, which illustrates a structure of three sub-pixels of an OLED display substrate. As shown in FIG. 3, on a plane perpendicular to the display substrate, the display substrate may include a driving circuit layer 102 disposed on a base substrate 101, a light emitting structure layer 103 disposed on a side of the driving circuit layer 102 away from the base substrate 101, and an encapsulation layer 104 disposed on a side of the light emitting structure layer 103 away from the base substrate 101. In some possible implementations, the display substrate may include another film layer, such as a post spacer, which is not limited in the present disclosure.

In some exemplary embodiments, the base substrate 101 may be a flexible substrate, or may be a rigid substrate. The driving circuit layer 102 of each sub-pixel may include a plurality of transistors and a storage capacitor that form a pixel circuit. The light emitting structure layer 103 may include an anode 301, a pixel define layer 302, an organic light emitting layer 303, and a cathode 304. The anode 301 is connected with a drain electrode of a drive transistor 210 through a via. The organic light emitting layer 303 is connected with the anode 301. The cathode 304 is connected with the organic light emitting layer 303. The organic light emitting layer 303 is driven by the anode 301 and the cathode 304 to emit light of a corresponding color. The encapsulation layer 104 may include a first encapsulation layer 401, a second encapsulation layer 402, and a third encapsulation layer 403 that are stacked. The first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403 so as to prevent external water vapor from entering the light emitting structure layer 103.

In some exemplary embodiments, the organic light emitting layer 303 may include a Hole Injection Layer (HIL for short), a Hole Transport Layer (HTL for short), an Electron Block Layer (EBL for short), an Emitting Layer (EML for short), a Hole Block Layer (HBL for short), an Electron Transport Layer (ETL for short), and an Electron Injection Layer (EIL for short) that are stacked. In some exemplary embodiments, hole injection layers of all sub-pixels may be connected together to form a common layer, electron injection layers of all the sub-pixels may be connected together to form a common layer, hole transport layers of all the sub-pixels may be connected together to form a common layer, electron transport layers of all the sub-pixels may be connected together to form a common layer, hole block layers of all the sub-pixels may be connected together to form a common layer, emitting layers of adjacent sub-pixels may be overlapped slightly, or may be isolated from each other, and electron block layers of adjacent sub-pixels may be overlapped slightly, or may be isolated from each other.

The scan signal lines may include a first scan signal line, a second scan signal line, and a third scan signal line.

Figure 4:
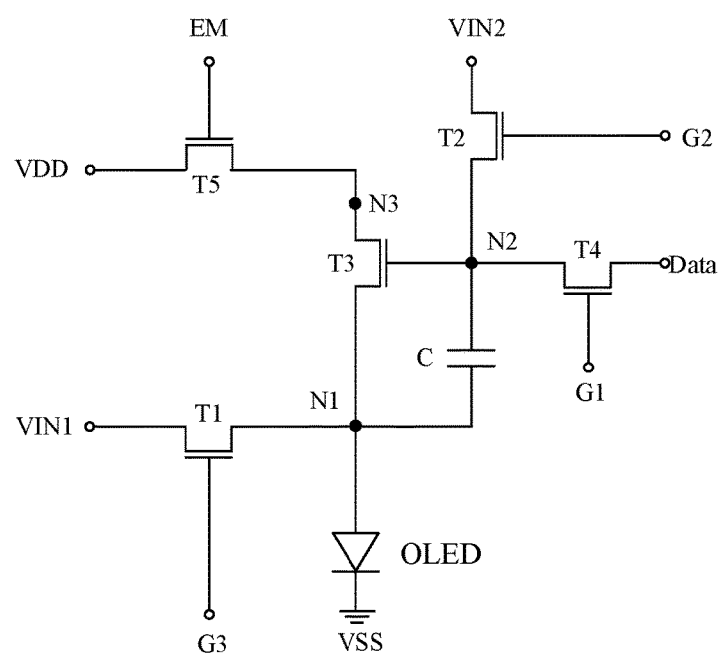
FIG. 4 is a schematic diagram of an equivalent circuit of a pixel circuit.

In an exemplary embodiment, the pixel circuit may be of a 3T1C, 4T1C, 5T1C, 5T2C, 6T1C, or 7T1C structure. FIG. 4 is a schematic diagram of an equivalent circuit of a pixel circuit. As shown in FIG. 4, the pixel circuit may include five transistors (a first transistor T1 to a fifth transistor T5) and one storage capacitor C, and may be connected with nine signal lines (a data signal line Data, a first scan signal line G1, a second scan signal line G2, a third scan signal line G3, a light emitting signal line EM, an initial signal line VIN1, a reference voltage signal line VIN2, a first power supply line VDD and a second power supply line VSS).

In some exemplary embodiments, the pixel circuit may include a first node N1, a second node N2, and a third node N3. The first node N1 is respectively connected with a second electrode of the first transistor T1, a second electrode of the third transistor T3 and a second terminal of the storage capacitor C, the second node N2 is respectively connected with a second electrode of the second transistor T2, a control electrode of the third transistor T3, a second electrode of the fourth transistor T4 and a first terminal of the storage capacitor C, and the third node N3 is respectively connected with a first electrode of the third transistor T3 and a second electrode of the fifth transistor T5.

In some exemplary embodiments, the first terminal of the storage capacitor C is connected with the second node N2, and the second terminal of the storage capacitor C is connected with the first node N1.

A control electrode of the first transistor T1 is connected with the third scan signal line G3, a first electrode of the first transistor T1 is connected with the initial signal line VIN1, and a second electrode of the first transistor T1 is connected with the first node N1. The first transistor T1 may be referred to as an anode reset transistor or the like, and when an on-level scan signal is applied to the third scan signal line G3, the first transistor T1 resets the first node N1.

A control electrode of the second transistor T2 is connected with a second scan signal line G2, a first electrode of the second transistor T2 is connected with the reference voltage signal line VIN2, and a second electrode of the second transistor T2 is connected with the second node N2. The second transistor T2 may be referred to as a gate control transistor or the like, and when an on-level scan signal is applied to the second scan signal line G2, a compensation voltage Vref of the reference voltage signal line VIN2 is written into the second node N2.

The control electrode of the third transistor T3 is connected with the second node N2, that is, the control electrode of the third transistor T3 is connected with the first terminal of the storage capacitor C1, a first electrode of the third transistor T3 is connected with the third node N3, and a second electrode of the third transistor T3 is connected with the first node N1. The third transistor T3 may be referred to as a drive transistor, and the third transistor T3 determines an amount of a drive current flowing between the first power supply line VDD and the second power supply line VSS according to a potential difference between the control electrode and the first electrode of the third transistor T3.

A control electrode of the fourth transistor T4 is connected with a first scan signal line G1, a first electrode of the fourth transistor T4 is connected with a data signal line Data, and a second electrode of the fourth transistor T4 is connected with the second node N2. The fourth transistor T4 may be referred to as a writing transistor, and when a scan signal with an on-level is applied to the first scan signal line G1, the fourth transistor T4 enables a data voltage of the data signal line D to be input to the pixel circuit.

A control electrode of the fifth transistor T5 is connected with the light emitting signal line EM, a first electrode of the fifth transistor T5 is connected with the first power supply line VDD, and a second electrode of the fifth transistor T5 is connected with the third node N3. The fifth transistor T5 may be called a light emitting transistor.

In some exemplary embodiments, the first transistor T1 to the fifth transistor T5 may be P-type transistors or N-type transistors. Using a same type of transistors in the pixel circuit may simplify a process flow, reduce process difficulties of a display panel, and improve a yield of products. In some possible implementations, the first transistor T1 to the fifth transistor T5 may include P-type transistor(s) and N-type transistor(s).

In some exemplary embodiments, the first scan signal line G1, the second scan signal line G2, the light emitting signal line EM, the initial signal line VIN1 and the reference voltage signal line VIN2 extend along a horizontal direction, and the second power supply line VSS, the first power supply line VDD, and the data signal line Data extend along a vertical direction.

In some exemplary embodiments, the light emitting device may include any one of an organic light emitting diode (OLED), a quantum dot light emitting diode, and an inorganic light emitting diode. For example, the light emitting device L may employ a micron-scale light emitting device, such as a Micro light emitting Diode (Micro LED), a Mini light emitting Diode (Mini LED), a Micro Organic Light Emitting Diode (Micro OLED), and the like, which are not limited by the embodiments of the present disclosure.

For example, taking the light emitting device L being an organic electroluminescent diode (OLED) as an example, the light emitting device may include a first electrode (for example, as an anode), an organic light emitting layer, and a second electrode (for example, as a cathode) that are stacked.

Figure 5:
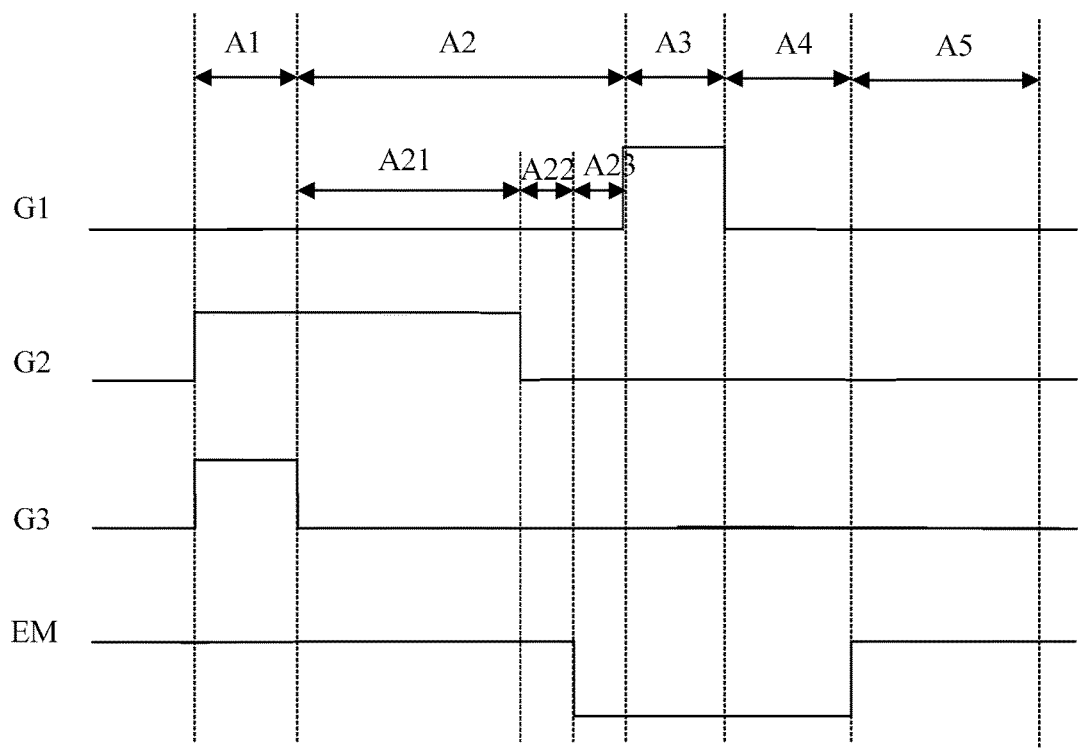
FIG. 5 is a working timing diagram of a pixel circuit.

FIG. 5 is a working timing diagram of a pixel circuit. An exemplary embodiment will be described below through a working process of the pixel circuit shown in FIG. 4. The pixel circuit in FIG. 4 includes five transistors (a first transistor T1 to a fifth transistor T5), one storage capacitor C, and nine signal lines (a data signal line Data, a first scan signal line G1, a second scan signal line G2, a third scan signal line G3, a light emitting signal line EM, an initial signal line VIN1, a reference voltage signal line VIN2, a first power supply line VDD, and a second power supply line VSS), wherein all of the five transistors are P-type transistors.

In some exemplary implementations, the working process of the pixel circuit may include the following stages.

In a first stage A1, a signal of the first scan signal line G1 is a low level signal, and signals of the second scan signal line G2, the third scan signal line G3 and the light emitting signal line EM are high-level signals. The first scan signal line G1 has a low level signal, and the fourth transistor T4 is turned off. A signal of the second scan signal line G2 is a high level signal, the second transistor T2 is turned on. A signal of the reference voltage signal line VIN2 is provided to the second node N2, and the compensation voltage Vref is written to the second node N2. A signal of the third scan signal line G3 is a high level signal, the first transistor T1 is turned on, and a signal of the initial signal line VIN1 is supplied to the first node N1 to reset the first node N1. A signal of the light emitting signal line EM is a high level signal, the fifth transistor T5 is turned on, and a signal of the first power supply line VDD charges the first node N1 via the third node N3 and the third transistor T3. Since the voltage of the first node N1 does not reach the voltage driving the OLED to emit light in this stage, the OLED does not emit light in this stage.

In a second stage A2, signals of the first scan signal line G1 and the second scan signal line G3 are low level signals. Since the signals of the first scan signal line G1 and the third scan signal line G3 are low level signals, both the first transistor T1 and the fourth transistor T4 are turned off. According to the signals of the second scan signal line G2 and the light emitting signal line EM, the second stage A2 may include the following three sub-stages, that is, a first sub-stage A21, a second sub-stage A22 and a third sub-stage A23.

In a first sub-stage A21, signals of the second scan signal line G2, and the light emitting signal line EM are all high level signals. Since the second scan signal line G2 is at a high level, the second transistor T2 is turned on, and the compensation voltage Vref of the reference voltage signal line VIN2 is continuously provided to the second node N2, and the third transistor T3 is continuously turned on. Since the signal of the light emitting signal line EM is a high level signal, the fifth transistor T5 is turned on, and the signal of the first power supply line VDD continuously charges the first node N1 via the third node N3 and the third transistor T3. Since the voltage of the first node N1 does not reach the voltage driving the OLED to emit light in this stage, the OLED does not emit light in this stage.

In a second sub-stage A22, the signal of the second scan signal line G2 is a low-level signal, and the signal of the light emitting signal line EM is a high-level signal. Since the second scan signal line G2 is at a low level, the second transistor T2 is turned off, and since the voltage at both terminals of the storage capacitor C does not suddenly change, the second node N2 maintains the voltage of the previous frame, and the third transistor T3 is continuously turned on. Since the signal of the light emitting signal line EM is a high level signal, the fifth transistor T5 is continuously turned on, and the signal of the first power supply line VDD charges the first node N1 via the third node N3 and the third transistor T3 until the voltage of the first node N1 reaches Vref−Vth (Vth is a threshold voltage of the third transistor T3). Since the voltage of the first node N1 in this stage still does not reach the voltage driving the OLED to emit light, the OLED does not emit light in this stage.

In a third sub-stage A23, both the second scan signal line G2 and the light emitting signal line EM are at a low-level. Since both the second scan signal line G2 and the light emitting signal line EM are low level signals, both the second transistor T2 and the fifth transistor T5 are turned off, and since the voltage at both terminals of the storage capacitor C does not jump, the first node N1 maintains the voltage of the previous frame (Vref−Vth).

In a third stage A3, that is, a data writing stage, the signal of the first scan signal line G1 is a high-level signal, and the signals of the second scan signal line G2, the third scan signal line G3, and the light emitting signal line EM are all low-level signals. Since the signal of the first scan signal line G1 is a high level signal, the fourth transistor T4 is turned on, and the data voltage output by the data signal line Data is written into the second node N2. Since the signals of the second scan signal line G2, the third scan signal line G3 and the light emitting signal line EM are all low level signals, the second transistor T2, the first transistor T1 and the fifth transistor T5 are all turned off, and the first node N1 maintains the voltage of the previous frame (Vref−Vth).

In a fourth stage A4, that is, a transition stage, signals of the first scan signal line G1, the second scan signal line G2, the third scan signal line G3, and the light emitting signal line EM are all low-level signals. Since the signals of the first scan signal line G1, the second scan signal line G2, the third scan signal line G3, and the light emitting signal line EM are all low level signals, all transistors except the third transistor T3 are turned off, and the first node N1 maintains the voltage of the previous frame (Vref−Vth).

In the fifth stage A5, that is, a light emitting stage, the signal of the light emitting signal line EM is a high-level signal, and the signals of the first scan signal line G1, the second scan signal line G2, and the third scan signal line G3 are all low-level signals. Since the signals of the first scan signal line G1, the second scan signal line G2, the third scan signal line G3 and the light emitting signal line EM are all low-level signals, the first transistor T1, the second transistor T2 and the fourth transistor T4 are all turned-off, the signal of the light emitting signal line EM is a high-level signal, the third transistor T3 and the fifth transistor T5 are turned on, the high-level signal of the first power supply terminal VDD is written into the third node N3 through the fifth transistor T5, and the third transistor T3 writes a driving current generated by the signal of the third node N3 into the first node N1 according to the voltage of the second node N2, thereby driving the OLED connected with the first node N1 to emit light.

The scan signal driver in the display substrate may include a scan signal driver providing a signal to the first scan signal line, a scan signal driver providing a signal to the second scan signal line, and a scan signal driver providing a signal to the third scan signal line. The scan signal driver and the light emitting signal driver may also be referred to as a gate driving apparatus or a gate driver. The gate driving apparatus includes a gate driving integrated circuit or a panel gate driving circuit which is separate. Since a pulse width of a gate driving signal provided by the gate driving circuit is related to a working performance of the pixel circuit inside the display panel, for example, when the gate driving signal can be used as a scan signal and a light emitting signal, pulse widths of the scan signal and the light emitting signal are related to the working performance of the pixel circuit inside the display panel, a control circuit with a Pulse Width Modulation (PWM) function is required to adjust the pulse width of the gate driving signal. Since the signal of the first scan signal line is used to control the writing of the data signal in the data writing stage, the signals of the second scan signal line, the third scan signal line and the light emitting signal line are mainly used for internal compensation in the compensation stage, a driving circuit with a PWM function is used for the scan signal driver providing a signal to the second scan signal line, the scan signal driver providing a signal to the third scan signal line, and the light emitting signal driver providing a signal to the light emitting signal line.

In order to reduce power consumption, the display substrate is partitioned, and the resolution and refresh frequency of different partitions may be the same or may be different. For example, the first partition adopts the highest resolution of 3840 (columns)*240 (rows) and the first partition also adopts the highest resolution for display, a corresponding PWM model clock cycle is 8*H (which can ensure the compensation timing to shift 4H per row); the second partition adopts 1920*120 resolution, a corresponding PWM model clock cycle is 4*H, since the data writing time of two rows is merged, the shift time is shortened by half, and then the cycle is shortened by half; the third partition adopts 960*60 resolution, according to the above description, it can be known that the clock cycle of PWM model needs to be set as 2H. A scan signal driver providing a scan signal to one partition corresponds to a group of clock signal lines, a scan signal driver providing a scan signal to different partitions is correspondingly connected to different clock signal lines, a light emitting signal driver providing a light emitting signal to one partition corresponds to a group of clock signal lines, and a light emitting signal driver providing a light emitting signal to different partitions is connected to different clock signal lines. The more partitions, the more clock signal lines connected to driving circuits with the PWM function used by the scan signal driver providing a signal to the second scan signal line, the scan signal driver providing a signal to the third scan signal line, and the light emitting signal driver providing a signal to the light emitting signal line in the display substrate, so that the structure of the display substrate is complicated, and a narrow bezel cannot be realized.

Figure 6:
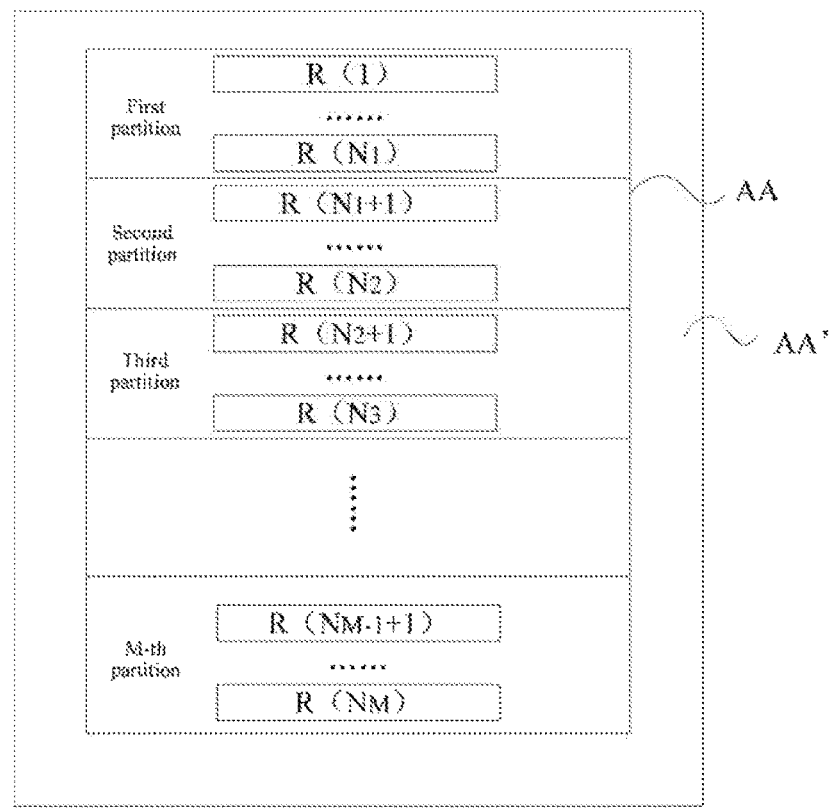
FIG. 6 is a schematic diagram of partitions of the display substrate.
Figure 7:
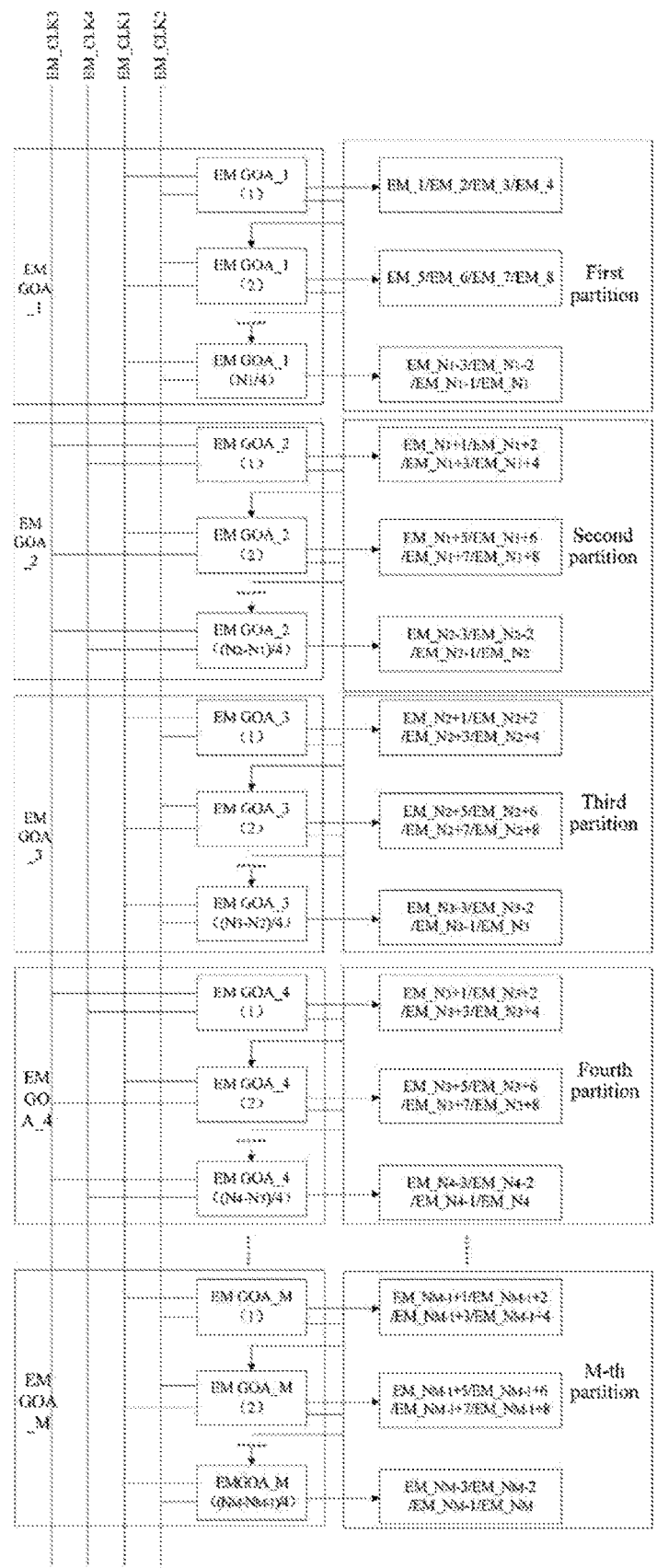
FIG. 7 is a schematic diagram of connections between a light emitting driving circuit group and pixel circuits in different partitions in a display substrate.
Figure 8:
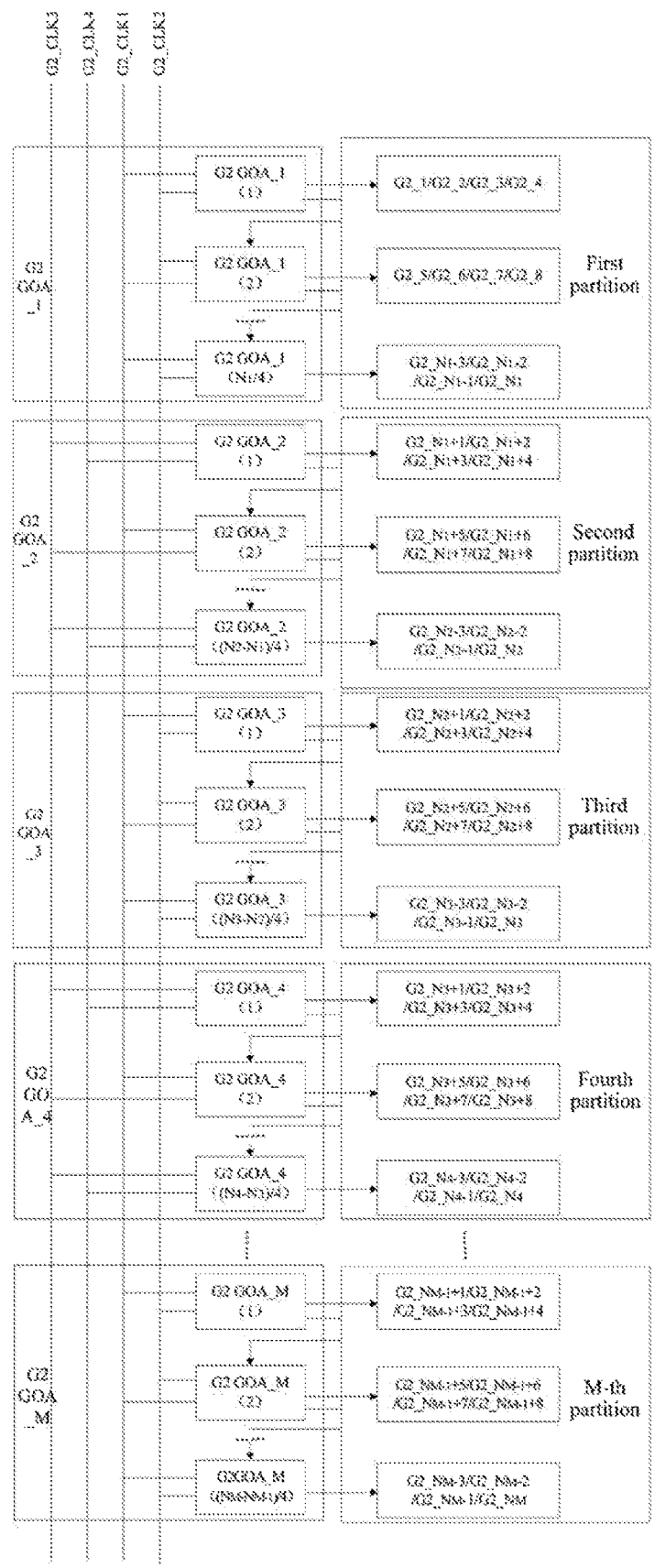
FIG. 8 is a schematic diagram of connections between a control driving circuit group and pixel circuits in different partitions in a display substrate.
Figure 9:
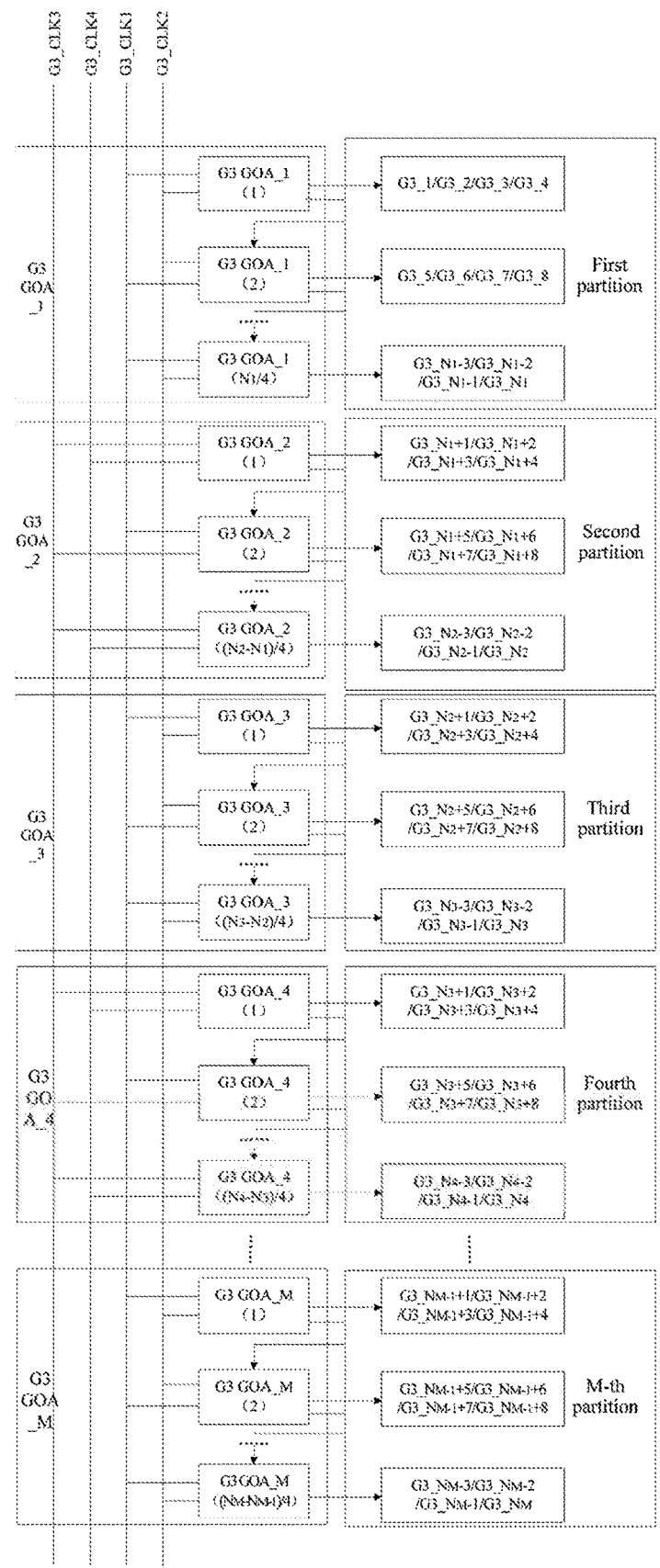
FIG. 9 is a schematic diagram of connections between a reset driving circuit group and pixel circuits in different partitions in a display substrate.

FIG. 6 is a schematic diagram of partitions of a display substrate, FIG. 7 is a schematic diagram of connections between a light emitting driving circuit group and pixel circuits of different partitions in the display substrate, FIG. 8 is a schematic diagram of connections between a control driving circuit group and pixel circuits of different partitions in the display substrate, and FIG. 9 is a schematic diagram of connections between a reset driving circuit group and pixel circuits of different partitions in the display substrate. As shown in FIGS. 6 to 9, the display substrate provided by an embodiment of the present disclosure includes: a display area AA and a non-display area AA'. The display area AA is provided with pixel circuits arranged in an array, the display area is divided into M partitions, which are respectively a first partition to an M partition, along a first direction. The pixel circuit includes a writing transistor, an anode reset transistor, a gate control transistor, a light emitting transistor as well as a first scan signal line, a second scan signal line, a third scan signal line and a light emitting signal line that extend along a second direction, wherein the first scan signal line is electrically connected with the writing transistor, the second scan signal line is electrically connected with the gate control transistor, the third scan signal line is electrically connected with the anode reset transistor, and the light emitting signal line is connected with the light emitting transistor, where M is an positive integer greater than or equal to 2.

As shown in FIGS. 7 to 9, the non-display area is provided with a light emitting driving circuit group, a control driving circuit group and a reset driving circuit group, a first light emitting clock signal line EM_CLK1 to a fourth light emitting clock signal line EM_CLK4, a first control clock signal line G2_CLK1 to a fourth control clock signal line G2_CLK4, and a first reset clock signal line G3_CLK1 to a fourth reset clock signal line G4_CLK1, As shown in FIG. 7, the light emitting driving circuit group may include M light emitting driving circuits EM GOA_1 to EM GOA_M. An i-th light emitting driving circuit is connected with a light emitting signal line in a pixel circuit in an i-th partition. Light emitting shift registers in odd-numbered light emitting driving circuits are electrically connected to the first light emitting clock signal line EM_CLK1 and the second light emitting clock signal with EM_CLK2, and light emitting shift registers in even-numbered light emitting driving circuits are connected with the third light emitting clock signal line EM_CLK3 and the fourth light emitting clock signal line EM_CLK4, where i=1, 2, . . . , M.

And/or, as shown in FIG. 8, the control driving circuit group includes M control driving circuits G2 GOA_1 to G2 GOA_M. An i-th control driving circuit is connected with a second scan signal line in a pixel circuit in the i-th partition, odd-numbered control driving circuits are electrically connected to the first control clock signal line G2_CLK1 and the second control clock signal line G2_CLK2, and even-numbered control driving circuits are connected to the third control clock signal line G2_CLK3 and the fourth control clock signal line G2_CLK4.

And/or, as shown in FIG. 9, the reset driving circuit group includes M reset driving circuits G3 GOA_1 to G3 GOA_M. An i-th reset driving circuit is connected to a third scan signal line in a pixel circuit in an i-th partition, odd-numbered reset driving circuits are electrically connected to the first reset clock signal line G3_CLK1 and the second reset clock signal line G3_CLK2, and even-numbered reset driving circuits are connected to the third reset clock signal line G3_CLK3 and the fourth reset clock signal line G3_CLK4.

In the present disclosure, the light emitting shift register in the odd-numbered light emitting driving circuit is electrically connected with the first light emitting clock signal line EM_CLK1 and the second light emitting clock signal line EM_CLK2, the light emitting shift register in the even-numbered light emitting driving circuit is electrically connected with the third light emitting clock signal line EM_CLK3 and the fourth light emitting clock signal line EM_CLK4, and/or the i-th reset driving circuit is electrically connected with the third scan signal line in the pixel circuit in the i-th partition, the odd-numbered reset driving circuit is electrically connected with the first reset clock signal line G3_CLK1 and the second reset clock signal line G3_CLK2, and the even-numbered reset driving circuit is electrically connected with the third reset clock signal line G3_CLK3 and the fourth reset clock signal line G3_CLK4, and/or the odd-numbered reset driving circuit is electrically connected with the first reset clock signal line G3_CLK1 and the second reset clock signal line G3_CLK2, and the even-numbered reset driving circuit is electrically connected with the third reset clock signal line G3_CLK3 and the fourth reset clock signal line G3_CLK4, the structure of the driving circuit group located in the non-display area can be simplified and a narrow bezel can be realized.

In some exemplary embodiments, as shown in FIG. 6, the first partition includes pixel circuits of a first row R (1) to pixel circuits of an $N_1$-th row R ($N_1$), a j-th partition includes: pixel circuits of an ($N_{j-1}$+1)-th row R ($N_{j-1}$+1) to pixel circuits of an $N_j$-th row R ($N_j$), where j=2, ..., M.

In some exemplary embodiments, as shown in FIG. 7, the light emitting driving circuit includes light emitting shift registers, a light emitting shift register includes a cascaded signal output terminal, a signal input terminal, a first signal output terminal, a second signal output terminal, a third signal output terminal, and a fourth signal output terminal.

In some exemplary embodiments, as shown in FIG. 7, a first light emitting driving circuit EM GOA_1 includes $N_1/4$ cascaded light emitting shift registers EM GOA_1 (1) to EM GOA_1 ($N_1/4$). A cascaded signal output terminal of a light emitting shift register of an x-th stage is connected with a signal input terminal of a light emitting shift register of an (x+1)-th stage in the first light emitting driving circuit; and a first signal output terminal, a second signal output terminal, a third signal output terminal and a fourth signal output terminal of the light emitting shift register EM GOA_1 (x) of the x-th stage in the first light emitting driving circuit are respectively connected with a light emitting signal line Em_4x−3 of pixel circuits in a (4x−3)-th row, a light emitting signal line Em_4x−2 of pixel circuits in a (4x−2)-th row, a light emitting signal line Em_4x−1 of pixel circuits in a (4x−1)-th row, and a light emitting signal line Em_4x of pixel circuits in a 4x-th row, where x=1, 2, ..., $N_1/4$.

In some exemplary embodiments, as shown in FIG. 7, a j-th light emitting driving circuit EM GOA_j includes: $(N_j-N_{j-1})/4$ cascaded light emitting shift registers EM GOA_j (1) to EM GOA_j ($(N_j-N_{j-1})/4$). A cascaded signal output terminal of a light emitting shift register of a y-th stage is connected with a signal input terminal of a light emitting shift register of a (y+1)-th stage in the j-th light emitting driving circuit, and a first signal output terminal, a second signal output terminal, a third signal output terminal and a fourth signal output terminal of a light emitting shift register EM GOA_j (y) of the y-th stage in the j-th light emitting driving circuit is respectively connected with a light emitting signal line EM_$N_{j-1}$+4y−3 of pixel circuits in an ($N_{j-1}$+4y−3)-th row, a light emitting signal line EM_$N_{j-1}$+4y−2 of pixel circuits in an ($N_{j-1}$+4y−2)-th row, a light emitting signal line EM_$N_{j-1}$+4y−1 of pixel circuits in an ($N_{j-1}$+4y−1)-th row, a light emitting signal line EM_$N_{j-1}$+4y of pixel circuits in an ($N_{j-1}$+4y)-th row, where y=1, 2, ..., $(N_j-N_{j-1})/4$.

In some exemplary embodiments, as shown in FIG. 7, the light emitting shift register further includes a first clock signal terminal and a second clock signal terminal.

A first clock signal terminal in a light emitting shift register in an odd-numbered light emitting driving circuit is connected with one of the first light emitting clock signal line EM_CLK1 and the second light emitting clock signal line EM_CLK2, a second clock signal terminal in the light emitting shift register in the odd-numbered light emitting driving circuit is connected with the other of the first light emitting clock signal line EM_CLK1 and the second light emitting clock signal line EM_CLK2, and first clock signal terminals in adjacent light emitting shift registers are connected with different light emitting clock signal lines.

A first clock signal terminal in a light emitting shift register in an even-numbered light emitting driving circuit is connected with one of the third light emitting clock signal line EM_CLK3 and the fourth light emitting clock signal line EM_CLK4, a second clock signal terminal in the light emitting shift register in the even-numbered light emitting driving circuit is connected with the other of the third light emitting clock signal line EM_CLK3 and the fourth light emitting clock signal line EM_CLK4, and first clock signal terminals CKA in adjacent light emitting shift registers are connected with different light emitting clock signal lines.

In some exemplary embodiments, as shown in FIG. 8, the control driving circuit includes control shift registers, wherein a control shift register includes a cascaded signal output terminal OUTCR, a signal input terminal IN, a first signal output terminal, a second signal output terminal, a third signal output terminal and a fourth signal output terminal.

In some exemplary embodiments, as shown in FIG. 8, the first control driving circuit G2 GOA_1 includes $N_1/4$ cascaded control shift registers G2 GOA_1 (1) to G2 GOA_1 ($N_1/4$). A cascaded signal output terminal of a control shift register of an x-th stage is connected with a signal input terminal of a control shift register of an (x+1)-th stage in the first control driving circuit. A first signal output terminal, a second signal output terminal, a third signal output terminal and a fourth signal output terminal of the control shift register G2 GOA_1 (x) of the x-th stage in the first control driving circuit are respectively connected with a second scan signal line G2_4x−3 of pixel circuits in a (4x−3)-th row, a second scan signal line G2_4x−2 of pixel circuits in a (4x−2)-th row, a second scan signal line G2_4x−1 of pixel circuits in a (4x−1)-th row and a second scan signal line G2_4x of pixel circuits in a 4x-th row, where x=1, 2, ..., $N_1/4$.

In some exemplary embodiments, as shown in FIG. 8, a j-th control driving circuit G2 GOA_j includes: $(N_j-N_{j-1})/4$ cascaded control shift registers G2 GOA_j (1) to G2 GOA_j ($(N_j-N_{j-1})/4$). A cascaded signal output terminal OUTCR of a control shift register of a y-th stage is connected with a signal input terminal IN of a control shift register of a (y+1)-th stage in the j-th control driving circuit, and a first signal output terminal, a second signal output terminal, a third signal output terminal and a fourth signal output terminal of a control shift register G2 GOA_j (y) of the y-th stage in the j-th control driving circuit are respectively connected with a second scan signal line G2_$N_{j-1}$+4y−3 of pixel circuits in an ($N_{j-1}$+4y−3)-th row, a second scan signal line G2_$N_{j-1}$+4y−2 of pixel circuits in an ($N_{j-1}$+4y−2)-th row, a second scan signal line G2_$N_{j-1}$+4y−1 of pixel circuits in an ($N_{j-1}$+4y−1)-th row, and a second scan signal line G2_$N_{j-1}$+4y of pixel circuits in an ($N_{j-1}$+4y)-th row, where y=1, 2, ..., $(N_j-N_{j-1})/4$.

In some exemplary embodiments, as shown in FIG. 8, the control shift register further includes a first clock signal terminal and a second clock signal terminal.

A first clock signal terminal in a control shift register in an odd-numbered control driving circuit is connected with one of the first control clock signal line G2_CLK1 and the second control clock signal line G2_CLK2, a second clock signal terminal in the control shift register in the odd-numbered control driving circuit is connected with the other of the first control clock signal line G2_CLK1 and the second control clock signal line G2_CLK2, first clock signal terminals CKA in adjacent control shift registers are connected with different control clock signal lines.

A first clock signal terminal CKA in a control shift register in an even-numbered control driving circuit is connected with one of the third control clock signal line G2_CLK3 and the fourth control clock signal line G2_CLK4, a second clock signal terminal in the control shift register in the even-numbered control driving circuit is connected with the other of the third control clock signal line G2_CLK3 and the fourth control clock signal line G2_CLK4, and first clock signal terminals CKA in adjacent control shift registers are connected with different control clock signal lines.

In some exemplary embodiments, as shown in FIG. 9, the reset driving circuit includes reset shift registers, wherein a reset shift register includes a cascaded signal output terminal, a signal input terminal, a first signal output terminal, a second signal output terminal, a third signal output terminal and a fourth signal output terminal.

In some exemplary embodiments, as shown in FIG. 9, a first reset driving circuit G3 GOA_1 includes $N_1/4$ cascaded reset shift registers G3 GOA_1 (1) to G3 GOA_1 ($N_1/4$). A cascaded signal output terminal OUTCR of a reset shift register of an x-th stage is connected with a signal input terminal IN of a reset shift register of an (x+1)-th stage in the first reset driving circuit. A first signal output terminal OUT1, a second signal output terminal OUT2, a third signal output terminal OUT3 and a fourth signal output terminal OUT4 of the reset shift register of the x-th stage G3 GOA_1 (x) in the first reset driving circuit are respectively connected with a third scan signal line G3_4x−3 of pixel circuits in a (4x−3)-th row, a third scan signal line G3_4x−2 of pixel circuits in a (4x−2)-th row, a third scan signal line G3_4x−1 of pixel circuits in a (4x−1)-th row, and a third scan signal line G3_4x of pixel circuits in a 4x-th row, where x= 1, 2, . . . , $N_1/4$.

In some exemplary embodiments, as shown in FIG. 9, a j-th reset driving circuit G3 GOA_j includes: $(N_j−N_{j−1})/4$ cascaded reset shift registers G3 GOA_j (1) to G3 GOA_j $((N_j−N_{j−1})/4)$. A cascaded signal output terminal OUTCR of a reset shift register of a y-th stage is connected with a signal input terminal IN of a reset shift register of a (y+1)-th stage in the j-th reset driving circuit. A first signal output terminal OUT1, a second signal output terminal OUT2, a third signal output terminal OUT3 and a fourth signal output terminal OUT4 of a reset shift register G3 GOA_j (y) of the y-th stage in the j-th reset driving circuit are respectively connected with a third scan signal line G3_$N_{j−1}$+4y−3 of pixel circuits in an ($N_{j−1}$+4y−3)-th row, a third scan signal line G3_$N_{j−1}$+4y−2 of pixel circuits in an ($N_{j−1}$+4y−2)-th row, a third scan signal line G3_$N_{j−1}$+4y−1 of pixel circuits in an ($N_{j−1}$+4y−1)-th row, a third scan signal line G3_$N_{j−1}$+4y of pixel circuits in an ($N_{j−1}$+4y)-th row, where y=1, 2, . . . , $(N_j−N_{j−1})/4$.

In some exemplary embodiments, the reset shift register further includes a first clock signal terminal and a second clock signal terminal.

A first clock signal terminal CKA in a reset shift register in an odd-numbered reset driving circuit is connected with one of the first reset clock signal line G3_CLK1 and the second reset clock signal line G3_CLK2, a second clock signal terminal in the reset shift register in the odd-numbered reset driving circuit is connected with the other of the first reset clock signal line G3_CLK1 and the second reset clock signal line G3_CLK2, and first clock signal terminals CKA in adjacent reset shift registers are connected with different reset clock signal lines.

A first clock signal terminal CKA in a reset shift register in an even-numbered reset driving circuit is connected with one of the third reset clock signal line G3_CLK3 and the fourth reset clock signal line G3_CLK4, a second clock signal terminal in the reset shift register in the even-numbered reset driving circuit is connected with the other of the third reset clock signal line G3_CLK3 and the fourth reset clock signal line G3_CLK4, and first clock signal terminals CKA in adjacent reset shift registers are connected with different reset clock signal lines.

Figure 10:
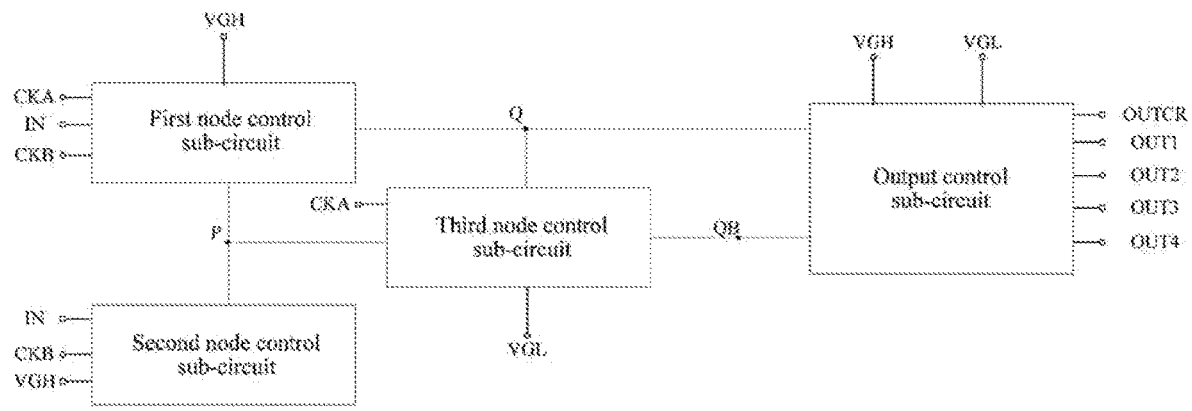
FIG. 10 is a first schematic diagram of a structure of a shift register according to an exemplary embodiment.
Figure 11:
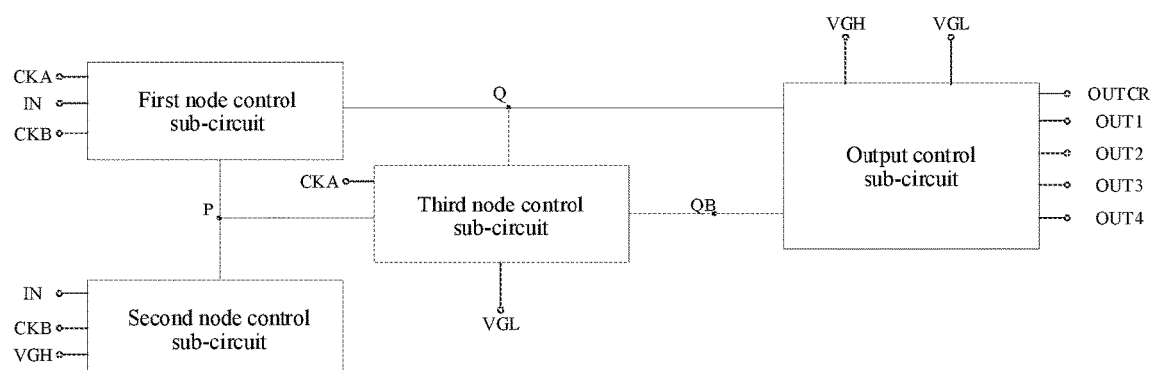
FIG. 11 is a second schematic diagram of a structure of a shift register according to an exemplary embodiment.

FIG. 10 is a first schematic diagram of a structure of a shift register provided by an exemplary embodiment, and FIG. 11 is a second schematic diagram of a structure of a shift register provided by an exemplary embodiment. As shown in FIGS. 10 and 11, the shift register includes a first node control sub-circuit, a second node control sub-circuit, a third node control sub-circuit, and an output control sub-circuit, and the shift register includes a light emitting shift register, a control shift register, and a reset shift register.

As shown in FIG. 10, the first node control sub-circuit is electrically connected to the first clock signal terminal CKA, the second clock signal terminal CKB, the first power supply terminal VDD, the signal input terminal IN, the first node Q, and the second node P, respectively, and is configured to provide a signal of the first power supply terminal VDD or the second clock signal terminal CKB to the first node Q under control of the first clock signal terminal CKA, the signal input terminal IN and the second node P.

As shown in FIG. 11, the first node control sub-circuit may be electrically connected to the first clock signal terminal CKA, the second clock signal terminal CKB, the signal input terminal IN, the first node Q and the second node P, respectively, and is configured to provide a signal of the first clock signal terminal CKA or the second clock signal terminal CKB to the first node Q under control of the first clock signal terminal CKA, the signal input terminal IN and the second node P.

As shown in FIGS. 10 and 11, the second node control sub-circuit is electrically connected to the second clock signal terminal CKB, the first power supply terminal VDD, the signal input terminal IN and the second node P, respectively, and is configured to provide a signal of the first power supply terminal VDD or the second clock signal terminal CKB to the second node P under control of the signal input terminal IN and the second clock signal terminal CKB.

As shown in FIGS. 10 and 11, the third node control sub-circuit is electrically connected to the first node Q, the second node P, the third node QB and the first clock signal terminal CKA, respectively, and is configured to provide a signal of the first clock signal terminal CKA or the second power supply terminal VGL to the third node QB under control of the first clock signal terminal CKA, the first node Q and the second node P.

As shown in FIGS. 10 and 11, the output control sub-circuit is electrically connected with the first node Q, the third node QB, the first power supply terminal VDD, the second power supply terminal VGL, the cascaded signal output terminal OUTCR, the first signal output terminal OUT1, the second signal output terminal OUT2, the third signal output terminal OUT3 and the fourth signal output terminal OUT4 respectively, and is configured to provide a signal of the first power supply terminal VDD or the second power supply terminal VGL to the cascaded signal output terminal OUTCR, the first signal output terminal OUT1, the second signal output terminal OUT2, the third signal output terminal OUT3 and the fourth signal output terminal OUT4 under control of the first node Q, the third node QB and the first power supply terminal VDD.

Figure 12:
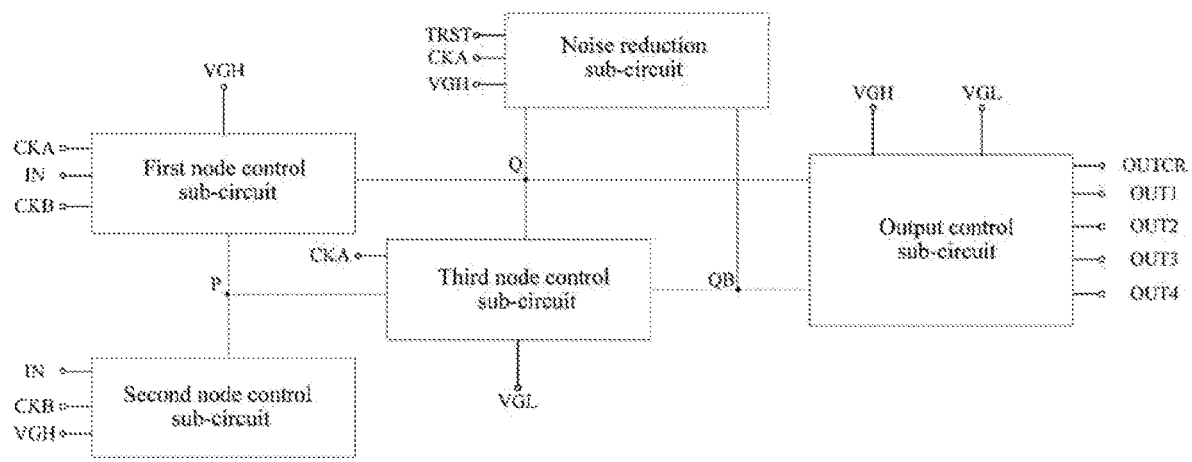
FIG. 12 is a third schematic diagram of a structure of a shift register according to an exemplary embodiment.
Figure 13:
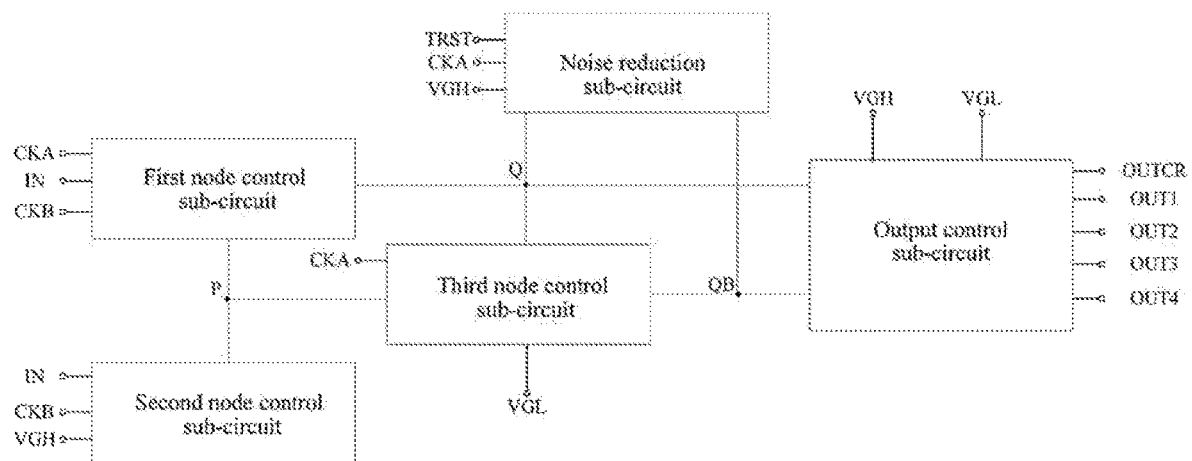
FIG. 13 is a fourth schematic diagram of a structure of a shift register according to an exemplary embodiment.

FIG. 12 is a third schematic diagram of a structure of a shift register provided by an exemplary embodiment, and FIG. 13 is a fourth schematic diagram of a structure of a shift register provided by an exemplary embodiment. The shift register also includes a noise reduction sub-circuit. The noise reduction sub-circuit is electrically connected with a noise reduction signal terminal TRST, the first clock signal terminal CKA, the first power supply terminal VDD, the first node Q and the third node QB, respectively, and is configured to provide a signal of the first clock signal terminal CKA to the first node Q and a signal of the first power supply terminal VDD to the third node QB under control of the noise reduction signal terminal TRST. FIG. 12 is illustrated by an example in which the first node control sub-circuit is electrically connected to the first clock signal terminal CKA, the second clock signal terminal CKB, the first power supply terminal VDD, the signal input terminal IN, the first node Q, and the second node P, respectively. FIG. 13 is illustrated by an example in which the first node control sub-circuit may be electrically connected to the first clock signal terminal CKA, the second clock signal terminal CKB, the signal input terminal IN, the first node Q, and the second node P, respectively.

In the present disclosure, by providing the noise reduction sub-circuit, the cascaded signal output terminal of the shift register may be maintained and the signals of the first signal output terminal to the fourth signal output terminal can be pulled down, thus avoiding incorrect output and improving the reliability of the shift register.

Figure 14:
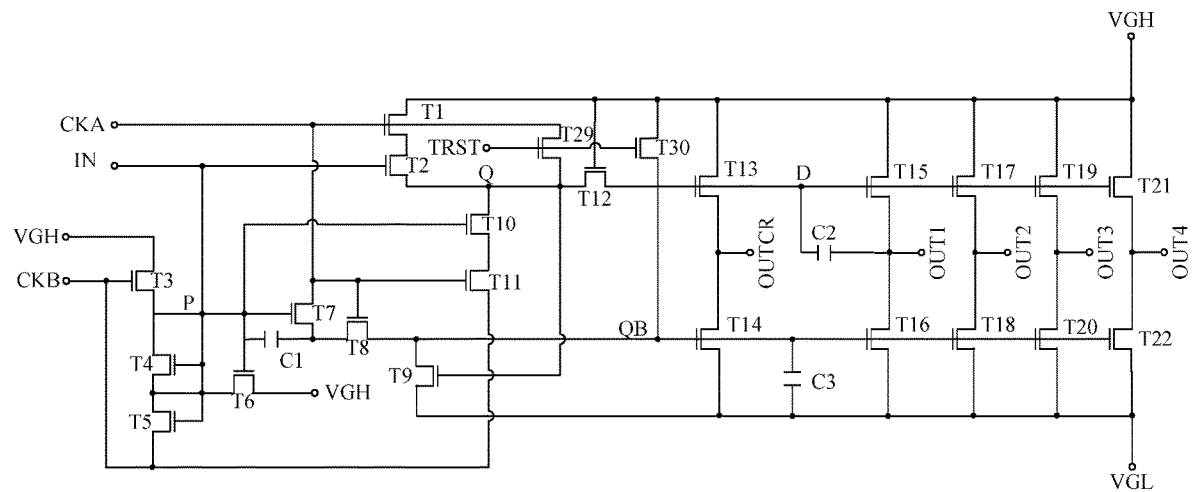
FIG. 14 is a first equivalent circuit diagram of a shift register.
Figure 15:
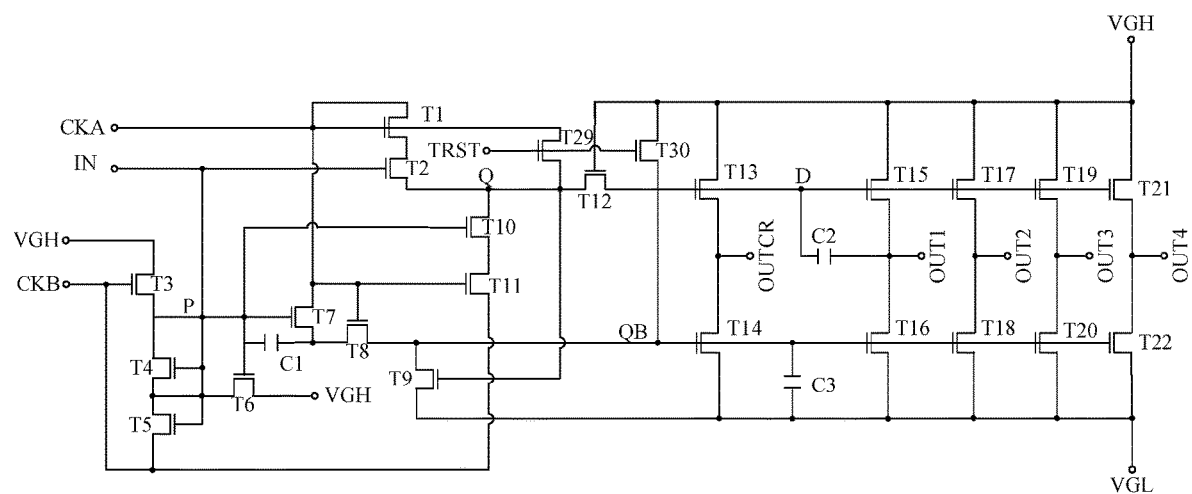
FIG. 15 is a second equivalent circuit diagram of a shift register.
Figure 16:
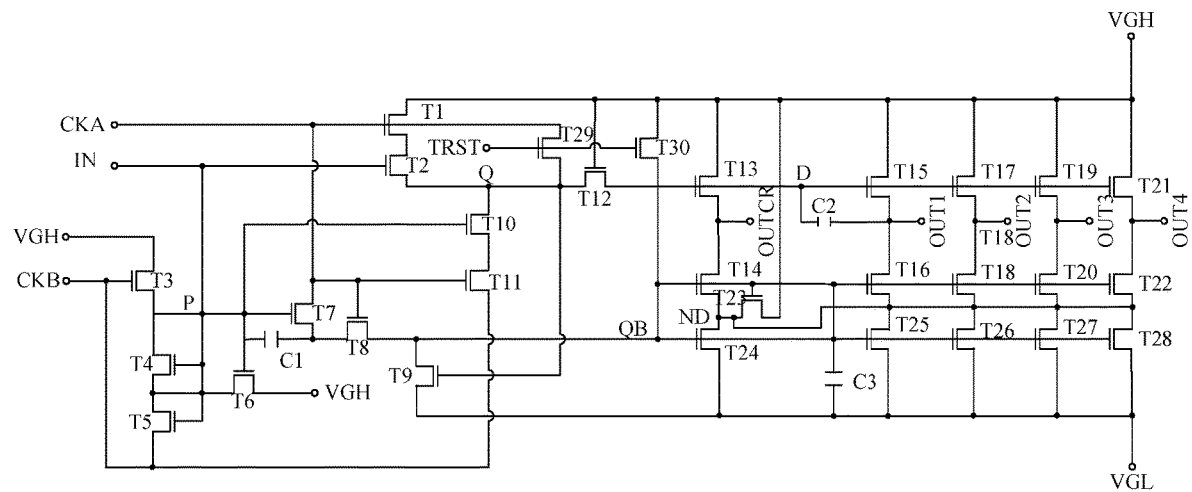
FIG. 16 is a third equivalent circuit diagram of a shift register.
Figure 17:
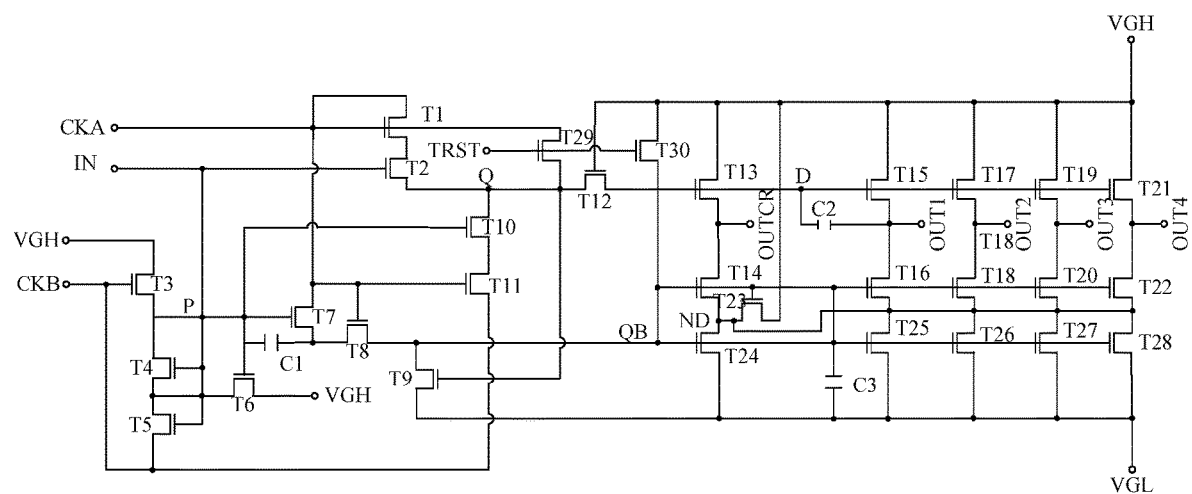
FIG. 17 is a fourth equivalent circuit diagram of a shift register.

FIG. 14 is a first equivalent circuit diagram of a shift register, FIG. 15 is a second equivalent circuit diagram of a shift register, FIG. 16 is a third equivalent circuit diagram of a shift register, and FIG. 17 is a fourth equivalent circuit diagram of a shift register. FIG. 14 and FIG. 16 are illustrated by an example in which the first node control sub-circuit is electrically connected to the first clock signal terminal CKA, the second clock signal terminal CKB, the first power supply terminal VDD, the signal input terminal IN, the first node Q, and the second node P, respectively. FIG. 15 and FIG. 17 are illustrated by an example in which the first node control sub-circuit may be electrically connected to the first clock signal terminal CKA, the second clock signal terminal CKB, the signal input terminal IN, the first node Q, and the second node P, respectively.

In some exemplary embodiments, as shown in FIGS. 14 and 16, the first node control sub-circuit may include a first transistor T1, a second transistor T2, a tenth transistor T10, and an eleventh transistor T11. A control electrode of the first transistor T1 is electrically connected with the first clock signal terminal CKA, a first electrode of the first transistor T1 is electrically connected with the first power supply terminal VDD, and a second electrode of the first transistor T1 is electrically connected with a first electrode of the second transistor T2. A control electrode of the second transistor T2 is electrically connected with the signal input terminal IN, and a second electrode of the second transistor T2 is electrically connected with the first node Q. A control electrode of the tenth transistor T10 is electrically connected with the second node P, a first electrode of the tenth transistor T10 is electrically connected with the first node Q, and a second electrode of the tenth transistor T10 is electrically connected with a first electrode of the eleventh transistor T11. A control electrode of the eleventh transistor T11 is electrically connected with the first clock signal terminal CKA, and a second electrode of the eleventh transistor T11 is electrically connected with the second clock signal terminal CKB.

In some exemplary embodiments, as shown in FIGS. 15 and 17, the first node control sub-circuit may include a first transistor T1, a second transistor T2, a tenth transistor T10, and an eleventh transistor T11. A control electrode and a first electrode of the first transistor T1 are electrically connected with the first clock signal terminal CKA, and a second electrode of the first transistor T1 is electrically connected with a first electrode of the second transistor T2. A control electrode of the second transistor T2 is electrically connected with the signal input terminal IN, and a second electrode of the second transistor T2 is electrically connected with the first node Q. A control electrode of the tenth transistor T10 is electrically connected with the second node P, a first electrode of the tenth transistor T10 is electrically connected with the first node Q, and a second electrode of the tenth transistor T10 is electrically connected with a first electrode of the eleventh transistor T11. A control electrode of the eleventh transistor T11 is electrically connected with the first clock signal terminal CKA, and a second electrode of the eleventh transistor T11 is electrically connected with the second clock signal terminal CKB.

Two exemplary structures of the first node control sub-circuit are shown in FIGS. 14 to 17. It is easy for those skilled in the art to understand that the implementation of the first node control sub-circuit is not limited thereto.

In some exemplary embodiments, as shown in FIGS. 14 to 17, the second node control sub-circuit may include a third transistor T3, a fourth transistor T4, a fifth transistor T5, and a sixth transistor T6. A control electrode of the third transistor T3 is electrically connected with the second clock signal terminal CKB, a first electrode of the third transistor T3 is electrically connected with the first power supply terminal VDD, and a second electrode of the third transistor T3 is electrically connected with the second node P. A control electrode of the fourth transistor T4 is electrically connected with the signal input terminal IN, a first electrode of the fourth transistor T4 is electrically connected with the second node P, and a second electrode of the fourth transistor T4 is electrically connected with a first electrode of the fifth transistor T5. A control electrode of the fifth transistor T5 is electrically connected with the signal input terminal IN, and a second electrode of the fifth transistor T5 is electrically connected with the second clock signal terminal CKB. A control electrode of the sixth transistor T6 is electrically connected with the second node P, a first electrode of the sixth transistor T6 is electrically connected with the first power supply terminal VDD, and a second electrode of the sixth transistor T6 is electrically connected with the second electrode of the fourth transistor T4.

Two exemplary structures of the second node control sub-circuit are shown in FIGS. 14 to 17. It is easy for those skilled in the art to understand that the implementation of the second node control sub-circuit is not limited thereto.

In some exemplary embodiments, shown in FIGS. 14 to 17, the third node control sub-circuit includes a seventh transistor T7, an eighth transistor T8, a ninth transistor T9, and a first capacitor C1. A control electrode of the seventh transistor T7 is electrically connected with the second node P, a first electrode of the seventh transistor T7 is electrically connected with the first clock signal terminal CKA, and a second electrode of the seventh transistor T7 is electrically connected with a first electrode of the eighth transistor T8. A control electrode of the eighth transistor T8 is electrically connected with the first clock signal terminal CKA, and the second electrode of the eighth transistor T8 is electrically connected with the third node QB. A control electrode of the ninth transistor T9 is electrically connected with the first node Q, a first electrode of the ninth transistor T9 is electrically connected with the third node QB, and a second electrode of the ninth transistor T9 is electrically connected with the second power supply terminal VGL. A first terminal of the first capacitor C1 is electrically connected with the second node P, and a second terminal of the first capacitor C1 is electrically connected with the second electrode of the seventh transistor T7.

Two exemplary structures of the third node control sub-circuit are shown in FIGS. 14 to 17. It is easy for those skilled in the art to understand that the implementation of the third control sub-circuit is not limited thereto.

In some exemplary embodiments, shown in FIGS. 14 and 15, the output control sub-circuit includes a twelfth transistor T12 to a twenty-second transistor T22, a second capacitor C2 and a third capacitor C3. A control electrode of the twelfth transistor T12 is electrically connected with the first power supply terminal VDD, a first electrode of the twelfth transistor T12 is electrically connected with the first node Q, and a second electrode of the twelfth transistor T12 is electrically connected with the fourth node D. A control electrode of the thirteenth transistor T13 is electrically connected with the fourth node D, a first electrode of the thirteenth transistor T13 is electrically connected with the first power supply terminal VDD, and a second electrode of the thirteenth transistor T13 is electrically connected with the cascaded signal output terminal OUTCR. A control electrode of the fourteenth transistor T14 is electrically connected with the third node QB, a first electrode of the fourteenth transistor T14 is electrically connected with the second power supply terminal VGL, and a second electrode of the fourteenth transistor T14 is electrically connected with the cascaded signal output terminal OUTCR. A control electrode of the fifteenth transistor T15 is electrically connected with the fourth node D, a first electrode of the fifteenth transistor T15 is electrically connected with the first power supply terminal VDD, and a second electrode of the fifteenth transistor T15 is electrically connected with the first signal output terminal OUT1. A control electrode of the sixteenth transistor T16 is electrically connected with the third node QB, a first electrode of the sixteenth transistor T16 is electrically connected with the second power supply terminal VGL, and a second electrode of the sixteenth transistor T16 is electrically connected with the first signal output terminal OUT1. A control electrode of the seventeenth transistor T17 is electrically connected with the fourth node D, a first electrode of the seventeenth transistor T17 is electrically connected with the first power supply terminal VDD, and a second electrode of the seventeenth transistor T17 is electrically connected with the second signal output terminal OUT2. A control electrode of the eighteenth transistor T18 is electrically connected with the third node QB, a first electrode of the eighteenth transistor T18 is electrically connected with the second power supply terminal VGL, and a second electrode of the eighteenth transistor T18 is electrically connected with the second signal output terminal OUT2. A control electrode of the nineteenth transistor T19 is electrically connected with the fourth node D, a first electrode of the nineteenth transistor T19 is electrically connected with the first power supply terminal VDD, and a second electrode of the nineteenth transistor T19 is electrically connected with the third signal output terminal OUT3. A control electrode of the twentieth transistor T20 is electrically connected with the third node QB, a first electrode of the twentieth transistor T20 is electrically connected with the second power supply terminal VGL, and a second electrode of the twentieth transistor T20 is electrically connected with the third signal output terminal OUT3. A control electrode of the twenty-first transistor T21 is electrically connected with the fourth node D, a first electrode of the twenty-first transistor T21 is electrically connected with the first power supply terminal VDD, and a second electrode of the twenty-first transistor T21 is electrically connected with the fourth signal output terminal OUT4. A control electrode of the twenty-second transistor T22 is electrically connected with the third node QB, a first electrode of the twenty-second transistor T22 is electrically connected with the second power supply terminal VGL, and a second electrode of the twenty-second transistor T22 is electrically connected with the fourth signal output terminal OUT4. A first terminal of the second capacitor C2 is electrically connected with the fourth node D, and a second terminal of the second capacitor C2 is electrically connected with the first signal output terminal OUT1. A first terminal of the third capacitor C3 is electrically connected with the third node QB, and a second terminal of the third capacitor C3 is electrically connected with the second power supply terminal VGL.

In some exemplary embodiments, shown in FIGS. 16 and 17, the output control sub-circuit includes a twelfth transistor T12 to a twenty-eighth transistor T28, a second capacitor C2 and a third capacitor C3. A control electrode of the twelfth transistor T12 is electrically connected to the first power supply terminal VDD, a first electrode of the twelfth transistor T12 is electrically connected to the first node Q, and a second electrode of the twelfth transistor T12 is electrically connected to the fourth node D. A control electrode of the thirteenth transistor T13 is electrically connected to the fourth node D, a first electrode of the thirteenth transistor T13 is electrically connected to the first power supply terminal VDD, and a second electrode of the thirteenth transistor T13 is electrically connected to the cascaded signal output terminal OUTCR. A control electrode of the fourteenth transistor T14 is electrically connected to the third node QB, a first electrode of the fourteenth transistor T14 is electrically connected to the fifth node ND, and a second electrode of the fourteenth transistor T14 is electrically connected to the cascaded signal output terminal OUTCR. A control electrode of the fifteenth transistor T15 is electrically connected to the fourth node D, a first electrode of the fifteenth transistor T15 is electrically connected to the first power supply terminal VDD, and a second electrode of the fifteenth transistor T15 is electrically connected to the first signal output terminal OUT1. A control electrode of the sixteenth transistor T16 is electrically connected to the third node QB, a first electrode of the sixteenth transistor T16 is electrically connected to the fifth node ND, and a second electrode of the sixteenth transistor T16 is electrically connected to the first signal output terminal OUT1. A control electrode of the seventeenth transistor T17 is electrically connected to the fourth node D, a first electrode of the seventeenth transistor T17 is electrically connected to the first power supply terminal VDD, and a second electrode of the seventeenth transistor T17 is electrically connected to the second signal output terminal OUT2. A control electrode of the eighteenth transistor T18 is electrically connected to the third node QB, a first electrode of the eighteenth transistor T18 is electrically connected to the fifth node ND, and a second electrode of the eighteenth transistor T18 is electrically connected to the second signal output terminal OUT2. A control electrode of the nineteenth transistor T19 is electrically connected to the fourth node D, a first electrode of the nineteenth transistor T19 is electrically connected to the first power supply terminal VDD, and a second electrode of the nineteenth transistor T19 is electrically connected to the third signal output terminal OUT3. A control electrode of the twentieth transistor T20 is electrically connected to the third node QB, a first electrode of the twentieth transistor T20 is electrically connected to the fifth node ND, and a second electrode of the twentieth transistor T20 is electrically connected to the third signal output terminal OUT3. A control electrode of the twenty-first transistor T21 is electrically connected to the fourth node D, a first electrode of the twenty-first transistor T21 is electrically connected to the first power supply terminal VDD, and a second electrode of the twenty-first transistor T21 is electrically connected to the fourth signal output terminal OUT4. A control electrode of the twenty-second transistor T22 is electrically connected to the third node QB, a first electrode of the twenty-second transistor T22 is electrically connected to the fifth node ND, and a second electrode of the twenty-second transistor T22 is electrically connected to the fourth signal output terminal OUT4. A control electrode of the twenty-third transistor T23 is electrically connected to the third node QB, a first electrode of the twenty-second transistor T22 is electrically connected to the second power supply terminal VGL, and a second electrode of the twenty-second transistor T22 is electrically connected to the fifth node ND. A control electrode of the twenty-fourth transistor T24 is electrically connected to the third node QB, a first electrode of the twenty-fourth transistor T24 is electrically connected to the second power supply terminal VGL, and a second electrode of the twenty-second transistor T22 is electrically connected to the fifth node ND. A control electrode of the twenty-fifth transistor T25 is electrically connected to the third node QB, a first electrode of the twenty-fifth transistor T25 is electrically connected to the second power supply terminal VGL, and a second electrode of the twenty-fifth transistor T25 is electrically connected to the fifth node ND. A control electrode of the twenty-sixth transistor T26 is electrically connected to the third node QB, a first electrode of the twenty-sixth transistor T26 is electrically connected to the second power supply terminal VGL, and a second electrode of the twenty-sixth transistor T26 is electrically connected to the fifth node ND. A control electrode of the twenty-seventh transistor T27 is electrically connected to the third node QB, the first electrode of the twenty-seventh transistor T27 is electrically connected to a second power supply terminal VGL, and a second electrode of the twenty-seventh transistor T27 is electrically connected to the fifth node ND. A control electrode of the twenty-eighth transistor T28 is electrically connected to the third node QB, a first electrode of the twenty-eighth transistor T28 is electrically connected to the second power supply terminal VGL, and a second electrode of the twenty-eighth transistor T28 is electrically connected to the fifth node ND. A first terminal of the second capacitor C2 is electrically connected with the fourth node D, and a second terminal of the second capacitor C2 is electrically connected with the first signal output terminal OUT1. A first terminal of the third capacitor C3 is electrically connected to the third node QB, and a second terminal of the third capacitor C3 is electrically connected to the second power supply terminal VGL.

Two exemplary structures of the output control sub-circuit are shown in FIGS. 14 to 17. It is easy for those skilled in the art to understand that the implementation of the output control sub-circuit is not limited thereto.

In some exemplary embodiments, as shown in FIGS. 14 to 17, the noise reduction sub-circuit may include a twenty-ninth transistor T29 and a thirtieth transistor T30. A control electrode of the twenty-ninth transistor T29 is electrically connected with the noise reduction signal terminal TRST, and a first electrode of the twenty-ninth transistor T29 is electrically connected to the first clock signal terminal CKA, and a second electrode of the twenty-ninth transistor T29 is electrically connected to the first node Q. A control electrode of the thirtieth transistor T30 is electrically connected to the noise reduction signal terminal TRST, a first electrode of the thirtieth transistor T30 is electrically connected to the first power supply terminal VDD, and a second electrode of the thirtieth transistor T30 is electrically connected to the third node QB.

Two exemplary structures of the noise reduction sub-circuit are shown in FIGS. 14 to 17. It is easy for those skilled in the art to understand that the implementation of the noise reduction sub-circuit is not limited thereto.

In an exemplary embodiment, the noise reduction signal terminal TRST is an effective level signal before all shift registers start working, so that the signal of the first node Q is a low level signal and the signal of the third node Q3 is a high level signal.

A difference between FIG. 14 and FIG. 15 as well as a difference between FIG. 16 and FIG. 17 lie in different manners of connection of the first electrode of the first transistor. When the first electrode of the first transistor is electrically connected to the first clock signal line, a narrow bezel design of a display substrate with a medium-large size is more facilitated.

In an exemplary embodiment, the transistor may be divided into an N-type transistor or a P-type transistor according to its characteristics. When the transistor is a P-type transistor, its turn-on voltage is a low-level voltage (e.g., 0V, −5V, −10V or other suitable voltages) and its turn-off voltage is a high-level voltage (e.g., 5V, 10V or other suitable voltages). When the transistor is an N-type transistor, its turn-on voltage is a high-level voltage (e.g., 5V, 10V or other suitable voltages) and its turn-off voltage is a low-level voltage (e.g., 0V, −5V, −10V or other suitable voltages).

In an exemplary embodiment, the first transistor T1 to the thirtieth transistor T30 may be P-type transistors, or may be N-type transistors. Using a same type of transistors in the pixel circuit may simplify a process flow, reduce process difficulties of a display panel, and improve a yield of products. In some possible implementations, the first transistor T1 to the seventh transistor T5 may include P-type transistor(s) and N-type transistor(s).

In some exemplary embodiments, the transistor may be an oxide transistor when the transistor is an N-type transistor. The oxide transistor can reduce a leakage current, improve the performance of the shift register, and reduce the power consumption of the shift register.

Figure 18:
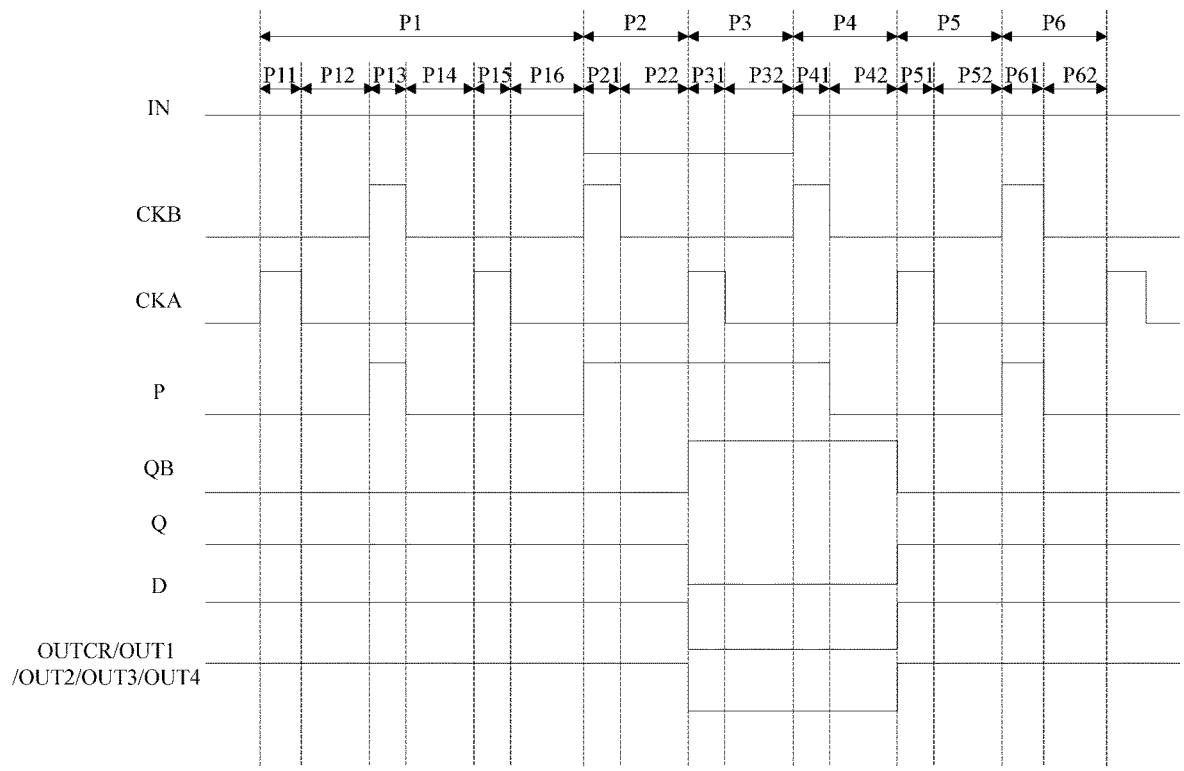
FIG. 18 is a working timing diagram of the shift register provided in FIG. 14 to FIG. 17.

FIG. 18 is a working timing diagram of the shift register provided in FIG. 14 to FIG. 17. FIG. 18 is illustrated by an example in which all transistors in the shift register are N-type transistors.

In the shift registers shown in FIGS. 14 to 17, the twelfth transistor T12 is continuously turned on under the control of the first power supply terminal VGH.

The working process of a plurality of transistors and a plurality of capacitors in the shift register provided in FIG. 14 during a first stage P1 to a sixth stage P6 is described in detail below in conjunction with FIG. 14 and FIG. 18.

In the first stage P1, a signal of the signal input terminal IN is a high-level signal, and the second transistor T2, the fourth transistor T4 and the fifth transistor T5 are turned on. According to the signals of the first clock signal terminal CKA and the second clock signal terminal CKB, the first stage P1 may include the following four sub-stages.

In a first sub-stage P11, a signal of the first clock signal terminal CKA is a high-level signal, and a signal of the second clock signal terminal CKB is a low-level signal. Since the signal of the second clock signal terminal CKB is a low-level signal, the third transistor T3 is turned off, and the signal of the first power supply terminal VGH cannot be written into the second node P, and since the fourth transistor T4 and the fifth transistor T5 are turned on, the low-level signal of the second clock signal terminal CKB is written into the second node P, and the signal of the second node P is a low-level signal, thus the sixth transistor T6, the seventh transistor T7 and the tenth transistor T10 are turned off. Since the signal of the first clock signal terminal CKA is a high level signal, the first transistor T1, the eighth transistor T8 and the eleventh transistor T11 are turned on. Since the second transistor T2 is also turned on, the high level signal of the first power supply terminal VGH is written into the first node Q, the signal of the first node Q is a high level signal, the ninth transistor T9 is turned on, the signal of the third node QB is pulled down by the low level signal of the second power supply terminal VGL, the signal of the third node QB is a low level signal, the fourteenth transistor T14, the sixteenth transistor T16, the eighteenth transistor T18, the twentieth transistor T20 and the twenty-second transistor T22 are all turned off. The signals of the cascaded output terminal and the four signal output terminal are not pulled down by the low level signal of the second power supply terminal VGL, since the twelfth transistor T12 is turned on, the signal of the fourth node D is a high level signal, the thirteenth transistor T13, the fifteenth transistor T15, the seventeenth transistor T17, the nineteenth transistor T19 and the twenty-first transistor T21 are all turned on, and the signals of the cascaded output terminal OUTCR and the four signal output terminals OUT1 to OUT4 are all high level signals. In this stage, the signals of the second node P and the third node QB are low-level signals, the signals of the first node Q and the fourth node D are high-level signals, and the signals of the cascaded output terminal OUTCR and the four signal output terminals OUT1 to OUT4 are all high-level signals.

In a second sub-stage P12, the signals of the first clock signal terminal CKA and the second clock signal terminal CKB are low-level signals. Since the signal of the second clock signal terminal CKB is a low-level signal, the third transistor T3 is turned off, and the high-level signal of the first power supply terminal VGH cannot be written into the second node P. Since the fourth transistor T4 and the fifth transistor T5 are turned on, the low-level signal of the second clock signal terminal CKB is written into the second node P through the fourth transistor T4 and the fifth transistor T5 which are turned-on, and the signal of the second node P maintains to be a low-level signal, and the sixth transistor T6, the seventh transistor T7 and the tenth transistor T10 are turned off. Since the signal of the first clock signal terminal CKA is a low level signal, the first transistor T1, the eighth transistor T8 and the eleventh transistor T11 are turned off, the first node Q maintains the high level signal of the previous stage, the ninth transistor T9 is continuously turned on, the signal of the third node QB is pulled down by the low level signal of the second power supply terminal VGL, the signal of the third node QB maintains to be a low level signal, the fourteenth transistor T14, the sixteenth transistor T16, the eighteenth transistor T18, the twentieth transistor T20 and the twenty-second transistor T22 are all turned off, so that the signals of the cascaded output terminal OUTCR and the four signal output terminals OUT1 to OUT4 cannot be pulled down. Since the twelfth transistor T12 is turned-on, the signal of the fourth node D maintains to be a high level signal, the thirteenth transistor T13, the fifteenth transistor T15, the seventeenth transistor T17, the nineteenth transistor T19 and the twenty-first transistor T21 are all turned on, and the signals of the cascaded output terminal and the four signal output terminals are all high-level signals. In this stage, the signals of the second node P and the third node QB are low-level signals, the signals of the first node Q and the fourth node D are high-level signals, and the signals of the cascaded output terminal OUTCR and the four signal output terminals OUT1 to OUT4 are all high-level signals.

In a third sub-stage P13, a signal of the first clock signal terminal CKA is a low-level signal, and a signal of the second clock signal terminal CKB is a high-level signal. Since the signal of the second clock signal terminal CKB is a high-level signal, the third transistor T3 is turned on, the high-level signal of the first power supply terminal VGH is written into the second node P, the signal of the second node P is a high-level signal, and the sixth transistor T6, the seventh transistor T7 and the tenth transistor T10 are all turned on. Since the signal of the first clock signal terminal CKA is a low level signal, the first transistor T1, the eighth transistor T8 and the eleventh transistor T11 are turned off, the first node Q maintains the high level signal of the previous stage, the ninth transistor T9 is continuously turned on, the signal of the third node QB is pulled down by the low level signal of the second power supply terminal VGL, the signal of the third node QB maintains to be a low level signal, the fourteenth transistor T14, the sixteenth transistor T16, the eighteenth transistor T18, the twentieth transistor T20 and the twenty-second transistor T22 are all turned off, so that the signals of the cascaded output terminal OUTCR and the four signal output terminals OUT1 to OUT4 cannot be pulled down. Since the twelfth transistor T12 is turned-on, the signal of the fourth node D maintains to be a high level signal, the thirteenth transistor T13, the fifteenth transistor T15, the seventeenth transistor T17, the nineteenth transistor T19 and the twenty-first transistor T21 are all turned on, and the signals of the cascaded output terminal and the four signal output terminals are all high-level signals. In this stage, the signal of the third node QB is a low-level signal, the signals of the second node P, the first node Q and the fourth node D are all high-level signals, and the signals of the cascaded output terminal OUTCR and the four signal output terminals OUT1 to OUT4 are all high-level signals.

In a fourth sub-stage P14, signals of the first clock signal terminal CKA and the second clock signal terminal CKB are low-level signals. Since the signal of the second clock signal terminal CKB is a low-level signal, the third transistor T3 is turned off, and the high-level signal of the first power supply terminal VGH cannot be written into the second node P. Since the fourth transistor T4 and the fifth transistor T5 are turned on, the low-level signal of the second clock signal terminal CKB is written into the second node P through the fourth transistor T4 and the fifth transistor T5 which are turned-on, and the signal of the second node P is a low-level signal, and the sixth transistor T6, the seventh transistor T7 and the tenth transistor T10 are turned off. Since the signal of the first clock signal terminal CKA is a low level signal, the first transistor T1, the eighth transistor T8 and the eleventh transistor T11 are turned off, the first node Q maintains the high level signal of the previous stage, the ninth transistor T9 is continuously turned on, the signal of the third node QB is pulled down by the low level signal of the second power supply terminal VGL, the signal of the third node QB maintains to be a low level signal, the fourteenth transistor T14, the sixteenth transistor T16, the eighteenth transistor T18, the twentieth transistor T20 and the twenty-second transistor T22 are all turned off, so that the signals of the cascaded output terminal and the four signal output terminals cannot be pulled down. Since the twelfth transistor T12 is turned-on, the signal of the fourth node D maintains to be a high level signal, the thirteenth transistor T13, the fifteenth transistor T15, the seventeenth transistor T17, the nineteenth transistor T19 and the twenty-first transistor T21 are all turned on, and the signals of the cascaded output terminal OUTCR and the four signal output terminals OUT1 to OUT4 are all high-level signals. In this stage, the signals of the second node P and the third node QB are low-level signals, the signals of the first node Q and the fourth node D are high-level signals, and the signals of the cascaded output terminal OUTCR and the four signal output terminals OUT1 to OUT4 are all high-level signals.

In a fifth sub-stage P15, a signal of the first clock signal terminal CKA is a high-level signal, and a signal of the second clock signal terminal CKB is a low-level signal. Since the signal of the second clock signal terminal CKB is a low-level signal, the third transistor T3 is turned off, and the high level signal of the first power supply terminal VGH cannot be written into the second node P, and since the fourth transistor T4 and the fifth transistor T5 are turned on, the low-level signal of the second clock signal terminal CKB is written into the second node P, and the signal of the second node P is a low-level signal, thus the sixth transistor T6, the seventh transistor T7 and the tenth transistor T10 are turned off. Since the signal of the first clock signal terminal CKA is a high level signal, the first transistor T1, the eighth transistor T8 and the eleventh transistor T11 are turned on. Since the second transistor T2 is also turned on, the high level signal of the first power supply terminal VGH is written into the first node Q, the signal of the first node Q maintains to be a high level signal, the ninth transistor T9 is turned on, the signal of the third node QB is pulled down by the low level signal of the second power supply terminal VGL, the signal of the third node QB is a low level signal, the fourteenth transistor T14, the sixteenth transistor T16, the eighteenth transistor T18, the twentieth transistor T20 and the twenty-second transistor T22 are all turned off, so that the signals of the cascaded output terminal OUTCR and the four signal output terminals OUT1 to OUT4 cannot be pulled down. Since the twelfth transistor T12 is turned on, the signal of the fourth node D is a high level signal, the thirteenth transistor T13, the fifteenth transistor T15, the seventeenth transistor T17, the nineteenth transistor T19 and the twenty-first transistor T21 are all turned on, the signals of the cascaded output terminal OUTCR and the four signal output terminals OUT1 to OUT4 are all high level signals. In this stage, the signals of the second node P and the third node QB are low-level signals, the signals of the first node Q and the fourth node D are high-level signals, and the signals of the cascaded output terminal OUTCR and the four signal output terminals OUT1 to OUT4 are all high-level signals.

In a sixth sub-stage P16, signals of the first clock signal terminal CKA and the second clock signal terminal CKB are low-level signals. Since a signal of the second clock signal terminal CKB is a low-level signal, the third transistor T3 is turned off, and the high-level signal of the first power supply terminal VGH cannot be written into the second node P. Since the fourth transistor T4 and the fifth transistor T5 are turned on, the low-level signal of the second clock signal terminal CKB is written into the second node P through the fourth transistor T4 and the fifth transistor T5 which are turned-on, and the signal of the second node P maintains to be a low-level signal, and the sixth transistor T6, the seventh transistor T7 and the tenth transistor T10 are turned off. Since the signal of the first clock signal terminal CKA is a low level signal, the first transistor T1, the eighth transistor T8 and the eleventh transistor T11 are turned off, the first node Q maintains the high level signal of the previous stage, the ninth transistor T9 is continuously turned on, the signal of the third node QB is pulled down by the low level signal of the second power supply terminal VGL, the signal of the third node QB maintains to be a low level signal, the fourteenth transistor T14, the sixteenth transistor T16, the eighteenth transistor T18, the twentieth transistor T20 and the twenty-second transistor T22 are all turned off, so that the signals of the cascaded output terminal and the four signal output terminals cannot be pulled down. Since the twelfth transistor T12 is turned-on, the signal of the fourth node D maintains to be a high level signal, the thirteenth transistor T13, the fifteenth transistor T15, the seventeenth transistor T17, the nineteenth transistor T19 and the twenty-first transistor T21 are all turned on, and the signals of the cascaded output terminal OUTCR and the four signal output terminals OUT1 to OUT4 are all high-level signals. In this stage, the signals of the second node P and the third node QB are low-level signals, the signals of the first node Q and the fourth node D are high-level signals, and the signals of the cascaded output terminal OUTCR and the four signal output terminals OUT1 to OUT4 are all high-level signals.

Thus, in the first stage, the signal of the second node P varies according to the signal of the second clock signal terminal CKB, the signal of the third node QB maintains to be a low-level signal, the signals of the first node Q and the fourth node D maintain to be high-level signals, and the signals of the cascaded output terminal OUTCR and the four signal output terminals OUT1 to OUT4 maintain to be high-level signals.

In the second stage P2, signals inputted by the signal input terminal IN and the first clock signal terminal CKA are all low-level signals. Since a signal of the signal input terminal IN is a low-level signal, the second transistor T2, the fourth transistor T4, and the fifth transistor T5 are all turned off, and since a signal of the first clock signal terminal CKA is a low-level signal, the first transistor T1, the eighth transistor T8, and the eleventh transistor T11 are all turned off. According to the signal of the second clock signal terminal CKB, the second stage P2 may include the following two sub-stages.

In a first sub-stage P21, a signal of the second clock signal terminal CKB is a high-level signal. Since the signal of the second clock signal terminal CKB is a high-level signal, the third transistor T3 is turned on, the high-level signal of the first power supply terminal VGH is written into the second node P, the signal of the second node P is a high-level signal, and the sixth transistor T6, the seventh transistor T7 and the tenth transistor T10 are all turned on. Since the first transistor T1 and the eleventh transistor T11 are turned off, the first node Q maintains the high level signal of the previous stage, the ninth transistor T9 is continuously turned on, the signal of the third node QB is pulled down by the low level signal of the second power supply terminal VGL, the signal of the third node QB maintains to be a low level signal, the fourteenth transistor T14, the sixteenth transistor T16, the eighteenth transistor T18, the twentieth transistor T20 and the twenty-second transistor T22 are all turned off, so that the signals of the cascaded output terminal OUTCR and the four signal output terminals OUT1 to OUT4 cannot be pulled down. Since the twelfth transistor T12 is turned-on, the signal of the fourth node D maintains to be a high level signal, the thirteenth transistor T13, the fifteenth transistor T15, the seventeenth transistor T17, the nineteenth transistor T19 and the twenty-first transistor T21 are all turned on, and the signals of the cascaded output terminal and the four signal output terminals are all high-level signals. In this stage, the signal of the third node QB is a low-level signal, the signals of the second node P, the first node Q and the fourth node D are all high-level signals, and the signals of the cascaded output terminal OUTCR and the four signal output terminals OUT1 to OUT4 are all high-level signals.

In a second sub-stage H22, a signal of the second clock signal terminal CKB is a low-level signal. Since the signal of the second clock signal terminal CKB is a low-level signal, although the third transistor T3 is turned off, because the fourth transistor T4 and the fifth transistor T5 are turned off, the low-level signal of the second clock signal terminal CKB cannot be written to the second node P, the second node P maintains the high-level signal of the previous stage, and the sixth transistor T6, the seventh transistor T7 and the tenth transistor T10 are all turned on. Since the first transistor T1 and the eleventh transistor T11 are turned off, the first node Q maintains the high level signal of the previous stage, the ninth transistor T9 is continuously turned on, the signal of the third node QB is pulled down by the low level signal of the second power supply terminal VGL, the signal of the third node QB maintains to be a low level signal, the fourteenth transistor T14, the sixteenth transistor T16, the eighteenth transistor T18, the twentieth transistor T20 and the twenty-second transistor T22 are all turned off, so that the signals of the cascaded output terminal OUTCR and the four signal output terminals OUT1 to OUT4 cannot be pulled down. Since the twelfth transistor T12 is turned-on, the signal of the fourth node D maintains to be a high level signal, the thirteenth transistor T13, the fifteenth transistor T15, the seventeenth transistor T17, the nineteenth transistor T19 and the twenty-first transistor T21 are all turned on, and the signals of the cascaded output terminal and the four signal output terminals are all high-level signals. In this stage, the signal of the third node QB is a low-level signal, the signals of the second node P, the first node Q and the fourth node D are all high-level signals, and the signals of the cascaded output terminal OUTCR and the four signal output terminals OUT1 to OUT4 are all high-level signals.

Thus, in the second stage, the signal of the third node QB maintains to be a low-level signal, the signals of the second node P, the first node Q and the fourth node D maintain to be high-level signals, and the signals of the cascaded output terminal OUTCR and the four signal output terminals OUT1 to OUT4 maintain to be high-level signals.

In the third stage P3, signals inputted by the signal input terminal IN and the second clock signal terminal CKB are all low-level signals. Since a signal of the signal input terminal IN is a low-level signal, the second transistor T2, the fourth transistor T4, and the fifth transistor T5 are all turned off, and since a signal of the second clock signal terminal CKB is a low-level signal, the third transistor T3 is turned off. According to the signal of the first clock signal terminal CKA, the third stage P3 may include the following two sub-stages.

In a first sub-stage P31, the signal of the first clock signal terminal CKA is a high-level signal. Since the signal of the first clock signal terminal CKA is a high level signal, the first transistor T1, the eighth transistor T8, and the eleventh transistor T11 are turned on. Since the third transistor T3, the fourth transistor T4, and the fifth transistor T5 are all turned off, the second node P maintains the high level signal of the previous stage, and the sixth transistor T6, the seventh transistor T7, and the tenth transistor T10 are turned on. Since the tenth transistor T10 and the eleventh transistor T11 are turned on, the low-level signal of the second clock signal terminal CKB is written to the first node Q, and the signal of the first node Q is a low-level signal. Since the twelfth transistor T12 is turned on, the signal of the fourth node D is also a low-level signal, the thirteenth transistor T13, the fifteenth transistor T15, the seventeenth transistor T17, the nineteenth transistor T19 and the twenty-first transistor T21 are all turned off, the ninth transistor T9 is turned off, and the signal of the third node QB cannot be pulled down by the low-level signal of the second power supply terminal VGL. Since the seventh transistor T7 and the eighth transistor T8 are turned on, the high level signal of the first clock signal terminal CKA is written into the third node QB, the signal of the third node QB is a high level signal, the fourteenth transistor T14, the sixteenth transistor T16, the eighteenth transistor T18, the twentieth transistor T20 and the twenty-second transistor T22 are all turned on, and the signals of the cascaded output terminal OUTCR and the four signal output terminals OUT1 to OUT4 are pulled down by the low level signal of the second power supply terminal VGL. In this stage, the signals of the second node P and the third node QB are high-level signals, the signals of the first node Q and the fourth node D are low-level signals, and the signals of the cascaded output terminal OUTCR and the four signal output terminals OUT1 to OUT4 are all low-level signals.

In the second sub-stage P32, a signal of the first clock signal terminal CKA is a low-level signal. Since the signal of the first clock signal terminal CKA is a low level signal, the first transistor T1, the eighth transistor T8, and the eleventh transistor T11 are turned off. Since the third transistor T3, the fourth transistor T4, and the fifth transistor T5 are all turned off, the second node P maintains the high level signal of the previous stage, and the sixth transistor T6, the seventh transistor T7, and the tenth transistor T10 are turned on. The signal of the first node Q maintains the low level signal of the previous stage, since the twelfth transistor T12 is turned on, the signal of the fourth node D is also the low level signal, the thirteenth transistor T13, the fifteenth transistor T15, the seventeenth transistor T17, the nineteenth transistor T19 and the twenty-first transistor T21 are all turned off, the ninth transistor T9 is turned off, the signal of the third node QB cannot be pulled down by the low level signal of the second power supply terminal VGL. Since the eighth transistor T8 is turned off, the low level signal of the first clock signal terminal CKA cannot be written into the third node QB, the third node QB maintains the high level signal of the previous stage, the fourteenth transistor T14, the sixteenth transistor T16, the eighteenth transistor T18, the twentieth transistor T20 and the twenty-second transistor T22 are all turned on, the signals of the cascaded output terminal OUTCR and the four signal output terminals OUT1 to OUT4 are pulled down by the low level signal of the second power supply terminal VGL. In this stage, the signals of the second node P and the third node QB are high-level signals, the signals of the first node Q and the fourth node D are low-level signals, and the signals of the cascaded output terminal OUTCR and the four signal output terminals OUT1 to OUT4 are all low-level signals.

Thus, in the third stage, the signals of the second node P and the third node QB maintain to be high-level signals, the signals of the first node Q and the fourth node D maintain to be low-level signals, and the signals of the cascaded output terminal OUTCR and the four signal output terminals OUT1 to OUT4 maintain to be low-level signals.

In the fourth stage P4, an input signal of the signal input terminal IN is a high-level signal, and a signal of the first clock signal terminal CKA is a low-level signal. Since the signal of the signal input terminal IN is a high level signal, the second transistor T2, the fourth transistor T4, and the fifth transistor T5 are all turned on, and since the signal of the first clock signal terminal CKA is a low level signal, the first transistor T1, the eighth transistor T8, and the eleventh transistor T11 are all turned off. According to the signal of the second clock signal terminal CKB, the fourth stage P4 may include the following two sub-stages.

In a first sub-stage P41, a signal of the second clock signal terminal CKB is a high-level signal. Since the signal of the second clock signal terminal CKB is a high-level signal, the third transistor T3 is turned on, the high-level signal of the first power supply terminal VGH is written into the second node P, the signal of the second node P is a high-level signal, and the sixth transistor T6, the seventh transistor T7 and the tenth transistor T10 are all turned on. Since the first transistor T1 and the eleventh transistor T11 are both turned off, the first node Q maintains the low level signal of the previous stage, since the twelfth transistor T12 is turned on, the signal of the fourth node D is also the low level signal, the thirteenth transistor T13, the fifteenth transistor T15, the seventeenth transistor T17, the nineteenth transistor T19 and the twenty-first transistor T21 are all turned off, the ninth transistor T9 is turned off, the signal of the third node QB cannot be pulled down by the low level signal of the second power supply terminal VGL. Since the eighth transistor T8 is turned off, the low level signal of the first clock signal terminal CKA cannot be written into the third node QB, the third node QB maintains the high level signal of the previous stage, the fourteenth transistor T14, the sixteenth transistor T16, the eighteenth transistor T18, the twentieth transistor T20 and the twenty-second transistor T22 are all turned on, the signals of the cascaded output terminal OUTCR and the four signal output terminals OUT1 to OUT4 are pulled down by the low level signal of the second power supply terminal VGL. In this stage, the signals of the second node P and the third node QB are high-level signals, the signals of the first node Q and the fourth node D are low-level signals, and the signals of the cascaded output terminal OUTCR and the four signal output terminals OUT1 to OUT4 are all low-level signals.

In a second sub-stage P42, a signal of the second clock signal terminal CKB is a low-level signal. The third transistor T3 is turned off because the signal of the second clock signal terminal CKB is a low-level signal, however, since the fourth transistor T4 and the fifth transistor T5 are turned on, the low-level signal of the second clock signal terminal CKB is written into the second node P, the signal of the second node P is a low-level signal, and the sixth transistor T6, the seventh transistor T7 and the tenth transistor T10 are turned off. Since the first transistor T1, the tenth transistor T10 and the eleventh transistor T11 are all turned off, the first node Q maintains the low level signal of the previous stage, since the twelfth transistor T12 is turned on, the signal of the fourth node D is also the low level signal, the thirteenth transistor T13, the fifteenth transistor T15, the seventeenth transistor T17, the nineteenth transistor T19 and the twenty-first transistor T21 are all turned off, the ninth transistor T9 is turned off, the signal of the third node QB is not pulled down by the low level signal of the second power supply terminal VGL. Since the eighth transistor T8 is turned off, the low level signal of the first clock signal terminal CKA cannot be written into the third node QB, the third node QB maintains the high level signal of the previous stage, the fourteenth transistor T14, the sixteenth transistor T16, the eighteenth transistor T18, the twentieth transistor T20 and the twenty-second transistor T22 are all turned on, the signals of the cascaded output terminal OUTCR and the four signal output terminals OUT1 to OUT4 are pulled down by the low level signal of the second power supply terminal VGL. In this stage, the signal of the third node QB is a high-level signal, the signals of the second node P, the first node Q and the fourth node D are low-level signals, and the signals of the cascaded output terminal OUTCR and the four signal output terminals OUT1 to OUT4 are all low-level signals.

Therefore, in the fourth stage, the signal of the second node P varies according to the signal of the second clock signal terminal CKB, the signal of the third node QB maintains to be a high level signal, the signals of the first node Q and the fourth node D maintain to be low level signals, and the signals of the cascaded output terminal OUTCR and the four signal output terminals OUT1 to OUT4 maintain to be low level signals.

In the fifth stage P5, an input signal of the signal input terminal IN is a high-level signal, and a signal of the second clock signal terminal CKB is a low-level signal. Since the signal of the signal input terminal IN is a high level signal, the second transistor T2, the fourth transistor T4, and the fifth transistor T5 are all turned on, and since the signal of the second clock signal terminal CKB is a low level signal, the third transistor T3 is turned off. According to the signal of the first clock signal terminal CKA, the fifth stage P5 may include the following two sub-stages.

In a first sub-stage P51, a signal of the first clock signal terminal CKA is a high-level signal. Since the signal of the first clock signal terminal CKA is a high level signal, the first transistor T1, the eighth transistor T8, and the eleventh transistor T11 are turned on. Since the fourth transistor T4 and the fifth transistor T5 are turned on, the low-level signal of the second clock signal terminal CKB is written to the second node P, the signal of the second node P is a low-level signal, and the sixth transistor T6, the seventh transistor T7 and the tenth transistor T10 are turned off. Since the first transistor T1 and the second transistor T2 are turned on, the high-level signal of the first power supply terminal VGH is written into the first node Q, the signal of the first node Q is a high-level signal, the ninth transistor T9 is continuously turned on, the signal of the third node QB is pulled down by the low-level signal of the second power supply terminal VGL, the signal of the third node QB is a low-level signal, the fourteenth transistor T14, the sixteenth transistor T16, the eighteenth transistor T18, the twentieth transistor T20 and the twenty-second transistor T22 are all turned off, so that the signals of the cascaded output terminal OUTCR and the four signal output terminals OUT1 to OUT4 are not pulled down. Since the twelfth transistor T12 is turned on, the signal of the fourth node D maintains to be a high-level signal, the thirteenth transistor T13, the fifteenth transistor T15, the seventeenth transistor T17, the nineteenth transistor T19 and the twenty-first transistor T21 are all turned on, and the signals of the cascaded output terminal and the four signal output terminals are all high-level signals In this stage, the signals of the second node P and the third node QB are low-level signals, the signals of the first node Q and the fourth node D are high-level signals, and the signals of the cascaded output terminal OUTCR and the four signal output terminals OUT1 to OUT4 are all high-level signals.

In a second sub-stage P52, a signal of the first clock signal terminal CKA is a low-level signal. Since the signal of the first clock signal terminal CKA is a low level signal, the first transistor T1, the eighth transistor T8, and the eleventh transistor T11 are turned off. Since the fourth transistor T4 and the fifth transistor T5 are turned on, the low-level signal of the second clock signal terminal CKB is written to the second node P, the signal of the second node P maintains a low-level signal, and the sixth transistor T6, the seventh transistor T7 and the tenth transistor T10 are turned off. Since the first transistor T1 is turned off, the low-level signal of the first clock signal terminal CKA cannot be written into the first node Q, the first node Q maintains the high-level signal of the previous stage, the ninth transistor T9 is continuously turned on, the signal of the third node QB is pulled down by the low-level signal of the second power supply terminal VGL, the signal of the third node QB is a low-level signal, the fourteenth transistor T14, the sixteenth transistor T16, the eighteenth transistor T18, the twentieth transistor T20 and the twenty-second transistor T22 are all turned off, so that the signals of the cascaded output terminal OUTCR and the four signal output terminals OUT1 to OUT4 cannot be pulled down. Since the twelfth transistor T12 is turned on, the signal of the fourth node D maintains to be a high-level signal, the thirteenth transistor T13, the fifteenth transistor T15, the seventeenth transistor T17, the nineteenth transistor T19 and the twenty-first transistor T21 are all turned on, and the signals of the cascaded output terminal and the four signal output terminals are all high-level signals In this stage, the signals of the second node P and the third node QB are low-level signals, the signals of the first node Q and the fourth node D are high-level signals, and the signals of the cascaded output terminal OUTCR and the four signal output terminal OUT1 to OUT4 are all high-level signals.

Therefore, in the fifth stage, the signals of the second node P and the third node QB are low level signals, the signals of the first node Q and the fourth node D are high level signals, and the signals of the cascaded output terminal OUTCR and the four signal output terminals OUT1 to OUT4 are all high level signals.

In the sixth stage P6, an input signal of the signal input terminal IN is a high-level signal, and a signal of the first clock signal terminal CKA is a low-level signal. Since the signal of the signal input terminal IN is a high level signal, the second transistor T2, the fourth transistor T4, and the fifth transistor T5 are all turned on, and since the signal of the first clock signal terminal CKA is a low level signal, the first transistor T1, the eighth transistor T8, and the eleventh transistor T11 are all turned off. According to the signal of the second clock signal terminal CKB, the sixth stage P6 may include the following two sub-stages.

In a first sub-stage P61, a signal of the second clock signal terminal CKB is a high-level signal. Since the signal of the second clock signal terminal CKB is a high-level signal, the third transistor T3 is turned on, and the high-level signal of the first power supply terminal VGH is written into the second node P, and since the fourth transistor T4 and the fifth transistor T5 are turned on, the high-level signal of the second clock signal terminal CKB is written into the second node P, and the signal of the second node P is a high-level signal, and the sixth transistor T6, the seventh transistor T7 and the tenth transistor T10 are all turned on. Since the first transistor T1 and the eleventh transistor T11 are turned off, the first node Q maintains the high level signal of the previous stage, the ninth transistor T9 is continuously turned on, the signal of the third node QB is pulled down by the low level signal of the second power supply terminal VGL, the signal of the third node QB is a low level signal, the fourteenth transistor T14, the sixteenth transistor T16, the eighteenth transistor T18, the twentieth transistor T20 and the twenty-second transistor T22 are all turned off, so that the signals of the cascaded output terminal OUTCR and the four signal output terminals OUT1 to OUT4 cannot be pulled down. Since the twelfth transistor T12 is turned-on, the signal of the fourth node D maintains to be a high level signal, the thirteenth transistor T13, the fifteenth transistor T15, the seventeenth transistor T17, the nineteenth transistor T19 and the twenty-first transistor T21 are all turned on, and the signals of the cascaded output terminal and the four signal output terminals are all high-level signals. In this stage, the signal of the third node QB is a low-level signal, the signals of the second node P, the first node Q and the fourth node D are high-level signals, and the signals of the cascaded output terminal OUTCR and the four signal output terminals OUT1 to OUT4 are all high-level signals.

In the second sub-stage P62, a signal of the second clock signal terminal CKB is a low-level signal. Since the signal of the second clock signal terminal CKB is a low-level signal, the third transistor T3 is turned off, and the high level signal of the first power supply terminal VGH cannot be written into the second node P, and since the fourth transistor T4 and the fifth transistor T5 are turned on, the low-level signal of the second clock signal terminal CKB is written into the second node P, and the signal of the second node P is a low-level signal, thus the sixth transistor T6, the seventh transistor T7 and the tenth transistor T10 are turned off. Since the first transistor T1 and the eleventh transistor T11 are turned off, the first node Q maintains the high level signal of the previous stage, the ninth transistor T9 is continuously turned on, the signal of the third node QB is pulled down by the low level signal of the second power supply terminal VGL, the signal of the third node QB is a low level signal, the fourteenth transistor T14, the sixteenth transistor T16, the eighteenth transistor T18, the twentieth transistor T20 and the twenty-second transistor T22 are all turned off, so that the signals of the cascaded output terminal OUTCR and the four signal output terminals OUT1 to OUT4 cannot be pulled down. Since the twelfth transistor T12 is turned-on, the signal of the fourth node D maintains to be a high level signal, the thirteenth transistor T13, the fifteenth transistor T15, the seventeenth transistor T17, the nineteenth transistor T19 and the twenty-first transistor T21 are all turned on, and the signals of the cascaded output terminal and the four signal output terminals are all high-level signals. In this stage, the signals of the second node P and the third node QB are low-level signals, the signals of the first node Q and the fourth node D are high-level signals, and the signals of the cascaded output terminal OUTCR and the four signal output terminals OUT1 to OUT4 are all high-level signals.

Thus, in the sixth stage, the signal of the second node P varies according to the signal of the second clock signal terminal CKB, the signal of the third node QB maintains to be a low-level signal, the signals of the first node Q and the fourth node D maintain to be high-level signals, and the signals of the cascaded output terminal OUTCR and the four signal output terminals OUT1 to OUT4 maintain to be high-level signals.

After the sixth stage, the fifth and sixth stages are performed in sequence.

In conjunction with FIGS. 15 and 18, the working process of the shift register provided in FIG. 15 differs from that of the shift register provided in FIG. 14 in that when the first transistor T1 and the second transistor T2 are turned on, the high-level signal written into the first node N1 is the high-level signal of the first clock signal terminal CKA.

In conjunction with FIGS. 16 and 18, the working process of the shift register provided in FIG. 16 differs from that provided in FIG. 14 in that when the third node N3 is a high level signal and the twenty-third transistor T23 to the twenty-eighth transistor T28 are all turned on, even if the signal of the first power supply terminal VGH is written into the fifth node ND, due to the turn-on of the twenty-fourth transistor T24 to the twenty-eighth transistor T28, the signal of the fifth node ND is pulled low, and the signal of the second power supply terminal VGL is written into the cascaded signal output terminal OUTCR and the first signal output terminal OUT1 to the fourth signal output terminal OUT4.

In conjunction with FIGS. 17 and 18, the working process of the shift register provided in FIG. 17 differs from that provided in FIG. 15 in that when the third node N3 is a high level signal and the twenty-third transistor T23 to the twenty-eighth transistor T28 are all turned on, even if the signal of the first power supply terminal VGH is written into the fifth node ND, due to the turn-on of the twenty-fourth transistor T24 to the twenty-eighth transistor T28, the signal of the fifth node ND is pulled low, and the signal of the second power supply terminal VGL is written into the cascaded signal output terminal OUTCR and the first signal output terminal OUT1 to the fourth signal output terminal OUT4.

Figure 19:
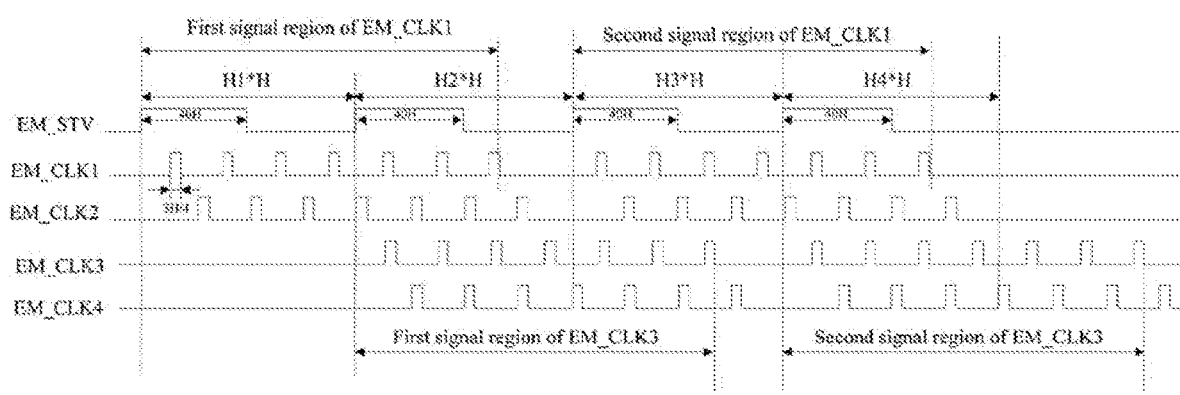
FIG. 19 is a timing diagram of signal lines connected to the light emitting driving circuit group.

FIG. 19 is a timing diagram of signal lines connected to the light emitting driving circuit group. As shown in FIG. 19, the display substrate may further include: a light emitting initial signal line EM_STV. The signal input terminals of the light emitting shift registers of first stages in the M light emitting driving circuits are electrically connected with the light emitting initial signal line. FIG. 19 is illustrated by an example in which M=4, and the present disclosure is not limited thereto.

In some exemplary embodiments, as shown in FIG. 19, the signal of the light emitting initial signal line EM_STV is M effective level pulse signals, and an i-th effective level pulse signal is a signal of a signal input terminal of a light emitting shift register of a first stage in an i-th light emitting driving circuit.

In some exemplary embodiments, as shown in FIG. 19, a time difference between starting time of the i-th effective level pulse signal of the light emitting initial signal line and starting time of an (i+1)-th effective level pulse signal of the light emitting initial signal line is Hi*H, wherein Hi is the number of rows corresponding to a resolution of the i-th partition, and H is data writing time of pixel circuits of one row.

In some exemplary embodiments, as shown in FIG. 19, data writing time Hmin*H of a partition with lowest resolution is larger than a duration T of the effective level pulse signal of the light emitting initial signal line, and Hmin is the number of rows corresponding to the resolution of the partition with lowest resolution. Exemplarily, the Hmin may be 60. FIG. 19 is illustrated by taking T=40H as an example.

In some exemplary embodiments, as shown in FIG. 19, contents displayed on the display substrate include a plurality of display frames. The first light emitting clock signal line EM_CLK1 is a first reference light emitting clock signal line when end time of a first effective level pulse signal of the first light emitting clock signal line EM_CLK1 is earlier than starting time of a first effective level pulse signal of the second light emitting clock signal line EM_CLK2, and the second light emitting clock signal line EM_CLK2 is the first reference light emitting clock signal line when end time of the first effective level pulse signal of the second light emitting clock signal line EM_CLK2 is earlier than starting time of the first effective level pulse signal of the first light emitting clock signal line EM_CLK1. FIG. 19 is illustrated by an example in which the first light emitting clock signal line is the first reference light emitting clock signal line.

In some exemplary embodiments, as shown in FIG. 19, within one display frame, the signal of the first reference light emitting clock signal line includes: M1 signal regions, where M1 is the number of odd numbers in M, and a (2s−1)-th light emitting driving circuit outputs a signal in an s-th signal region, where s=1, 2, . . . , M1. FIG. 19 is illustrated by an example of M1=2.

In some exemplary embodiments, as shown in FIG. 19, in the s-th signal region, the number of effective level signals in the signal of the first reference light emitting clock signal line satisfies: EMNum_S=$H_{2s-1}$/N0+M0/$H_{2s-1}$, N0=2$H_{2s-1}$/Hmin, M0=Hmin*T/2. Exemplarily, when $H_{2s-1=240}$, Hmin=60, EMNum_s=240/8+1200/240=35, where 240/8 Hs are used for shifting, and 1200/240 Hs are used for compensating the duration T of the effective level pulse signal of the light emitting initial signal line.

FIG. 19 is illustrated by an example in which a period of a signal of the first reference light emitting clock signal line is $H_{2s-1}$*H/30 in the s-th signal region, and an effective level pulse signal in the signal of the first reference light emitting clock signal line has a duration of 3H/4.

In some exemplary embodiments, as shown in FIG. 19, the third light emitting clock signal line EM_CLK 3 is a second reference light emitting clock signal line when end time of a first effective level pulse signal of the third light emitting clock signal line EM_CLK 3 is earlier than starting time of a first effective level pulse signal of the fourth light emitting clock signal line EM_CLK 4, and the fourth light emitting clock signal line EM_CLK 4 is a second reference light emitting clock signal line when end time of a first effective level pulse signal of the fourth light emitting clock signal line EM_CLK 4 is earlier than starting time of the first effective level pulse signal of the third light emitting clock signal line EM_CLK 3. FIG. 19 is illustrated by an example in which the third light emitting clock signal line EM_CLK 3 is the first reference light emitting clock signal line.

In some exemplary embodiments, as shown in FIG. 19, within one display frame, the signal of the second reference light emitting clock signal line includes: M2 signal regions, where M2 is the number of even numbers in M, and a 2t-th light emitting driving circuit outputs a signal in a t-th signal region, where t=1, 2, . . . , M2. FIG. 19 is illustrated by an example of M2=2.

In some exemplary embodiments, as shown in FIG. 19, in the t-th signal region, the number of effective level signals in the signal of the second reference light emitting clock signal line satisfies: EMNum_t≥$H_{2t}$/N1+M0/$H_{2t}$, N1=2$H_{2t}$/Hmin. Exemplarily, when $H_{2t}$=240, Hmin=60, EMNum_T=240/8+1200/240=35, where 240/8 Hs are used for shifting, and 1200/240 Hs are used for compensating the duration T of the effective level pulse signal of the light emitting initial signal line.

FIG. 19 is illustrated by an example in which a period of a signal of the second reference light emitting clock signal line is $H_{2t}*H/30$ in the t-th signal region, and an effective level pulse signal in the signal of the second reference light emitting clock signal line has a duration of 3H/4.

Figure 20:
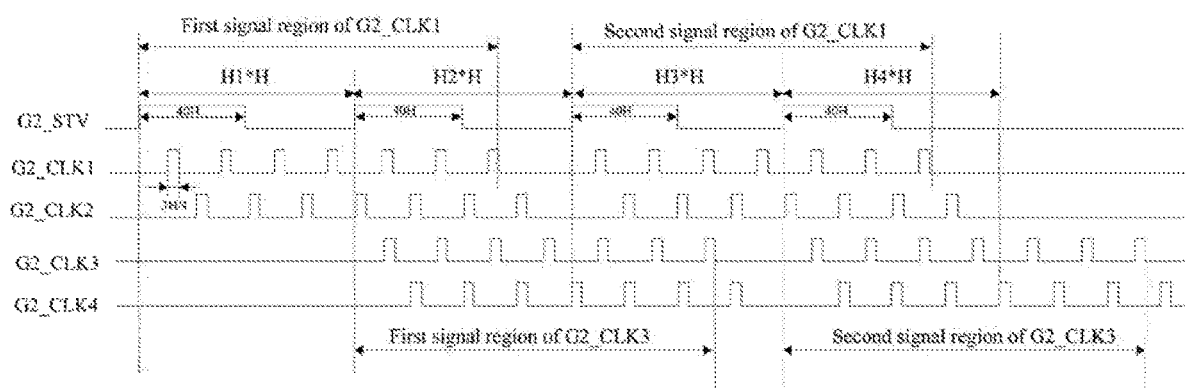
FIG. 20 is a timing diagram of signal lines connected to the control driving circuit group.

FIG. 20 is a timing diagram of signal lines connected to the control driving circuit group. As shown in FIG. 20, the display substrate may further include: a control initial signal line G2_STV. Signal input terminals of control shift registers of first stages in the M control driving circuits are electrically connected to the control initial signal line. FIG. 20 is illustrated by an example of M=4, and the present disclosure is not limited thereto.

In some exemplary embodiments, as shown in FIG. 20, the signal of the control initial signal line G2_STV is M effective level pulse signals, and an i-th effective level pulse signal is a signal of a signal input terminal of a control shift register of a first stage in an i-th control driving circuit.

In some exemplary embodiments, as shown in FIG. 20, a time difference between starting time of the i-th effective level pulse signal of the control initial signal line and starting time of an (i+1)-th effective level pulse signal of the control initial signal line is Hi*H, wherein Hi is the number of rows corresponding to a resolution of the i-th partition, for example, if the resolution of the i-th partition is 1920 (columns)*120 (rows), then Hi=120, and H is data writing time of pixel circuits of one row.

In some exemplary embodiments, as shown in FIG. 20, the data writing time Hmin*H of the partition with lowest resolution is larger than a duration T of the effective level pulse signal of the control initial signal line, and Hmin is the number of rows corresponding to the resolution of the partition with lowest resolution, for example, if the resolution of the partition with lowest resolution is 1920 (columns)* 40 (rows), then Hmin=40. Exemplarily, the Hmin may be 60. FIG. 20 is illustrated by taking T=40H as an example.

In some exemplary embodiments, as shown in FIG. 20, the contents displayed on the display substrate include a plurality of display frames. The first control clock signal line G2_CLK 1 is a first reference control clock signal line when end time of a first effective level pulse signal of the first control clock signal line G2_CLK 1 is earlier than starting time of a first effective level pulse signal of the second control clock signal line G2_CLK 2, and the second control clock signal line G2_CLK 2 is the first reference control clock signal line when end time of the first effective level pulse signal of the second control clock signal line G2_CLK 2 is earlier than starting time of the first effective level pulse signal of the first control clock signal line G2_CLK 1. FIG. 20 is illustrated by an example in which the first control clock signal line is the first reference control clock signal line.

In some exemplary embodiments, as shown in FIG. 20, within one display frame, the signal of the first reference control clock signal line includes: M1 signal regions, where M1 is the number of odd numbers in M, and a (2s−1)-th control driving circuit outputs a signal in an s-th signal region, where s=1, 2, . . . , M1. FIG. 20 is illustrated by an example of M1=2.

In some exemplary embodiments, as shown in FIG. 20, in the s-th signal region, the number of effective level signals in the signal of the first reference control clock signal line satisfies: $G2Num\_s = H_{2s-1}/N0 + M0/H_{2s-1}$, $N0 = 2H_{2s-1}/Hmin$, $M0 = Hmin*T/2$. Exemplarily, when $H_{2s-1}=240$, Hmin=60, G2Num_s=240/8+1200/240=35, where 240/8 Hs are used for shifting, and 1200/240 Hs are used for compensating the duration T of the effective level pulse signal of the control initial signal line.

FIG. 20 is illustrated by an example in which a period of a signal of the first reference control clock signal line is $H_{2s-1}*H/30$ in the s-th signal region, and an effective level pulse signal in the signal of the first reference control clock signal line has a duration of 3H/4.

In some exemplary embodiments, as shown in FIG. 20, the third control clock signal line G2_CLK 3 is a second reference control clock signal line when end time of a first effective level pulse signal of the third control clock signal line G2_CLK 3 is earlier than starting time of a first effective level pulse signal of the fourth control clock signal line G2_CLK 4, and the fourth control clock signal line G2_CLK 4 is a second reference control clock signal line when end time of the first effective level pulse signal of the fourth control clock signal line G2_CLK 4 is earlier than starting time of the first effective level pulse signal of the third control clock signal line G2_CLK 3. FIG. 20 is illustrated by an example in which the third control clock signal line G2_CLK 3 is the first reference control clock signal line.

In some exemplary embodiments, as shown in FIG. 20, within one display frame, the signal of the second reference control clock signal line includes: M2 signal regions, where M2 is the number of even numbers in M, and a 2t-th control driving circuit outputs a signal in a t-th signal region, where t=1, 2, . . . , M2. FIG. 20 is illustrated by an example of M1=2.

In some exemplary embodiments, as shown in FIG. 20, in the t-th signal region, the number of effective level signals in the signal of the second reference control clock signal line satisfies: $G2Num\_t \geq H_{2t}/N1 + M0/H_{2t}$, $N1 = 2H_{2t}/Hmin$. Exemplarily, when $H_{2t}=240$, Hmin=60, G2Num_T=240/8+1200/240=35, where 240/8 Hs are used for shifting, and 1200/240 Hs are used for compensating the duration T of the effective level pulse signal of the control initial signal line.

FIG. 20 is illustrated by an example in which a period of a signal of the second reference control clock signal line is $H_{2t}*H/30$ in the t-th signal region, and an effective level pulse signal in the signal of the second reference light emitting clock signal line has a duration of 3H/4.

Figure 21:
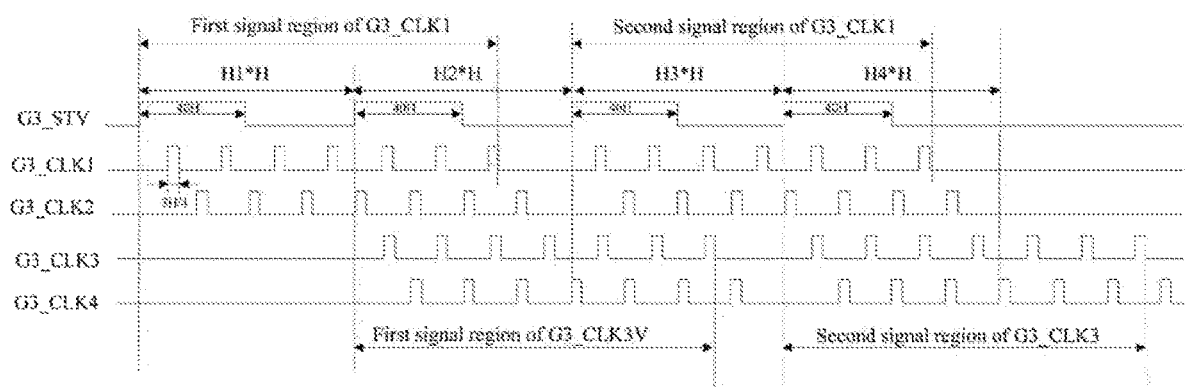
FIG. 21 is a timing diagram of signal lines connected to the reset driving circuit group.

FIG. 21 is a timing diagram of signal lines connected to the reset driving circuit group. As shown in FIG. 21, the display substrate may further include: a reset initial signal line G3_STV. Signal input terminals of reset shift registers of first stages in the M reset driving circuits are electrically connected with the reset initial signal line. FIG. 21 is illustrated by an example of M=4, and the present disclosure is not limited thereto.

In some exemplary embodiments, as shown in FIG. 21, the signal of the reset initial signal line G3_STV is M effective level pulse signals, and an i-th effective level pulse signal is a signal of a signal input terminal of a reset shift register of a first stage in an i-th reset driving circuit.

In some exemplary embodiments, as shown in FIG. 21, a time difference between starting time of the i-th effective level pulse signal of the reset initial signal line and starting time of an (i+1)-th effective level pulse signal of the reset initial signal line is Hi*H, wherein Hi is the number of rows corresponding to a resolution of the i-th partition, and H is data writing time of pixel circuits of one row.

In some exemplary embodiments, as shown in FIG. 21, data writing time Hmin*H of a partition with lowest resolution is larger than a duration T of the effective level pulse signal of the reset initial signal line, and Hmin is the number of rows corresponding to the resolution of the partition with lowest resolution. Exemplarily, the Hmin may be 60. FIG. 21 is illustrated by taking T=40H as an example.

In some exemplary embodiments, as shown in FIG. 21, contents displayed on the display substrate include a plurality of display frames. The first reset clock signal line G3_CLK 1 is a first reference reset clock signal line when end time of a first effective level pulse signal of the first reset clock signal line G3_CLK 1 is earlier than starting time of a first effective level pulse signal of the second reset clock signal line G3_CLK 2, and the second reset clock signal line G3_CLK 2 is the first reference reset clock signal line when end time of the first effective level pulse signal of the second reset clock signal line G3_CLK 2 is earlier than starting time of the first effective level pulse signal of the first reset clock signal line G3_CLK 1. FIG. 21 is illustrated by an example in which the first reset clock signal line is the first reference reset clock signal line.

In some exemplary embodiments, as shown in FIG. 21, within one display frame, the signal of the first reference reset clock signal line includes: M1 signal regions, where M1 is the number of odd numbers in M, and a (2s−1)-th reset driving circuit outputs a signal in an s-th signal region, where s=1, 2, . . . , M1. FIG. 21 is illustrated by an example of M1=2.

In some exemplary embodiments, as shown in FIG. 21, in the s-th signal region, the number of effective level signals in the signal of the first reference reset clock signal line satisfies: G3Num_s=$H_{2s-1}$/N0+M0/$H_{2s-1}$, N0=2$H_{2s-1}$/Hmin, M0=Hmin*T/2. Exemplarily, when $H_{2s-1}$=240, Hmin=60, G3Num_s=240/8+1200/240=35, where 240/8 Hs are used for shifting, and 1200/240 Hs are used for compensating the duration T of the effective level pulse signal of the reset initial signal line.

FIG. 21 is illustrated by an example in which a period of a signal of the first reference reset clock signal line is $H_{2s-1}$*H/30 in the s-th signal region, and an effective level pulse signal in the signal of the first reference reset clock signal line has a duration of 3H/4.

In some exemplary embodiments, as shown in FIG. 21, the third reset clock signal line G3_CLK 3 is a second reference reset clock signal line when end time of a first effective level pulse signal of the third reset clock signal line G3_CLK 3 is earlier than starting time of a first effective level pulse signal of the fourth reset clock signal line G3_CLK 4, and the fourth reset clock signal line G3_CLK 4 is the second reference reset clock signal line when end time of the first effective level pulse signal of the fourth reset clock signal line G3_CLK 4 is earlier than starting time of the first effective level pulse signal of the third reset clock signal line G3_CLK 3. FIG. 21 is illustrated by an example in which the third reset clock signal line G3_CLK 3 is the first reference reset clock signal line.

In some exemplary embodiments, as shown in FIG. 21, within one display frame, the signal of the second reference reset clock signal line includes: M2 signal regions, where M2 is the number of even numbers in M, and a 2t-th reset driving circuit outputs a signal in a t-th signal region, where t=1, 2, . . . , M2. FIG. 21 is illustrated by an example of M1=2.

In some exemplary embodiments, as shown in FIG. 21, in the t-th signal region, the number of effective level signals in the signal of the second reference reset clock signal line satisfies: G3Num_t≥$H_{2t}$/N1+M0/$H_{2t}$, N1=2$H_{2t}$/Hmin. Exemplarily, when $H_{2t}$=240, Hmin=60, G3Num_t=240/8+1200/240=35, where 240/8 Hs are used for shifting, and 1200/240 Hs are used for compensating the duration T of the effective level pulse signal of the reset initial signal line.

FIG. 21 is illustrated by an example in which a period of a signal of the second reference reset clock signal line is $H_{2t}$*H/30 in the t-th signal region, and an effective level pulse signal in the signal of the second reference reset clock signal line has a duration of 3H/4.

As shown in FIGS. 19 to 21, in the present disclosure, by means of the data writing time of pixel circuits of the first partition and the data writing time of pixel circuits of the second partition, it is ensured that the first signal region of the first reference clock signal line (the first reference light emitting clock signal line, the first reference control clock signal line and the first reference reset clock signal line) can realize the internal compensation of the pixel circuits of the first partition, and by means of the data writing time of pixel circuits of the third partition and the data writing time of pixel circuits of the fourth partition, it is ensured that the second signal region of the first reference clock signal line can realize the internal compensation of the pixel circuits of the third partition, and for other odd-numbered partitions, those are similar.

As shown in FIGS. 19 to 21, in the present disclosure, by means of the data writing time of pixel circuits of the second partition and the data writing time of pixel circuits of the third partition, it is ensured that the first signal region of the second reference clock signal line (the second reference light emitting clock signal line, the second reference control clock signal line and the second reference reset clock signal line) can realize the internal compensation of the pixel circuits of the second partition, and by means of the data writing time of pixel circuits of fourth partition and the data writing time of pixel circuits of the fifth partition, it is ensured that the second signal region of the second reference clock signal line can realize the internal compensation of the pixel circuits of the fourth partition, and other even-numbered partitions, those are similar.

An embodiment of the present disclosure also provides a display apparatus including a display substrate.

The display substrate is the display substrate according to any of the aforementioned embodiments, and has similar implementation principles and implementation effects, which will not be repeated here.

In an exemplary example, the display apparatus may be a liquid crystal display (LCD) or an organic light emitting diode (OLED) display apparatus. The display apparatus may be any product or component with a display function, such as a liquid crystal panel, electronic paper, an OLED panel, an active-matrix organic light emitting diode (AMOLED) panel, a mobile phone, a tablet computer, a television, a display, a notebook computer, a digital photo frame or a navigator.

The drawings of the embodiments of the present disclosure only involve structures involved in the embodiments of the present disclosure, and other structures may refer to usual designs.

For the sake of clarity, in the accompanying drawings used for describing the embodiments of the present disclosure, a thickness and dimension of a layer or a micro structure is enlarged. It may be understood that when an element such as a layer, a film, a region, or a substrate is described as being "on" or "under" another element, the element may be "directly" located "on" or "under" the other element, or there may be an intermediate element.

Although the implementations disclosed in the present disclosure are as above, the described contents are only implementations used for convenience of understanding the present disclosure, but are not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined in the appended claims.

The invention claimed is:

1. A display substrate, comprising: a display area and a non-display area, wherein the display area is provided with pixel circuits arranged in an array, and the display area is divided into M partitions along a first direction; a pixel circuit comprises a writing transistor, an anode reset transistor, a gate control transistor, a light emitting transistor, and a first scan signal line, a second scan signal line, a third scan signal line and a light emitting signal line that extend along a second direction, wherein the first scan signal line is electrically connected with the writing transistor, the second scan signal line is electrically connected with the gate control transistor, the third scan signal line is electrically connected with the anode reset transistor, the light emitting signal line is connected with the light emitting transistor, and M is a positive integer greater than or equal to 2;
- the non-display area is provided with a light emitting driving circuit group, a control driving circuit group, a reset driving circuit group, a first light emitting clock signal line to a fourth light emitting clock signal line, a first control clock signal line to a fourth control clock signal line, and a first reset clock signal line to a fourth reset clock signal line;
- the light emitting driving circuit group comprises M light emitting driving circuits, an i-th light emitting driving circuit is connected with a light emitting signal line in a pixel circuit in an i-th partition, an odd-numbered light emitting driving circuit is electrically connected with the first light emitting clock signal line and the second light emitting clock signal line, and an even-numbered light emitting driving circuit is connected with the third light emitting clock signal line and the fourth light emitting clock signal line, where i= 1, 2, . . . , M;
- and/or, the control driving circuit group comprises M control driving circuits, an i-th control driving circuit is connected with a second scan signal line in the pixel circuit in the i-th partition, an odd-numbered control driving circuit is electrically connected with the first control clock signal line and the second control clock signal line, and an even-numbered control driving circuit is connected with the third control clock signal line and the fourth control clock signal line;
- and/or, the reset driving circuit group comprises M reset driving circuits, an i-th reset driving circuit is connected with a third scan signal line in the pixel circuit in the i-th partition, an odd-numbered reset driving circuit is electrically connected with the first reset clock signal line and the second reset clock signal line, and an even-numbered reset driving circuit is connected with the third reset clock signal line and the fourth reset clock signal line.

2. The display substrate according to claim 1, wherein a first partition comprises pixel circuits of a first row to pixel circuits of an $N_1$-th row, a j-th partition comprises pixel circuits of an $(N_{j-1}+1)$-th row to pixel circuits of an $N_j$-th row, j=2, . . . , M;
- a light emitting driving circuit comprises light emitting shift registers, wherein a light emitting shift register comprises a cascaded signal output terminal, a signal input terminal, a first signal output terminal, a second signal output terminal, a third signal output terminal and a fourth signal output terminal;
- a first light emitting driving circuit comprises: $N_1/4$ cascaded light emitting shift registers, a cascaded signal output terminal of a light emitting shift register of an x-th stage is connected with a signal input terminal of a light emitting shift register of an (x+1)-th stage in the first light emitting driving circuit; a first signal output terminal, a second signal output terminal, a third signal output terminal and a fourth signal output terminal of the light emitting shift register of the x-th stage in the first light emitting driving circuit are respectively connected with light emitting signal lines of pixel circuits in a (4x−3)-th row, pixel circuits in a (4x−2)-th row, pixel circuits in a (4x−1)-th row and pixel circuits in a 4x-th row, where x=1, 2, . . . , $N_1/4$;
- a j-th light emitting driving circuit comprises $(N_j-N_{j-1})/4$ cascaded light emitting shift registers, a cascaded signal output terminal of a light emitting shift register of a y-th stage is connected with a signal input terminal of a light emitting shift register of a (y+1)-th stage in the j-th light emitting driving circuit; a first signal output terminal, a second signal output terminal, a third signal output terminal and a fourth signal output terminal of the light emitting shift register of the y-th stage in the j-th light emitting driving circuit are respectively connected with light emitting signal lines of pixel circuits in an $(N_{j-1}+4y-3)$-th row, pixel circuits in an $(N_{j-1}+4y-2)$-th row, pixel circuits in an $(N_{j-1}+4y-1)$-th row, pixel circuits in an $(N_{j-1}+4y)$-th row, where y= 1, 2, . . . , $(N_j-N_{j-1})/4$.

3. The display substrate according to claim 2, wherein the light emitting shift register further comprises: a first clock signal terminal and a second clock signal terminal;
- a first clock signal terminal in a light emitting shift register in an odd-numbered light emitting driving circuit is connected with one of the first light emitting clock signal line and the second light emitting clock signal line, a second clock signal terminal in the light emitting shift register in the odd-numbered light emitting driving circuit is connected with the other of the first light emitting clock signal line and the second light emitting clock signal line, and first clock signal terminals in adjacent light emitting shift registers are connected with different light emitting clock signal lines;
- a first clock signal terminal in a light emitting shift register in an even-numbered light emitting driving circuit is connected with one of the third light emitting clock signal line and the fourth light emitting clock signal line, a second clock signal terminal in the light emitting shift register in the even-numbered light emitting driving circuit is connected with the other of the third light emitting clock signal line and the fourth light emitting clock signal line, and first clock signal terminals in adjacent light emitting shift registers are connected with different light emitting clock signal lines.

4. The display substrate according to claim 2, wherein a control driving circuit comprises: control shift registers, a control shift register comprises: a cascaded signal output terminal, a signal input terminal, a first signal output terminal, a second signal output terminal, a third signal output terminal, and a fourth signal output terminal;
- a first control driving circuit comprises $N_1/4$ cascaded control shift registers, a cascaded signal output terminal of a control shift register of an x-th stage is connected with a signal input terminal of a control shift register of an (x+1)-th stage in the first control driving circuit; a first signal output terminal, a second signal output terminal, a third signal output terminal and a fourth signal output terminal of the control shift register of the x-th stage in the first control driving circuit are respectively connected with second scan signal lines of pixel circuits in a (4x−3)-th row, pixel circuits in a (4x−2)-th row, pixel circuits in a (4x−1)-th row and pixel circuits in a 4x-th row, where x=1, 2, . . . , $N_1/4$;

a j-th control driving circuit comprises $(N_j-N_{j-1})/4$ cascaded control shift registers, a cascaded signal output terminal of a control shift register of a y-th stage is connected with a signal input terminal of a control shift register of a (y+1)-th stage in the j-th control driving circuit; a first signal output terminal, a second signal output terminal, a third signal output terminal and a fourth signal output terminal of the control shift register of the y-th stage in the j-th control driving circuit are respectively connected with second scan signal lines of pixel circuits in an $(N_{j-1}+4y-3)$-th row, pixel circuits in an $(N_{j-1}+4y-2)$-th row, pixel circuits in an $(N_{j-1}+4y-1)$-th row, pixel circuits in an $(N_{j-1}+4y)$-th row, where y=1, 2, . . . , $(N_j-N_{j-1})/4$.

5. The display substrate according to claim 4, wherein a control shift register further comprises: a first clock signal terminal and a second clock signal terminal;

a first clock signal terminal in a control shift register in an odd-numbered control driving circuit is connected with one of the first control clock signal line and the second control clock signal line, a second clock signal terminal in the control shift register in the odd-numbered control driving circuit is connected with the other of the first control clock signal line and the second control clock signal line, and first clock signal terminals in adjacent control shift registers are connected with different control clock signal lines;

a first clock signal terminal in a control shift register in an even-numbered control driving circuit is connected with one of the third control clock signal line and the fourth control clock signal line, a second clock signal terminal in the control shift register in the even-numbered control driving circuit is connected with the other of the third control clock signal line and the fourth control clock signal line, and first clock signal terminals in adjacent control shift registers are connected with different control clock signal lines.

6. The display substrate according to claim 2, wherein a reset driving circuit comprises: reset shift registers, a reset shift register comprises: a cascaded signal output terminal, a signal input terminal, a first signal output terminal, a second signal output terminal, a third signal output terminal, and a fourth signal output terminal;

a first reset driving circuit comprises $N_1/4$ cascaded reset shift registers, a cascaded signal output terminal of a reset shift register of an x-th stage is connected with a signal input terminal of a reset shift register of an (x+1)-th stage in the first reset driving circuit; a first signal output terminal, a second signal output terminal, a third signal output terminal and a fourth signal output terminal of the reset shift register of the x-th stage in the first reset driving circuit are respectively connected with third scan signal lines of pixel circuits in a (4x−3)-th row, pixel circuits in a (4x−2)-th row, pixel circuits in a (4x−1)-th row and pixel circuits in a 4x-th row, where x=1, 2, . . . , $N_1/4$;

a j-th reset driving circuit comprises $(N_j-N_{j-1})/4$ cascaded reset shift registers, a cascaded signal output terminal of a reset shift register of a y-th stage is connected with a signal input terminal of a reset shift register of a (y+1)-th stage in the j-th reset driving circuit; a first signal output terminal, a second signal output terminal, a third signal output terminal and a fourth signal output terminal of the reset shift register of the y-th stage in the j-th reset driving circuit are respectively connected with third scan signal lines of pixel circuits in an $(N_{j-1}+4y-3)$-th row, pixel circuits in an $(N_{j-1}+4y-2)$-th row, pixel circuits in an $(N_{j-1}+4y-1)$-th row, pixel circuits in an $(N_{j-1}+4y)$-th row, where y=1, 2, . . . , $(N_j-N_{j-1})/4$.

7. The display substrate according to claim 6, wherein the reset shift register further comprises: a first clock signal terminal and a second clock signal terminal;

a first clock signal terminal in a reset shift register in an odd-numbered reset driving circuit is connected with one of the first reset clock signal line and the second reset clock signal line, a second clock signal terminal in the reset shift register in the odd-numbered reset drive circuit is connected with the other of the first reset clock signal line and the second reset clock signal line, and first clock signal terminals in adjacent reset shift registers are connected with different reset clock signal lines;

a first clock signal terminal in a reset shift register in an even-numbered reset driving circuit is connected with one of the third reset clock signal line and the fourth reset clock signal line, a second clock signal terminal in the reset shift register in the even-numbered reset driving circuit is connected with the other of the third reset clock signal line and the fourth reset clock signal line, and first clock signal terminals in adjacent reset shift registers are connected with different reset clock signal lines.

8. The display substrate according to claim 2, wherein a shift register comprises: a first node control sub-circuit, a second node control sub-circuit, a third node control sub-circuit, and an output control sub-circuit, and the shift register comprises: a light emitting shift register, a control shift register, and a reset shift register;

the first node control sub-circuit is electrically connected with a first clock signal terminal, a second clock signal terminal, a first power supply terminal, a signal input terminal, a first node and a second node, respectively, and is configured to provide a signal of the first power supply terminal or the second clock signal terminal to the first node under control of the first clock signal terminal, the signal input terminal and the second node;

the second node control sub-circuit is electrically connected with the second clock signal terminal, the first power supply terminal, the signal input terminal and the second node respectively, and is configured to provide a signal of the first power supply terminal or the second clock signal terminal to the second node under control of the signal input terminal and the second clock signal terminal;

the third node control sub-circuit is electrically connected with the first node, the second node, a third node and the first clock signal terminal respectively, and is configured to provide a signal of the first clock signal terminal or a second power supply terminal to the third node under control of the first clock signal terminal, the first node and the second node; and the output control sub-circuit is electrically connected with the first node, the third node, the first power supply terminal, the second power supply terminal, a cascaded signal output terminal, a first signal output terminal, a second signal output terminal, a third signal output terminal and a fourth signal output terminal respectively, and is configured to provide a signal of the first power supply terminal or the second power supply terminal to the cascaded signal output terminal, the first signal output terminal, the second signal output terminal, the third signal output terminal and the fourth signal output terminal under control of the first node, the third node and the first power supply terminal.

9. The display substrate according to claim 2, wherein a shift register comprises: a first node control sub-circuit, a second node control sub-circuit, a third node control sub-circuit, and an output control sub-circuit, and the shift register comprises: a light emitting shift register, a control shift register, and a reset shift register;

the first node control sub-circuit is electrically connected with a first clock signal terminal, a second clock signal terminal, a signal input terminal, a first node and a second node, respectively, and is configured to provide a signal of the first clock signal terminal or the second clock signal terminal to the first node under control of the first clock signal terminal, the signal input terminal and the second node;

the second node control sub-circuit is electrically connected with the second clock signal terminal, the first power supply terminal, the signal input terminal and the second node, respectively, and is configured to provide a signal of the first power supply terminal or the second clock signal terminal to the second node under control of the signal input terminal and the second clock signal terminal;

the third node control sub-circuit is electrically connected with the first node, the second node, a third node and the first clock signal terminal, respectively, and is configured to provide a signal of the first clock signal terminal or a second power supply terminal to the third node under control of the first clock signal terminal, the first node and the second node; and the output control sub-circuit is electrically connected with the first node, the third node, the first power supply terminal, the second power supply terminal, a cascaded signal output terminal, a first signal output terminal, a second signal output terminal, a third signal output terminal and a fourth signal output terminal, respectively, and is configured to provide a signal of the first power supply terminal or the second power supply terminal to the cascaded signal output terminal, the first signal output terminal, the second signal output terminal, the third signal output terminal and the fourth signal output terminal under control of the first node, the third node and the first power supply terminal.

10. The display substrate according to claim 8, wherein the shift register further comprises: a noise reduction sub-circuit;

the noise reduction sub-circuit is electrically connected with a noise reduction signal terminal, the first clock signal terminal, the first power supply terminal, the first node and the third node, respectively, and is configured to provide a signal of the first clock signal terminal to the first node and a signal of the first power supply terminal to the third node under control of the noise reduction signal terminal.

11. The display substrate according to claim 8, wherein the first node control sub-circuit comprises: a first transistor, a second transistor, a tenth transistor, and an eleventh transistor;

a control electrode of the first transistor is electrically connected with the first clock signal terminal, a first electrode of the first transistor is electrically connected with the first power supply terminal, and a second electrode of the first transistor is electrically connected with a first electrode of the second transistor;

a control electrode of the second transistor is electrically connected with the signal input terminal, and a second electrode of the second transistor is electrically connected with the first node;

a control electrode of the tenth transistor is electrically connected with the second node, a first electrode of the tenth transistor is electrically connected with the first node, and a second electrode of the tenth transistor is electrically connected with a first electrode of the eleventh transistor; and a control electrode of the eleventh transistor is electrically connected with the first clock signal terminal, and a second electrode of the eleventh transistor is electrically connected with the second clock signal terminal.

12. The display substrate according to claim 9, wherein the first node control sub-circuit comprises: a first transistor, a second transistor, a tenth transistor, and an eleventh transistor;

a control electrode and a first electrode of the first transistor are electrically connected with the first clock signal terminal, and a second electrode of the first transistor is electrically connected with a first electrode of the second transistor;

a control electrode of the second transistor is electrically connected with the signal input terminal, and a second electrode of the second transistor is electrically connected with the first node;

a control electrode of the tenth transistor is electrically connected with the second node, a first electrode of the tenth transistor is electrically connected with the first node, and a second electrode of the tenth transistor is electrically connected with a first electrode of the eleventh transistor; and a control electrode of the eleventh transistor is electrically connected with the first clock signal terminal, and a second electrode of the eleventh transistor is electrically connected with the second clock signal terminal.

13. The display substrate according to claim 11, wherein the second node control sub-circuit comprises: a third transistor, a fourth transistor, a fifth transistor, and a sixth transistor;

a control electrode of the third transistor is electrically connected with the second clock signal terminal, a first electrode of the third transistor is electrically connected with the first power supply terminal, and a second electrode of the third transistor is electrically connected with the second node;

a control electrode of the fourth transistor is electrically connected with the signal input terminal, a first electrode of the fourth transistor is electrically connected with the second node, and a second electrode of the fourth transistor is electrically connected with a first electrode of the fifth transistor;

a control electrode of the fifth transistor is electrically connected with the signal input terminal, and a second electrode of the fifth transistor is electrically connected with the second clock signal terminal; and a control electrode of the sixth transistor is electrically connected with the second node, a first electrode of the sixth transistor is electrically connected with the first power supply terminal, and a second electrode of the sixth transistor is electrically connected with the second electrode of the fourth transistor.

14. The display substrate according to claim 11, wherein the third node control sub-circuit comprises: a seventh transistor, an eighth transistor, a ninth transistor, and a first capacitor;
  a control electrode of the seventh transistor is electrically connected with the second node, a first electrode of the seventh transistor is electrically connected with the first clock signal terminal, and a second electrode of the seventh transistor is electrically connected with a first electrode of the eighth transistor;
  a control electrode of the eighth transistor is electrically connected with the first clock signal terminal, and a second electrode of the eighth transistor is electrically connected with the third node;
  a control electrode of the ninth transistor is electrically connected with the first node, a first electrode of the ninth transistor is electrically connected with the third node, and a second electrode of the ninth transistor is electrically connected with the second power supply terminal; and
  a first terminal of the first capacitor is electrically connected with the second node, and a second terminal of the first capacitor is electrically connected with the second electrode of the seventh transistor.

15. The display substrate according to claim 11, wherein the output control sub-circuit comprises: a twelfth transistor to a twenty-second transistor, a second capacitor and a third capacitor;
  a control electrode of the twelfth transistor is electrically connected with the first power supply terminal, a first electrode of the twelfth transistor is electrically connected with the first node, and a second electrode of the twelfth transistor is electrically connected with a fourth node;
  a control electrode of the thirteenth transistor is electrically connected with the fourth node, a first electrode of the thirteenth transistor is electrically connected with the first power supply terminal, and a second electrode of the thirteenth transistor is electrically connected with the cascaded signal output terminal;
  a control electrode of the fourteenth transistor is electrically connected with the third node, a first electrode of the fourteenth transistor is electrically connected with the second power supply terminal, and a second electrode of the fourteenth transistor is electrically connected with the cascaded signal output terminal;
  a control electrode of the fifteenth transistor is electrically connected with the fourth node, a first electrode of the fifteenth transistor is electrically connected with the first power supply terminal, and a second electrode of the fifteenth transistor is electrically connected with the first signal output terminal;
  a control electrode of the sixteenth transistor is electrically connected with the third node, a first electrode of the sixteenth transistor is electrically connected with the second power supply terminal, and a second electrode of the sixteenth transistor is electrically connected with the first signal output terminal;
  a control electrode of the seventeenth transistor is electrically connected with the fourth node, a first electrode of the seventeenth transistor is electrically connected with the first power supply terminal, and a second electrode of the seventeenth transistor is electrically connected with the second signal output terminal;
  a control electrode of the eighteenth transistor is electrically connected with the third node, a first electrode of the eighteenth transistor is electrically connected with the second power supply terminal, and a second electrode of the eighteenth transistor is electrically connected with the second signal output terminal;
  a control electrode of the nineteenth transistor is electrically connected with the fourth node, a first electrode of the nineteenth transistor is electrically connected with the first power supply terminal, and a second electrode of the nineteenth transistor is electrically connected with the third signal output terminal;
  a control electrode of the twentieth transistor is electrically connected with the third node, a first electrode of the twentieth transistor is electrically connected with the second power supply terminal, and a second electrode of the twentieth transistor is electrically connected with the third signal output terminal;
  a control electrode of the twenty-first transistor is electrically connected with the fourth node, a first electrode of the twenty-first transistor is electrically connected with the first power supply terminal, and a second electrode of the twenty-first transistor is electrically connected with the fourth signal output terminal;
  a control electrode of the twenty-second transistor is electrically connected with the third node, a first electrode of the twenty-second transistor is electrically connected with the second power supply terminal, and a second electrode of the twenty-second transistor is electrically connected with the fourth signal output terminal;
  a first terminal of the second capacitor is electrically connected with the fourth node, and a second terminal of the second capacitor is electrically connected with the first signal output terminal; and
  a first terminal of the third capacitor is electrically connected with the third node, and a second terminal of the third capacitor is electrically connected with the second power supply terminal.

16. The display substrate according to claim 11, wherein the output control sub-circuit comprises: a twelfth transistor to a twenty-eighth transistor, a second capacitor and a third capacitor;
  a control electrode of the twelfth transistor is electrically connected with the first power supply terminal, a first electrode of the twelfth transistor is electrically connected with the first node, and a second electrode of the twelfth transistor is electrically connected with a fourth node;
  a control electrode of the thirteenth transistor is electrically connected with the fourth node, a first electrode of the thirteenth transistor is electrically connected with the first power supply terminal, and a second electrode of the thirteenth transistor is electrically connected with the cascaded signal output terminal;
  a control electrode of the fourteenth transistor is electrically connected with the third node, a first electrode of the fourteenth transistor is electrically connected with a fifth node, and a second electrode of the fourteenth transistor is electrically connected with the cascaded signal output terminal;
  a control electrode of the fifteenth transistor is electrically connected with the fourth node, a first electrode of the fifteenth transistor is electrically connected with the first power supply terminal, and a second electrode of the fifteenth transistor is electrically connected with the first signal output terminal;
  a control electrode of the sixteenth transistor is electrically connected with the third node, a first electrode of the sixteenth transistor is electrically connected with the fifth node, and a second electrode of the sixteenth transistor is electrically connected with the first signal output terminal;

a control electrode of the seventeenth transistor is electrically connected with the fourth node, a first electrode of the seventeenth transistor is electrically connected with the first power supply terminal, and a second electrode of the seventeenth transistor is electrically connected with the second signal output terminal;

a control electrode of the eighteenth transistor is electrically connected with the third node, a first electrode of the eighteenth transistor is electrically connected with the fifth node, and a second electrode of the eighteenth transistor is electrically connected with the second signal output terminal;

a control electrode of the nineteenth transistor is electrically connected with the fourth node, a first electrode of the nineteenth transistor is electrically connected with the first power supply terminal, and a second electrode of the nineteenth transistor is electrically connected with the third signal output terminal;

a control electrode of the twentieth transistor is electrically connected with the third node, a first electrode of the twentieth transistor is electrically connected with the fifth node, and a second electrode of the twentieth transistor is electrically connected with the third signal output terminal;

a control electrode of the twenty-first transistor is electrically connected with the fourth node, a first electrode of the twenty-first transistor is electrically connected with the first power supply terminal, and a second electrode of the twenty-first transistor is electrically connected with the fourth signal output terminal;

a control electrode of the twenty-second transistor is electrically connected with the third node, a first electrode of the twenty-second transistor is electrically connected with the fifth node, and a second electrode of the twenty-second transistor is electrically connected with the fourth signal output terminal;

a control electrode of the twenty-third transistor is electrically connected with the third node, a first electrode of the twenty-second transistor is electrically connected with the second power supply terminal, and a second electrode of the twenty-second transistor is electrically connected with the fifth node;

a control electrode of the twenty-fourth transistor is electrically connected with the third node, a first electrode of the twenty-fourth transistor is electrically connected with the second power supply terminal, and a second electrode of the twenty-second transistor is electrically connected with the fifth node;

a control electrode of the twenty-fifth transistor is electrically connected with the third node, a first electrode of the twenty-fifth transistor is electrically connected with the second power supply terminal, and a second electrode of the twenty-fifth transistor is electrically connected with the fifth node;

a control electrode of the twenty-sixth transistor is electrically connected with the third node, a first electrode of the twenty-sixth transistor is electrically connected with the second power supply terminal, and a second electrode of the twenty-sixth transistor is electrically connected with the fifth node;

a control electrode of the twenty-seventh transistor is electrically connected with the third node, a first electrode of the twenty-seventh transistor is electrically connected with the second power supply terminal, and a second electrode of the twenty-seventh transistor is electrically connected with the fifth node;

a control electrode of the twenty-eighth transistor is electrically connected with the third node, a first electrode of the twenty-eighth transistor is electrically connected with the second power supply terminal, and a second electrode of the twenty-eighth transistor is electrically connected with the fifth node;

a first terminal of the second capacitor is electrically connected with the fourth node, and a second terminal of the second capacitor is electrically connected with the first signal output terminal; and a first terminal of the third capacitor is electrically connected with the third node, and a second terminal of the third capacitor is electrically connected with the second power supply terminal.

17. The display substrate according to claim 10, wherein the noise reduction sub-circuit comprises: a twenty-ninth transistor and a thirtieth transistor;

a control electrode of the twenty-ninth transistor is electrically connected with the noise reduction signal terminal, a first electrode of the twenty-ninth transistor is electrically connected with the first clock signal terminal, and a second electrode of the twenty-ninth transistor is electrically connected with the first node; and a control electrode of the thirtieth transistor is electrically connected with the noise reduction signal terminal, a first electrode of the thirtieth transistor is electrically connected with the first power supply terminal, and a second electrode of the thirtieth transistor is electrically connected with the third node.

18. The display substrate according to claim 2, further comprising: a light emitting initial signal line; signal input terminals of light emitting shift registers of first stages in the M light emitting driving circuits are electrically connected with the light emitting initial signal line;

a signal of the light emitting initial signal line is M effective level pulse signals, and an i-th effective level pulse signal is a signal of a signal input terminal of a light emitting shift register of a first stage in an i-th light emitting driving circuit;

a time difference between starting time of the i-th effective level pulse signal of the light emitting initial signal line and starting time of an (i+1)-th effective level pulse signal of the light emitting initial signal line is Hi*H, wherein Hi is a number of rows corresponding to a resolution of an i-th partition, and His data writing time of pixel circuits of one row;

data writing time Hmin*H of a partition with the lowest resolution is larger than a duration T of an effective level pulse signal of the light emitting initial signal line, and Hmin is a number of rows corresponding to the resolution of the partition with the lowest resolution;

or further comprising: a control initial signal line; signal input terminals of control shift registers of first stages in the M control driving circuits are electrically connected with the control initial signal line;

a signal of the control initial signal line is M effective level pulse signals, and an i-th effective level pulse signal is a signal of a signal input terminal of a control shift register of a first stage in an i-th control driving circuit;

a time difference between starting time of the i-th effective level pulse signal of the control initial signal line and starting time of an (i+1)-th effective level pulse signal of the control initial signal line is Hi*H, wherein Hi is a number of rows corresponding to a resolution of an i-th partition, and His data writing time of pixel circuits of one row;

data writing time Hmin*H of a partition with the lowest resolution is larger than a duration T of an effective level pulse signal of the control initial signal line, and Hmin is a number of rows corresponding to the resolution of the partition with the lowest resolution;

or further comprising: a reset initial signal line; signal input terminals of reset shift registers of first stages in the M reset driving circuits are electrically connected with the reset initial signal line;

a signal of the reset initial signal line is M effective level pulse signals, and an i-th effective level pulse signal is a signal of a signal input terminal of a reset shift register of a first stage in an i-th reset driving circuit;

a time difference between starting time of the i-th effective level pulse signal of the reset initial signal line and starting time of an (i+1)-th effective level pulse signal of the reset initial signal line is Hi*H, wherein Hi is a number of rows corresponding to a resolution of an i-th partition, and H is data writing time of pixel circuits of one row;

data writing time Hmin*H of a partition with the lowest resolution is larger than a duration T of an effective level pulse signal of the reset initial signal line, and Hmin is a number of rows corresponding to the resolution of the partition with the lowest resolution.

19. The display substrate according to claim 18, wherein contents displayed on the display substrate comprise: a plurality of display frames, the first light emitting clock signal line is a first reference light emitting clock signal line when end time of a first effective level pulse signal of the first light emitting clock signal line is earlier than starting time of a first effective level pulse signal of the second light emitting clock signal line, and the second light emitting clock signal line is the first reference light emitting clock signal line when end time of the first effective level pulse signal of the second light emitting clock signal line is earlier than starting time of the first effective level pulse signal of the first light emitting clock signal line; the third light emitting clock signal line is a second reference light emitting clock signal line when end time of a first effective level pulse signal of the third light emitting clock signal line is earlier than starting time of a first effective level pulse signal of the fourth light emitting clock signal line, and the fourth light emitting clock signal line is the second reference light emitting clock signal line when end time of the first effective level pulse signal of the fourth light emitting clock signal line is earlier than starting time of the first effective level pulse signal of the third light emitting clock signal line;

within one display frame, a signal of the first reference light emitting clock signal line comprises: M1 signal regions, where M1 is a number of odd numbers in M, and a (2s−1)-th light emitting driving circuit outputs a signal in an s-th signal region, where s=1, 2, . . . , M1;

in the s-th signal region, a number of effective level signals in the signal of the first reference light emitting clock signal line satisfies: EMNum_S=$H_{2s-1}$/N0+M0/$H_{2s-1}$, N0=$2H_{2s-1}$/Hmin, M0=Hmin*T/2;

within one display frame, a signal of the second reference light emitting clock signal line comprises: M2 signal regions, where M2 is a number of even numbers in M, and a 2t-th light emitting driving circuit outputs a signal in a t-th signal region, where t=1, 2, . . . , M2;

in the t-th signal region, a number of effective level signals in the signal of the second reference light emitting clock signal line satisfies: EMNum_t≥$H_{2t}$/N1+M0/$H_{2t}$, N1=$2H_{2t}$/Hmin;

or contents displayed on the display substrate comprise: a plurality of display frames, the first control clock signal line is a first reference control clock signal line when end time of a first effective level pulse signal of the first light emitting clock signal line is earlier than starting time of a first effective level pulse signal of the second light emitting clock signal line, and the second control clock signal line is the first reference control clock signal line when end time of the first effective level pulse signal of the second control clock signal line is earlier than starting time of the first effective level pulse signal of the first control clock signal line; the third control clock signal line is a second reference control clock signal line when end time of a first effective level pulse signal of the third control clock signal line is earlier than starting time of a first effective level pulse signal of the fourth control clock signal line, and the fourth control clock signal line is the second reference control clock signal line when end time of the first effective level pulse signal of the fourth control clock signal line is earlier than starting time of the first effective level pulse signal of the third control clock signal line;

within one display frame, a signal of the first reference control clock signal line comprises: M1 signal regions, where M1 is a number of odd numbers in M, and a (2s−1)-th control driving circuit outputs a signal in an s-th signal region, where s=1, 2, . . . , M1;

in the s-th signal region, a number of effective level signals in the signal of the first reference control clock signal line satisfies: G2Num_s=$H_{2s-1}$/N0+M0/$H_{2s-1}$, N0=$2H_{2s-1}$/Hmin, M0=Hmin*T/2;

within one display frame, a signal of the second reference control clock signal line comprises: M2 signal regions, where M2 is a number of even numbers in M, and a 2t-th control driving circuit outputs a signal in a t-th signal region, where t=1, 2, . . . , M2;

in the t-th signal region, a number of effective level signals in the signal of the second reference control clock signal line satisfies: G2Num_t≥$H_{2t}$/N1+M0/$H_{2t}$, N1=$2H_{2t}$/Hmin;

or contents displayed on the display substrate comprise: a plurality of display frames, the first reset clock signal line is a first reference reset clock signal line when end time of a first effective level pulse signal of the first light emitting clock signal line is earlier than starting time of a first effective level pulse signal of the second light emitting clock signal line, and the second reset clock signal line is the first reference reset clock signal line when end time of the first effective level pulse signal of the second reset clock signal line is earlier than starting time of the first effective level pulse signal of the first reset clock signal line; the third reset clock signal line is a second reference reset clock signal line when end time of a first effective level pulse signal of the third reset clock signal line is earlier than starting time of a first effective level pulse signal of the fourth reset clock signal line, and the fourth reset clock signal line is the second reference reset clock signal line when end time of the first effective level pulse signal of the fourth reset clock signal line is earlier than starting time of the first effective level pulse signal of the third reset clock signal line;

within one display frame, a signal of the first reference reset clock signal line comprises: M1 signal regions, where M1 is a number of odd numbers in M, and a (2s−1)-th reset driving circuit outputs a signal in an s-th signal region, where s=1, 2, . . . , M1;

in the s-th signal region, a number of effective level signals in the signal of the first reference reset clock signal line satisfies: $G3Num\_s = H_{2s-1}/N0 + M0/H_{2s-1}$, $N0 = 2H_{2s-1}/Hmin$, $M0 = Hmin*T/2$;

within one display frame, a signal of the second reference reset clock signal line comprises: M2 signal regions, where M2 is a number of even numbers in M, and a 2t-th reset driving circuit outputs a signal in a t-th signal region, where t=1, 2, . . . , M2;

in the t-th signal region, a number of effective level signals in the signal of the second reference reset clock signal line satisfies: $G3Num\_t \geq H_{2t}/N1 + M0/H_{2t}$, $N1 = 2H_{2t}/Hmin$.

20. A display apparatus, comprising: the display substrate according to claim 1.

\* \* \* \* \*